(12) United States Patent
Takeno et al.

(10) Patent No.: US 12,363,940 B2
(45) Date of Patent: Jul. 15, 2025

(54) SEMICONDUCTOR DEVICE HAVING MULTIPLE FINS ON SUBSTRATE

(71) Applicant: Socionext Inc., Kanagawa (JP)

(72) Inventors: Hirotaka Takeno, Yokohama (JP); Atsushi Okamoto, Yokohama (JP); Wenzhen Wang, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 696 days.

(21) Appl. No.: 17/508,441

(22) Filed: Oct. 22, 2021

(65) Prior Publication Data

US 2022/0045215 A1   Feb. 10, 2022

Related U.S. Application Data

(63) Continuation of application No. PCT/JP2019/017697, filed on Apr. 25, 2019.

(51) Int. Cl.
*H10D 30/62* (2025.01)
*H10D 62/17* (2025.01)

(52) U.S. Cl.
CPC ....... *H10D 30/6215* (2025.01); *H10D 62/299* (2025.01)

(58) Field of Classification Search
CPC ............. H01L 29/7855; H01L 29/1041; H01L 23/5286; H01L 23/535; H01L 21/8221;
(Continued)

(56) References Cited

U.S. PATENT DOCUMENTS 7,897,971 B2 *   3/2011   Kurokawa ........ G02F 1/136204
                                              257/E33.001
9,129,829 B2     9/2015   Kuhn et al.
(Continued)

FOREIGN PATENT DOCUMENTS

JP   2007-013156 A   1/2007
JP   2012-190998 A   10/2012
(Continued)

OTHER PUBLICATIONS

Ryckaert J. et al., "The Complementary FET (CFET) for CMOS scaling beyond N3" 2018 Symposium on VLSI Technology Digest of Technical Papers; pp. 141-142.
(Continued)

*Primary Examiner* — Steven H Loke
*Assistant Examiner* — Pratiksha Jayant Lohakare
(74) *Attorney, Agent, or Firm* — Rimon P.C.

(57) ABSTRACT

A semiconductor device includes a substrate; first and second fins protruding from the substrate; a first transistor including the first fin; a second transistor above the first transistor; and a first power supply line electrically connected to the first fin through the second fin. The first transistor includes first and second impurity areas in the first fin, and a first gate insulating film on the first fin between the first and second impurity areas. The second transistor includes a first semiconductor area above the first fin, a third impurity area in the first semiconductor area above the first impurity area, a fourth impurity area in the first semiconductor area above the second impurity area, and a second gate insulating film on the first semiconductor area between the third and fourth impurity areas. The first and second transistors have a common gate on the first and second gate insulating films.

15 Claims, 49 Drawing Sheets

(58) Field of Classification Search
CPC ..... H01L 21/823828; H01L 21/823871; H01L 27/0924; H01L 21/823821; H01L 27/0688
USPC .......................................................... 257/33
See application file for complete search history.

(56) References Cited

U.S. PATENT DOCUMENTS

| | | | |
|---|---|---|---|
| 9,570,395 B1 | 2/2017 | Sengupta et al. | |
| 9,837,414 B1 | 12/2017 | Balakrishnan et al. | |
| 10,741,456 B2* | 8/2020 | Cheng | H10D 30/43 |
| 2006/0289940 A1 | 12/2006 | Hyun et al. | |
| 2009/0026454 A1* | 1/2009 | Kurokawa | G02F 1/136204 |
| | | | 257/E33.001 |
| 2012/0229190 A1 | 9/2012 | Kajihara et al. | |
| 2014/0145137 A1* | 5/2014 | Ju | H10B 63/84 |
| | | | 257/2 |
| 2015/0035061 A1* | 2/2015 | Yoon | H01L 29/785 |
| | | | 257/365 |
| 2015/0228649 A1* | 8/2015 | Singh | H10D 84/0135 |
| | | | 438/283 |
| 2015/0365089 A1 | 12/2015 | Momiyama | |
| 2017/0040321 A1 | 2/2017 | Mitard | |
| 2017/0154655 A1* | 6/2017 | Seo | G11C 5/141 |
| 2017/0331472 A1 | 11/2017 | Ogata | |
| 2018/0012891 A1 | 1/2018 | Yabuuchi et al. | |
| 2018/0026042 A1 | 1/2018 | Smith et al. | |
| 2018/0047832 A1 | 2/2018 | Tapily et al. | |
| 2018/0315743 A1* | 11/2018 | Takeno | H10D 89/10 |
| 2019/0081029 A1 | 3/2019 | Okamoto et al. | |
| 2020/0118891 A1* | 4/2020 | Cheng | H10D 86/011 |
| 2020/0118892 A1* | 4/2020 | Cheng | H01L 27/1211 |
| 2020/0144264 A1* | 5/2020 | Li | H10D 84/038 |
| 2021/0376137 A1* | 12/2021 | Yang | H01L 21/823807 |

FOREIGN PATENT DOCUMENTS

| | | |
|---|---|---|
| JP | 2015-073039 A | 4/2015 |
| JP | 2016-001652 A | 1/2016 |
| JP | 2018-026565 A | 2/2018 |
| JP | 2018-190760 A | 11/2018 |
| WO | 2016/207930 A1 | 12/2016 |
| WO | 2017/208888 A1 | 12/2017 |

OTHER PUBLICATIONS

A. Mocuta et al., "Enabling CMOS Scaling Towards 3nm and Beyond" 2018 Symposium on VLSI Technology Digest of Technical Papers pp. 147-148.

International Search Report and Written Opinion issued in International Application No. PCT/JP2019/017697 dated Jun. 4, 2019; with partial English translation.

* cited by examiner

SEMICONDUCTOR DEVICE HAVING MULTIPLE FINS ON SUBSTRATE

CROSS-REFERENCE TO RELATED APPLICATION

This application is a continuation application of International Application PCT/JP2019/017697 filed on Apr. 25, 2019 and designated the U.S., the entire contents of which are incorporated herein by reference.

FIELD

The embodiments discussed herein are related to a semiconductor device.

BACKGROUND

Semiconductor devices include various circuit areas, an example of which is a standard cell area. The standard cell area includes various logic circuits and a power supply switch circuit.

RELATED ART DOCUMENTS

Patent documents

[Patent Document 1] Japanese Patent Application Laid-Open No. 2016-1652
[Patent Document 2] U.S. Patent Application Publication No. 2017/0331472
[Patent Document 3] WO 2017/208888
[Patent Document 4] U.S. Pat. No. 9,570,395
[Patent Document 5] U.S. Pat. No. 9,837,414
[Patent Document 6] U.S. Patent Application Publication No. 2017/0040321
[Patent Document 7] U.S. Pat. No. 9,129,829
[Patent Document 8] Japanese Patent Application Laid-Open No. 2018-26565

Non-Patent Documents

[Non-Patent Document 1] 2018 Symposium on VLSI Technology Digest of Technical Papers, PP.141-PP.142
[Non-Patent Document 2] 2018 Symposium on VLSI Technology Digest of Technical Papers, PP.147-PP.148

SUMMARY

According to an aspect of an embodiment, a semiconductor device includes
a substrate;
a first fin and a second fin protruding from the substrate;
a first transistor including the first fin;
a second transistor above the first transistor; and
a first power supply line electrically connected to the first fin through the second fin, wherein
the first transistor includes
a first impurity area and a second impurity area formed in the first fin, and
a first gate insulating film formed on the first fin and located between the first impurity area and the second impurity area in a plan view, wherein
the second transistor includes
a first semiconductor area formed above the first fin,
a third impurity area formed in the first semiconductor area and located above the first impurity area,
a fourth impurity area formed in the first semiconductor area and located above the second impurity area, and
a second gate insulating film formed on the first semiconductor area and located between the third impurity area and the fourth impurity area in a plan view, and
wherein
the first and second transistors have a common gate formed on the first and second gate insulating films.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1:
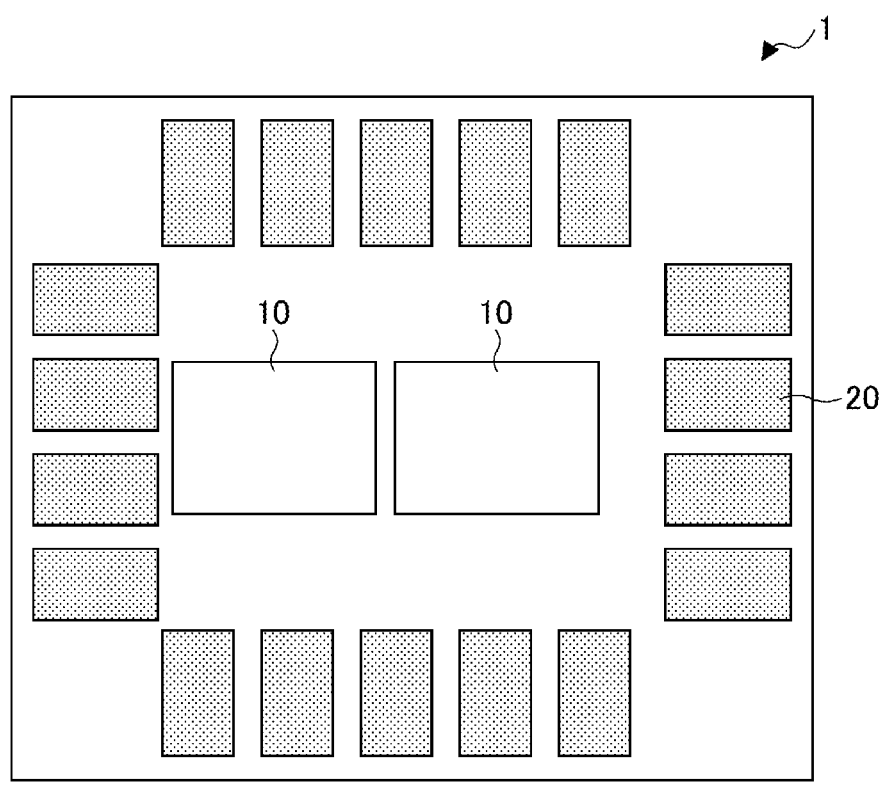
FIG. 1 is a diagram illustrating a layout of a semiconductor device according to a first embodiment.

Semiconductor devices include various circuit areas, an example of which is a standard cell area. The standard cell area includes various logic circuits and a power supply switch circuit.

For example, the power supply switch circuit is connected to a power supply line at a potential of VDD supplied to a semiconductor device and a power supply line at a potential of VDDV supplied to a transistor in a logic circuit. The power supply switch circuit is configured to turn on and off the supply of the power at the potential of VDDV to the transistor. With the use of the power supply switch circuit, the supply of the power can be turned off when the logic circuit does not need to operate, the leakage current generated by the transistors constituting the logic circuit can be reduced, and the power consumption can be reduced.

In some semiconductor devices, well taps are disposed in the standard cell area for the purpose of preventing malfunction or failure due to electrostatic discharging (ESD) or latching up.

Recently, devices called Complementary Field Effect Transistors (CFETs) are known. In a CFET, n-channel FET and p-channel FET are stacked on a substrate. The CFET is suitable for miniaturization of semiconductor devices.

So far, specific configurations of using CFET for semiconductor devices including well taps have not been studied in detail.

Accordingly, it is desired to provide a semiconductor device having well taps and CFETs.

Hereinafter, embodiments will be described in detail with reference to the accompanying drawings. In the present specification and drawings, constituent elements having substantially the same functional configurations may be denoted by the same reference numerals, and duplicate explanations thereabout are omitted. In the following description, two directions parallel to the surface of a substrate and orthogonal to each other are defined as the X direction and the Y direction, and a direction perpendicular to the surface of the substrate is defined as the Z direction.

First Embodiment

Figure 2:
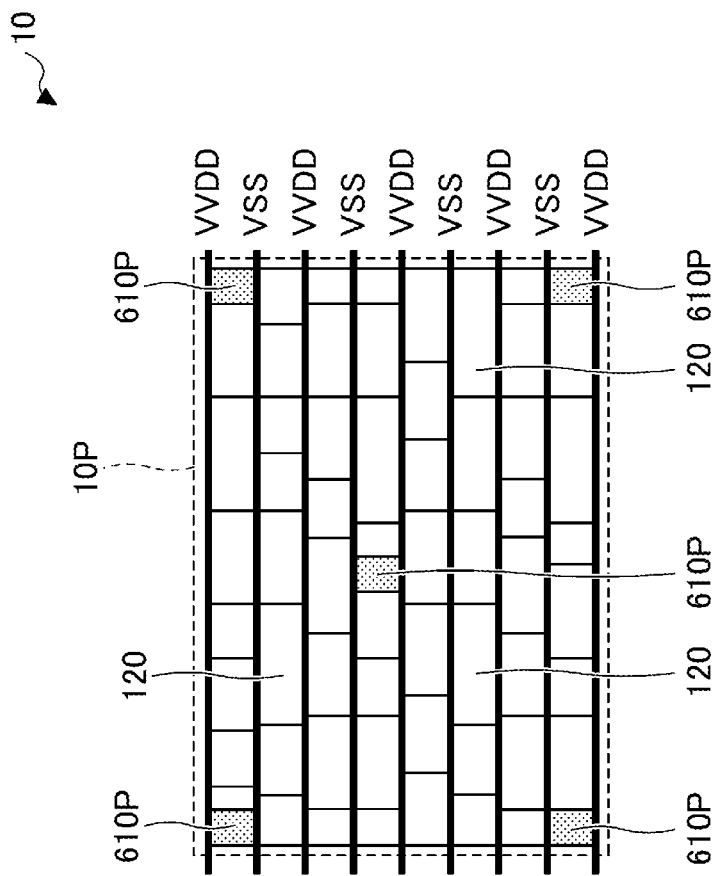
FIG. 2 is a schematic view illustrating a configuration of a standard cell area included in the semiconductor device according to the first embodiment.

First, the first embodiment will be described. FIG. 1 is a diagram illustrating a layout of a semiconductor device according to a first embodiment. FIG. 2 is a schematic view illustrating a configuration of a standard cell area included in the semiconductor device according to the first embodiment.

As illustrated in FIG. 1, a semiconductor device 1 according to the first embodiment includes multiple standard cell areas 10 and input-and-output (I/O) cell areas 20 disposed around the standard cell areas 10. Alternatively, a single standard cell area 10 may be provided, or three or more standard cell areas 10 may be provided. As illustrated in FIG. 2, the standard cell area 10 includes well taps 610P and standard cells 120. The standard cells 120 each include various logic circuits such as a NAND circuit, an inverter circuit, and the like. The standard cell area 10 is arranged with a VSS line for supplying a ground potential to the standard cell 120, and a VDDV line for supplying a power supply potential to the standard cell 120. The standard cell 120 is disposed in a P-type area 10P having a P-type conductivity type on the surface of a substrate. The P-type area 10P may be, for example, a P-well or P-type substrate. A well tap 610P is an area for supplying power to the P-type area 10P. The standard cell area 10 may further include a VDD line (not illustrated) to which an external power potential is supplied and a power supply switch circuit (not illustrated) between the VDD line and the VVDD line. Alternatively, the VDD line may be disposed within the standard cell 120 instead of the VVDD line. The VSS line is sometimes referred to as a grounding conductor, and the VVDD line and the VDD line are each referred to as a power supply line.

The standard cell 120 has an inverter that includes a P-channel MOS transistor 1341P and an N-channel MOS transistor 1341N, as described in detail below. The well tap 610P has a pseudo-transistor structure 611P with a P-type source and a P-type drain of the N-channel MOS transistor, and a P-channel MOS transistor 1331P. The P-channel MOS transistor 1341P is formed on the N-channel MOS transistor 1341N. The P-channel MOS transistor 1331P is formed on the pseudo-transistor structure 611P.

Figure 3:
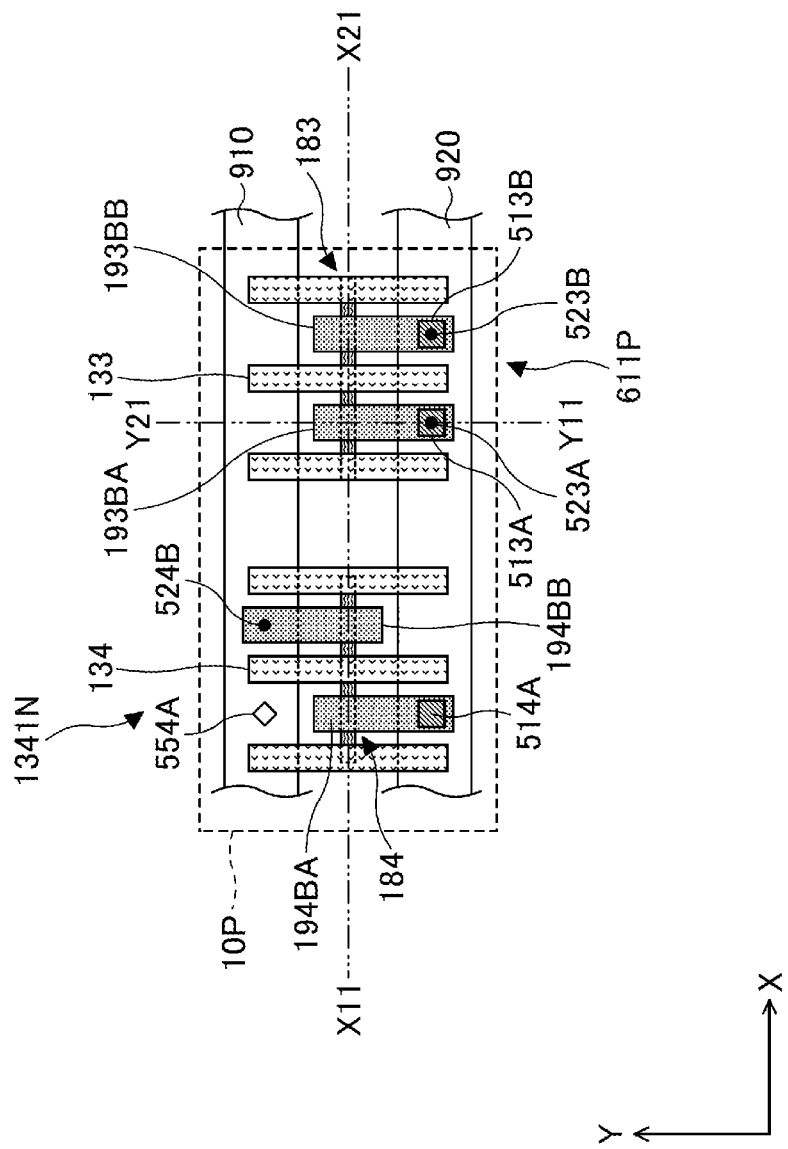
FIG. 3 is a schematic plan view (Part 1) illustrating a configuration of a well tap and a standard cell according to the first embodiment.
Figure 4:
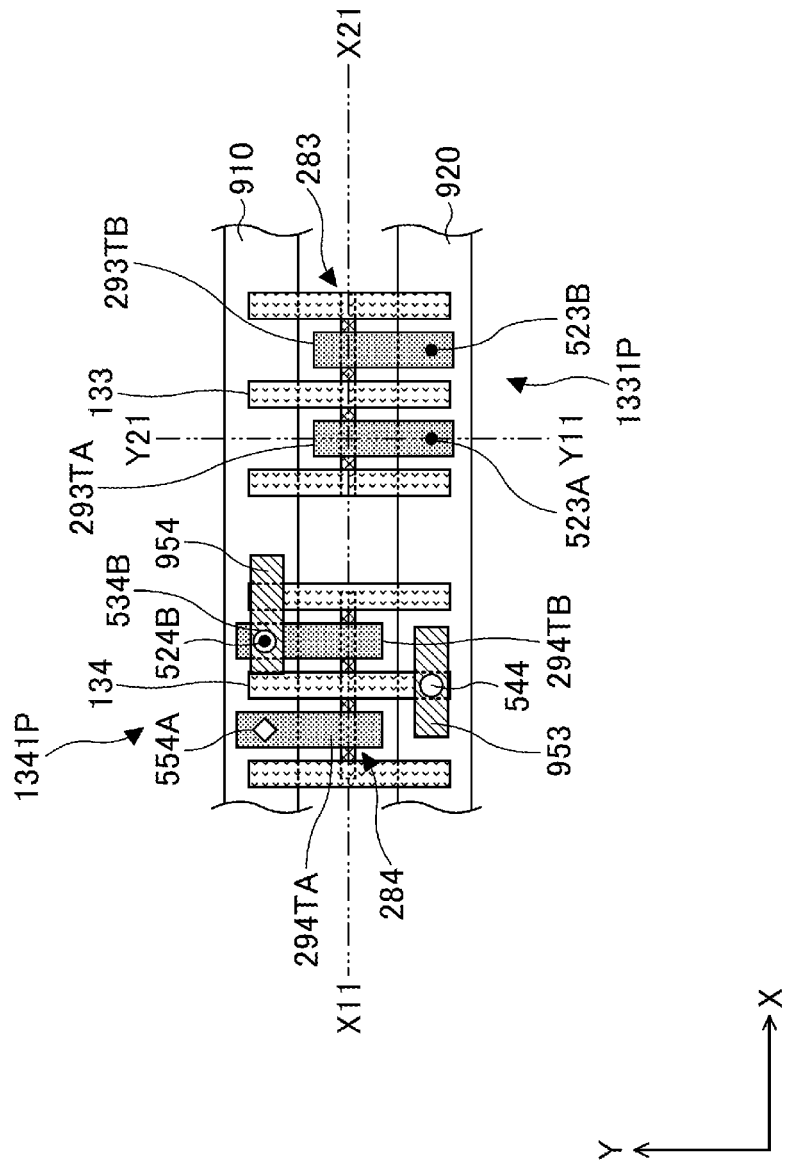
FIG. 4 is a schematic plan view (Part 2) illustrating a configuration of a well tap and a standard cell according to the first embodiment.
Figure 5:
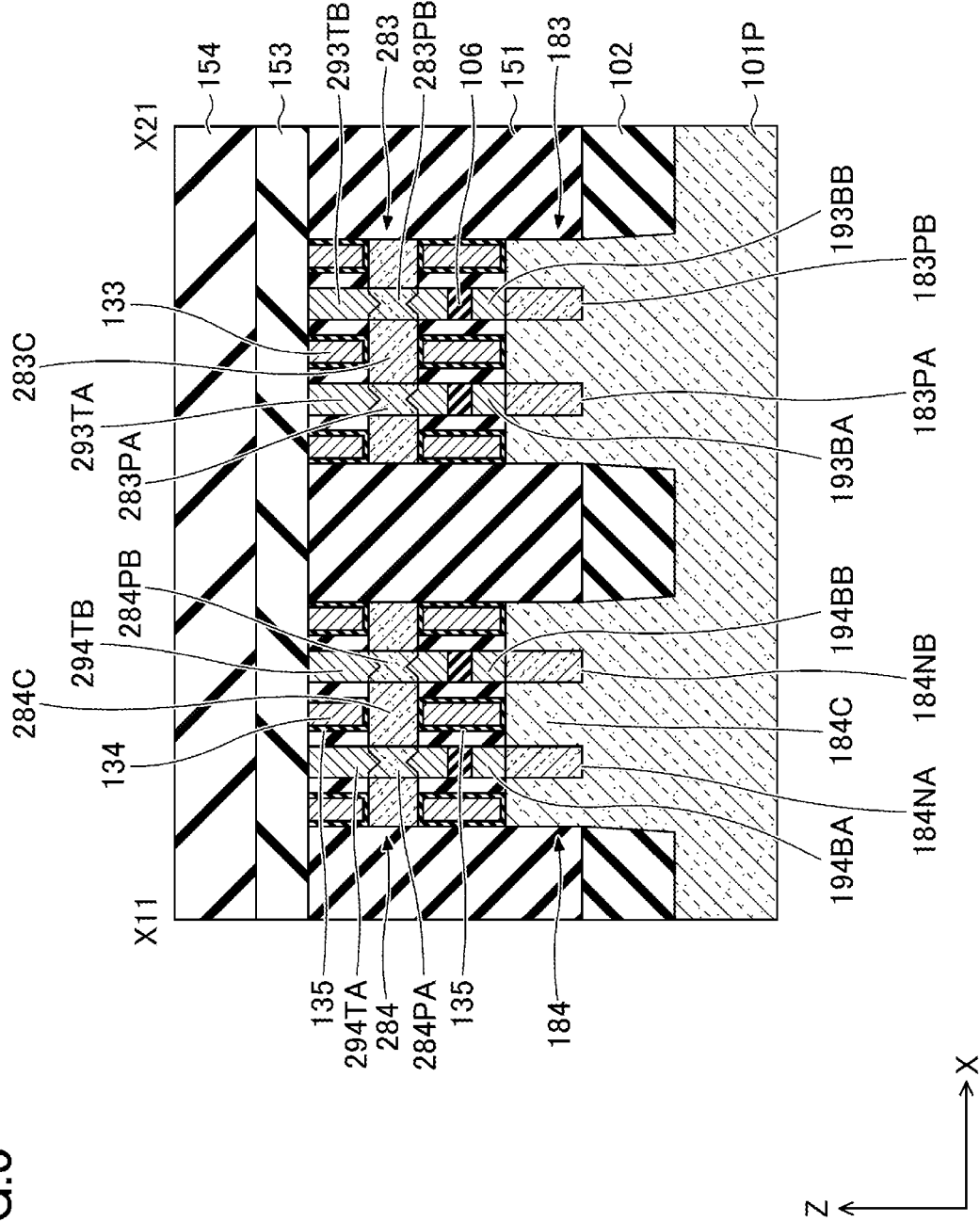
FIG. 5 is a cross-sectional view (Part 1) illustrating a well tap and a standard cell according to the first embodiment.
Figure 6:
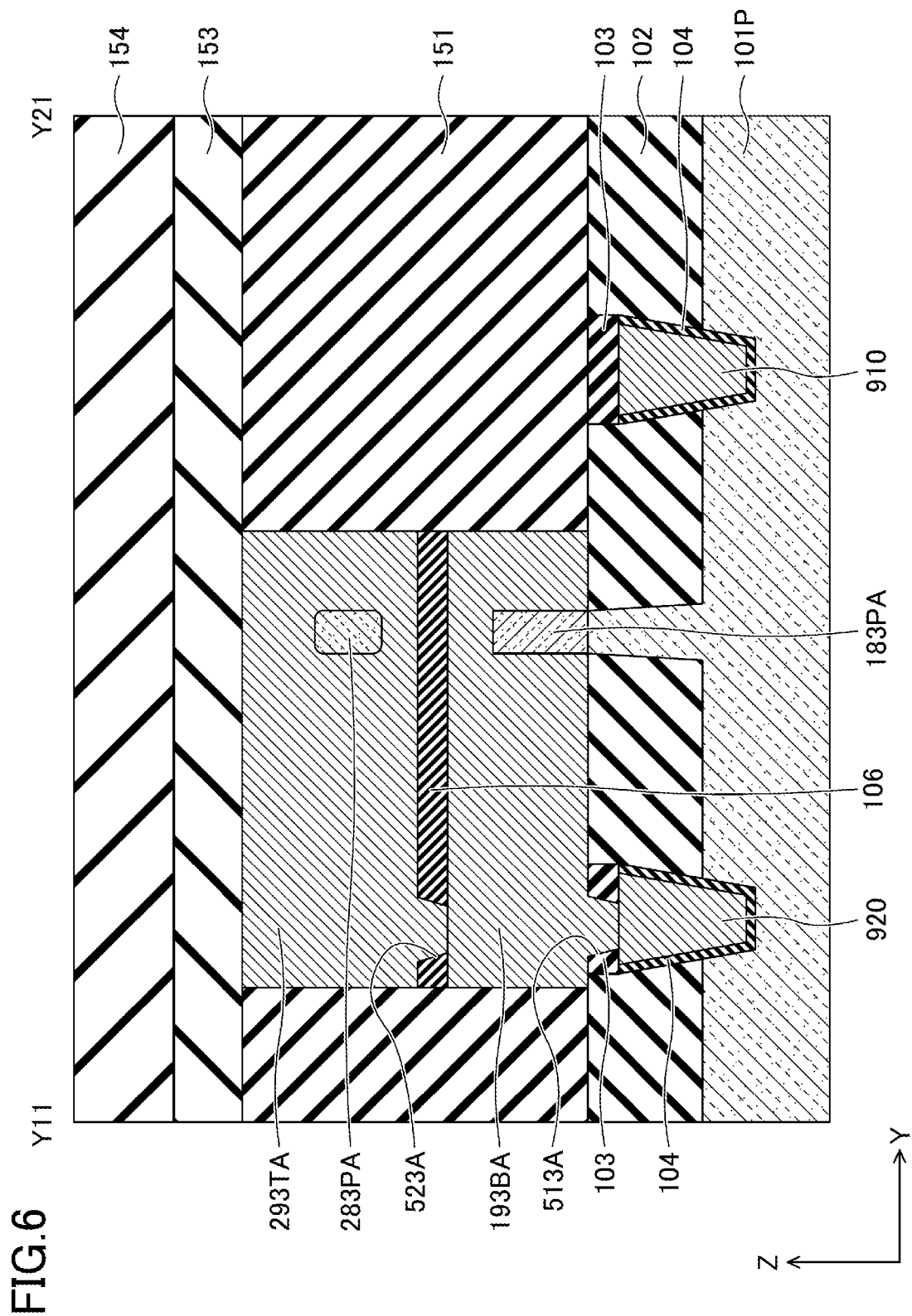
FIG. 6 is a cross-sectional view (Part 2) illustrating a well tap and a standard cell according to the first embodiment.

Next, configurations of the well tap 610P and the standard cell 120 will be described. FIGS. 3 and 4 are schematic plan views illustrating configurations of the well tap 610P and the standard cell 120 according to the first embodiment. FIG. 3 primarily illustrates a layout of the N-channel MOS transistor 1341N and the pseudo-transistor structure 611P. FIG. 4 primarily illustrates a layout of the P-channel MOS transistor 1341P and the P-channel MOS transistor 1331P. Except for the structures illustrated in both FIGS. 3 and 4, structures illustrated in FIG. 4 are located above the structure illustrated in FIG. 3. FIGS. 5 and 6 are cross-sectional views illustrating the well tap 610P and the standard cell 120 according to the first embodiment. FIG. 5 corresponds to a cross-sectional view cut along the X11-X21 line in FIG. 3 and FIG. 4. FIG. 6 corresponds to a cross-sectional view cut along the Y11-Y21 line in FIG. 3 and FIG. 4.

An element isolation film 102 is formed on the surface of a P-type substrate 101P. The element isolation film 102 is formed by Shallow Trench Isolation (STI) process. Multiple grooves extending in the X direction are formed on the substrate 101P and the element isolation film 102, and power supply lines 910 and 920 are formed in the grooves through an insulating film 104. For example, the surfaces of power supply lines 910 and 920 are covered by an insulating film 103. For example, the surface of the element isolation film 102 and the surface of the insulating film 103 may or may not be flush with the surface of the substrate 101P. The power supply lines 910 and 920 having such a structure may be referred to as Buried Power Rail (BPR). For example, the power supply line 910 corresponds to a VDD line or a VVDD line, and the power supply line 920 corresponds to a VSS line.

Fins 183 and 184 extending in the X direction and rising in the Z direction are formed on the substrate 101P exposed from the element isolation film 102 between the power supply line 910 and the power supply line 920. The fins 183 are included in the well tap 610P and the fins 184 are included in the standard cell 120.

The fin 184 includes an N-type area 184NA and an N-type area 184NB aligned in the X-direction. The N-type area 184NA is the source of the N-channel MOS transistor 1341N. The N-type area 184NB is the drain of the N-channel MOS transistor 1341N. A P-type portion of the fin 184 between the N-type area 184NA and the N-type area 184NB serves as a channel 184C of the N-channel MOS transistor 1341N. The N-channel MOS transistor 1341N also has a back gate below the gate electrode 134 in the fin 184.

The fin 183 includes a P-type area 183PA and a P-type area 183PB aligned in the X-direction. The conductivity type of a portion of the fin 183 between the P-type area 183PA and the P-type area 183PB is P type. The P-type areas 183PA and 183PB contain P-type impurities at a higher concentration than the P-type substrate 101P.

A local conductive trace 194BA extending in the Y direction from the N-type area 184NA and a the local conductive trace 194BB extending in the Y direction from the N-type area 184NB are formed on element isolation film 102. The local conductive trace 194BA extends above the power supply line 920. The local conductive trace 194BB extends above the power supply line 910.

A contact hole 514A (not illustrated) is formed in the insulating film 103 between the local conductive trace 194BA and the power supply line 920, and the local conductive trace 194BA is connected to the power supply line 920 through an electrical conductor in the contact hole 514A. The local conductive trace 194BA electrically connects the power supply line 920 to the N-type area 184NA.

A local conductive trace 193BA extending in the Y direction from the P-type area 183PA and a local conductive trace 193BB extending in the Y direction from the P-type area 183PB are formed on the element isolation film 102. The local conductive traces 193BA and 193BB extend above the power supply line 920.

As illustrated in FIG. 6, a contact hole 513A is formed in the insulating film 103 between the local conductive trace 193BA and the power supply line 920, and the local conductive trace 193BA is connected to the power supply line 920 through an electrical conductor in the contact hole 513A. The local conductive trace 193BA electrically connects the power supply line 920 to the P-type area 183PA. Similarly, a contact hole 513B is formed in the insulating film 103 between the local conductive trace 193BB and the power supply line 920, and the local conductive trace 193BB is connected to the power supply line 920 through an electrical conductor in the contact hole 513B. The local conductive trace 193BB electrically connects the power supply line 920 to the P-type area 183PB.

Insulating films 106 are formed on the local conductive traces 194BA, 194BB, 193BA and 193BB. A local conductive trace 294TA is formed on the local conductive trace 194BA via the insulating film 106 and a local conductive trace 294TB is formed on the local conductive trace 194BB. The local conductive trace 293TA is formed on the local conductive trace 193BA through the insulating film 106, and the local conductive trace 293TB is formed on the local conductive trace 193BB through the insulating film 106.

A semiconductor area 284 extending in the X direction and overlapping the local conductive traces 294TA and 294TB in a plan view is disposed above the fin 184. A semiconductor area 283 extending in the X direction and overlapping the local conductive traces 293TA and 293TB in a plan view is disposed above the fin 183.

The semiconductor area 284 includes a P-type area 284PA and a P-type area 284PB aligned in the X direction. The P-type area 284PA is the source of the P-channel MOS transistor 1341P. The P-type area 284PB is the drain of the P-channel MOS transistor 1341P. A portion of the semiconductor area 284 between the P-type area 284PA and the P-type area 284PB serves as a channel 284C of the P-channel MOS transistor 1341P.

The semiconductor area 283 includes a P-type area 283PA and a P-type area 283PB aligned in the X direction. The P-type area 283PA is the source or the drain of the P-channel MOS transistor 1331P. The P-type area 283PB is the drain or the source of the P-channel MOS transistor 1331P. A portion of the semiconductor area 283 between the P-type area 283PA and the P-type area 283PB serves as a channel 283C of the P-channel MOS transistor 1331P.

A gate electrode 134 common to the N-channel MOS transistor 1314N and the P-channel MOS transistor 1341P is formed between the stack of the local conductive traces 194BA and 294TA and the stack of the local conductive traces 194BB and 294TB. A gate electrode 133 of the P-channel MOS transistor 1331P is formed between the stack of the local conductive traces 193BA and 293TA and the stack of the local conductive traces 193BB and 293TB. A gate insulating film 135 is formed between the gate electrode 133 and the channel 283C, a gate insulating film 135 is formed between the gate electrode 134 and the channel 284C, and a gate insulating film 135 is formed between the gate electrode 134 and the channel 184C.

An insulating film 151 is formed above the substrate 101P and the element isolation film 102. The local conductive traces 194BA, 194BB, 193BA, 193BB, 294TA, 294TB, 293TA, and 293TB, and the gate electrodes 133 and 134 are embedded in the insulating film 151.

A contact hole 554A is formed in the insulating films 151 and 103 between the local conductive trace 294TA and the power supply line 910 above the power supply line 910. The local conductive trace 294TA and the power supply line 910 are electrically connected to each other through an electrical conductor in the contact hole 554A. The local conductive trace 294TA electrically connects the power supply line 910 to the P-type area 284PA.

A contact hole 524B is formed in the insulating film 106 between the local conductive trace 294TB and the local conductive trace 194BB above the power supply line 910. The local conductive trace 294TB and the local conductive trace 194BB are electrically connected to each other through an electrical conductor in the contact hole 524B.

As illustrated in FIG. 6, a contact hole 523A is formed in the insulating film 106 between the local conductive trace 293TA and the local conductive trace 193BA above the power supply line 920. The local conductive trace 293TA and the local conductive trace 193BA are electrically connected to each other through an electrical conductor in the contact hole 523A.

A contact hole 523B is formed in the insulating film 106 between the local conductive trace 293TB and the local conductive trace 193BB above the power supply line 920. The local conductive trace 293TB and the local conductive trace 193BB are electrically connected to each other through an electrical conductor in the contact hole 523B.

An insulating film 153 is formed on the insulating film 151, the local conductive traces 294TA, 294TB, 293TA and 293TB, and the gate electrodes 133 and 134. An insulating film 154 is formed on the insulating film 153.

As illustrated in FIG. 4, a contact hole 534B extending to the local conductive trace 294TB is formed above the power supply line 910 of the insulating film 153. A contact hole 544 extending to the gate electrode 134 is formed above the power supply line 920 of the insulating film 153.

A signal line 953 is formed in the insulating film 154 above the power supply line 920. The signal line 953 is connected to the gate electrode 134 through an electrical conductor in the contact hole 544. A signal line 954 is formed in the insulating film 154 above the power supply line 910. The signal line 954 is connected to the local conductive trace 294TB through an electrical conductor in the contact hole 534B. The signal line 953 inputs an input signal to an inverter that includes the P-channel MOS transistor 1341P and the N-channel MOS transistor 1341N. The signal line 954 outputs an output signal from an inverter that includes the P-channel MOS transistor 1341P and the N-channel MOS transistor 1341N.

For example, the power supply lines 910 and 920 may be made of ruthenium (Ru), cobalt (Co) or tungsten (W). For example, the signal lines 953 and 954 are made of copper (Cu), ruthenium (Ru), or cobalt (Co). When copper or cobalt is used, a conductive underfilm (barrier metal film) such as a tantalum (Ta) film or a tantalum nitride (TaN) film is preferably formed. When ruthenium is used, it is not necessary to form an underfilm.

For example, the local conductive traces may be made of ruthenium (Ru), cobalt (Co) or tungsten (W). When cobalt or tungsten is used, a conductive underfilm (barrier metal film) such as a titanium (Ti) film or a titanium nitride (TiN) film is preferably formed. When ruthenium is used, it is not necessary to form an underfilm. For example, a material similar to the local conductive traces, or a material similar to the signal lines 953 and 954 may be used for forming a conductive film (via) in the contact hole.

For example, the substrate 101P may be made of a semiconductor such as silicon (Si). For example, the fins 183 and 184 can be formed by patterning the substrate 101P. A high-melting point metal silicide such as nickel (Ni) or cobalt (Co) may be disposed on portions of the fins 183 and 184 in contact with the local conductive traces. For example, the channels of the semiconductor areas 283 and 284 may employ semiconductor nanowires such as silicon (Si). The P-type and N-type areas of the semiconductor areas 283 and 284 may employ semiconductors such as Si, silicon carbide (SiC), silicon germanium (SiGe), and the like, which are epitaxially grown from the end faces of the nanowires of the channels.

For example, the gate electrodes 133 and 134 may be made of electrically conductive materials such as titanium (Ti), titanium nitride (TiN), polysilicon (polysilicon), or the like. For example, a high dielectric material such as hafnium oxide, aluminum oxide, hafnium oxide and aluminum oxide may be used for the gate insulating film 135.

For example, the signal lines 953 and 954 are formed by a dual damascene process along with contact holes located beneath the signal lines 953 and 954. The signal lines 953 and 954 may also be formed in a single damascene process, separate from the contact holes located beneath the signal lines 953 and 954. These modifications may be applied to other embodiments and modifications.

According to the first embodiment, the fin 183 containing the P-type areas 183PA and 183PB is connected to the power supply line 920 corresponding to the VSS line through the local conductive traces 193BA and 193BB. Thus, the VSS potential is supplied to the P-type substrate 101P, and the VSS potential is supplied to the back gate of the N-channel MOS transistor 1341N in the standard cell 120.

Within one P-type area 10P, rows of standard cells 120 in which the well taps 610P are located and rows of standard cells 120 in which the well taps 610P are not located are electrically connected. Specifically, N-type impurity areas that electrically isolate the entire rows are not disposed within one P-type area 10P.

Thus, even in the rows of the standard cells 120 in which the well taps 610P are not located, the VSS potential can be supplied from the well taps 610P to the back gate of the N channel MOS transistor 1341N of each standard cell 120. Accordingly, a circuit area can be reduced as compared to a configuration in which the power supply switch circuits are disposed in all the rows of the standard cells 120.

The pseudo-transistor structure 611P is not limited in its structure and conductivity type. For example, the semiconductor area 283 or the local conductive traces 293TA and 293TB may not be provided. Note that from the viewpoint of the uniformity of the patterns in forming the P-channel MOS transistor 1341P, the conductivity type of each semiconductor area and the pitch of each pattern may preferably be the same as those of the P-channel MOS transistor 1341P.

One or both of the power supply lines 910 and 920 may not be embedded in the substrate 101P, but may be included in a wiring layer above the substrate 101P. The contact holes 523A and 523B may not be formed on the insulating film 106.

Figure 7:
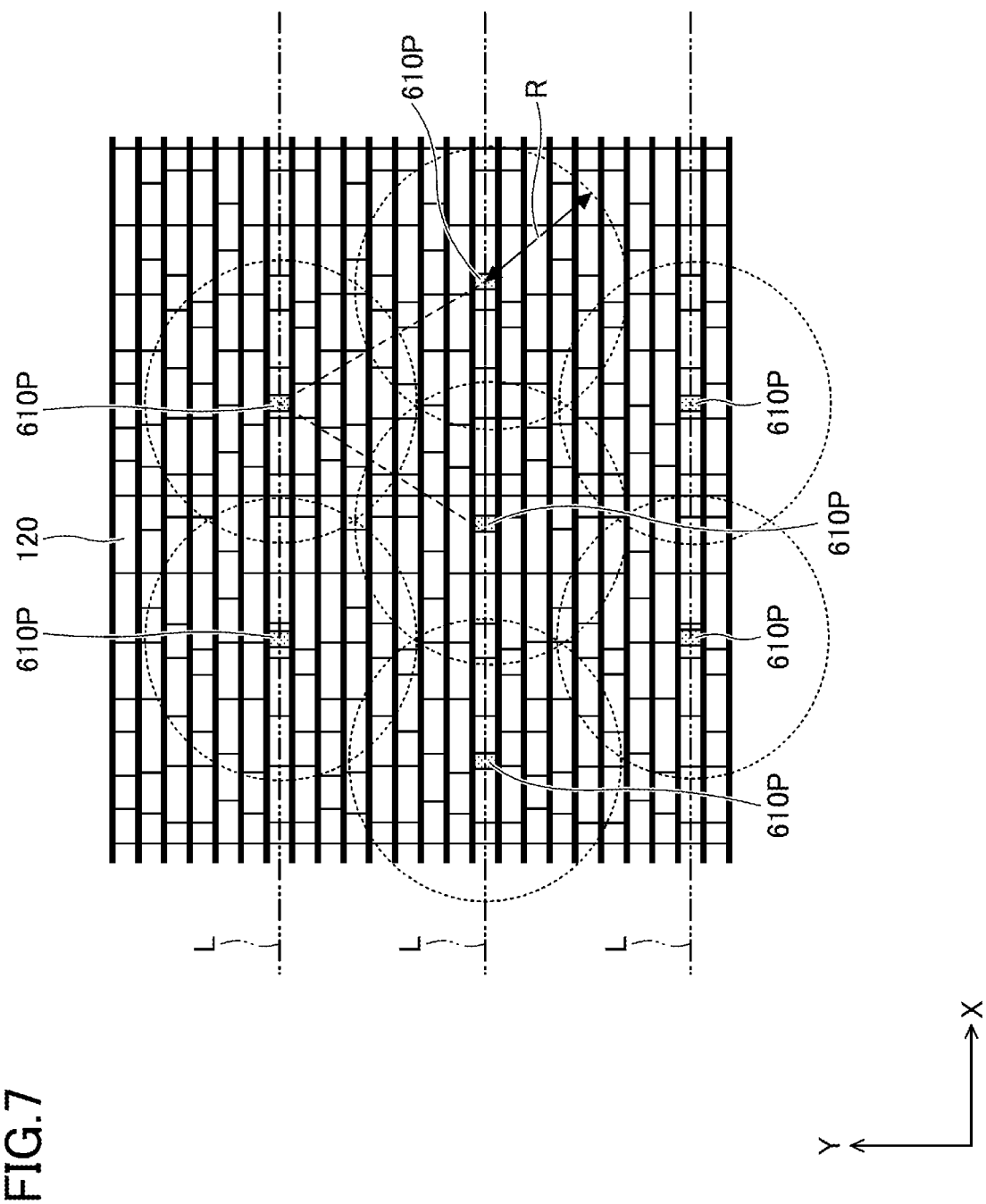
FIG. 7 is a schematic view illustrating an example of a placement of a well tap in a first embodiment.

The placement of the well taps 610P is not particularly specified. However, the well taps 610P are preferably disposed such that the VSS potential is uniformly supplied throughout the P-type area 10P. FIG. 7 is a schematic view illustrating an example of the placement of the well taps 610P according to the first embodiment. In the example illustrated in FIG. 7, multiple virtual straight lines L extending in the X direction are aligned in the Y direction, and the well taps 610P are aligned on the multiple straight lines L in parallel, such that positions of the well taps 610P in the X direction are offset between two adjacent straight lines L in the Y direction. For example, three nearest neighboring well taps 610P are preferably aligned in a triangular lattice, preferably aligned to form an equilateral triangle in a plan view. In this case, the length of one side of the equilateral triangle is preferably close to $R \times \sqrt{3}$ within the range of $R \times \sqrt{3}$ or less, where the radius of the circular range, from which a potential can be supplied from each well tap 610P, is R. The radius R may be referred to as the well tap effective distance.

A plurality of pairs of power supply lines 910 and 920 may also be provided between two adjacent straight lines L in the Y direction so as to extend in the X direction. That is, there may be a row of standard cells 120 between two adjacent straight lines L in the Y direction without a well tap 610P.

According to the first embodiment, a well tap 610P is disposed between adjacent power supply lines 910 and 920. That is, the well tap 610P is a single height cell. However, the well tap 610P may be a double height cell. That is, the power supply lines 910 and 920 may be disposed alternately in the Y direction, and well taps 610P may be disposed between two adjacent power supply lines 910 or between two adjacent power supply lines 920.

In addition, the conductivity type of each semiconductor area may be reversed. That is, according to the first embodiment, the portion having the P-type may be the N-type, and the portion having the N-type may be the P-type.

Other embodiments and modifications described below may include a well tap 610P similar to the first embodiment in the standard cell 120.

Second Embodiment

Figure 8:
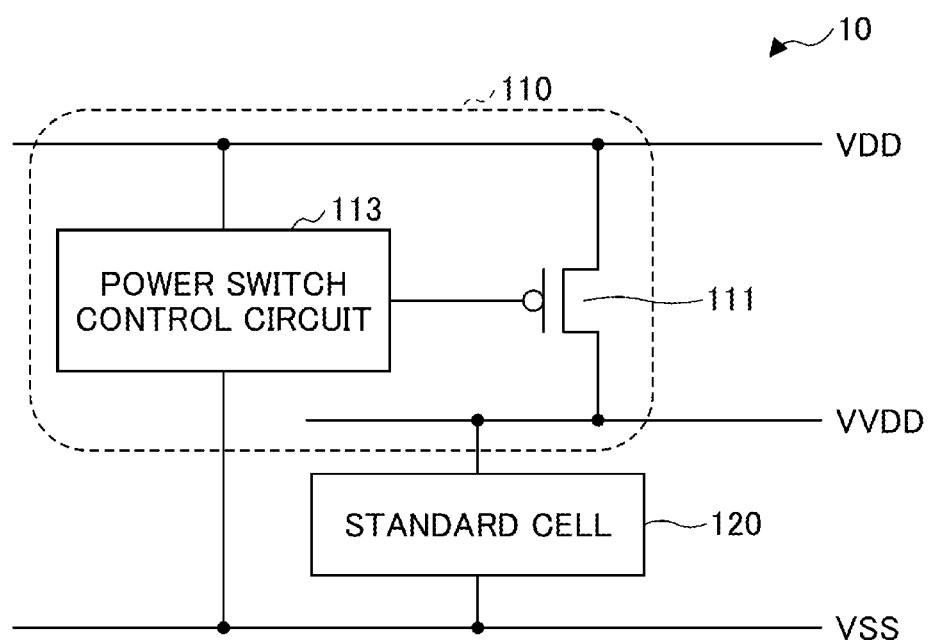
FIG. 8 is a circuit diagram illustrating a configuration of a power supply switch circuit included in a semiconductor device according to a second embodiment.

Next, a second embodiment will be described. FIG. 8 is a circuit diagram illustrating a configuration of a power supply switch circuit included in a semiconductor device according to a second embodiment.

As illustrated in FIG. 8, a standard cell area 10 includes a VDD line and a power supply switch circuit 110. The power supply switch circuit 110 includes a switch transistor 111 and a power supply switch control circuit 113. For example, the switch transistor 111 is a P-channel MOS transistor, and is connected between the VDD line and the VVDD line. The power supply switch control circuit 113 is connected to the gate of the switch transistor 111 to control the operation of the switch transistor 111. The power supply switch control circuit 113 switches the ON/OFF state of the switch transistor 111 to control the conductivity between the VDD line and the VVDD line. For example, the power supply switch control circuit 113 is a buffer.

Figure 9:
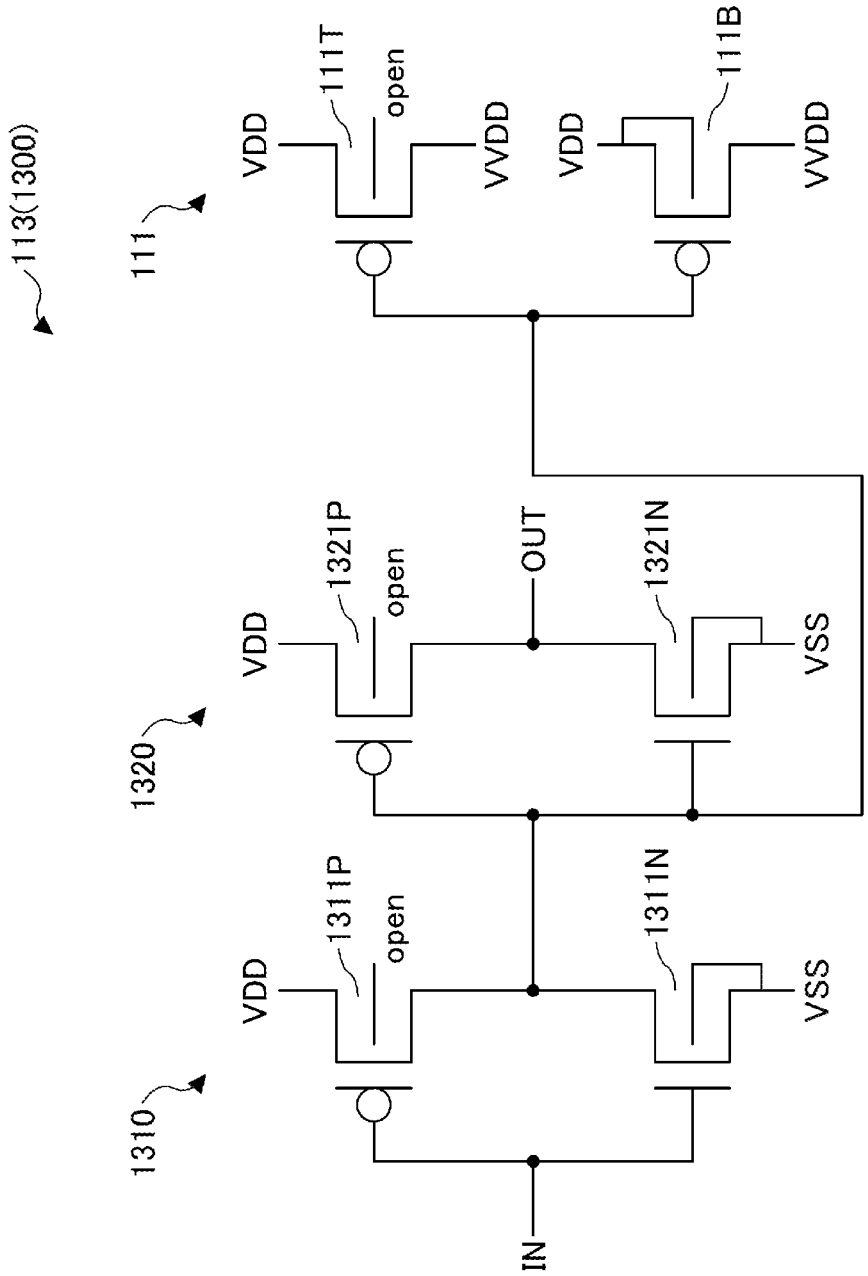
FIG. 9 is a circuit diagram illustrating the configuration of a buffer and a switch transistor in a second embodiment.

Next, the configurations of the buffer and the switch transistor 111 used for the power supply switch control circuit 113 will be described. FIG. 9 is a circuit diagram illustrating the configurations of a buffer and a switch transistor according to a second embodiment.

As illustrated in FIG. 9, a buffer 1300 used for the power supply switch control circuit 113 includes an inverter 1310 and an inverter 1320. The inverter 1310 receives an input signal IN. The output of the inverter 1310 is received by the gate of the switch transistor 111 and the inverter 1320. The inverter 1320 outputs an output signal OUT. The inverter 1310 includes a pair of transistors that are a P-channel MOS transistor 1311P and an N-channel MOS transistor 1311N. The inverter 1320 includes a pair of transistors that are a P-channel MOS transistor 1321P and an N-channel MOS transistor 1321N. It should be noted that the configurations of the inverters 1310 and 1320 are merely an example. For example, two or more pairs of P-channel MOS transistor and N-channel MOS transistor may be included in each of the inverters 1310 and 1320. The switch transistor 111 includes a pair of transistors that are a P-channel MOS transistor 111T and a P-channel MOS transistor 111B.

The P-channel MOS transistor 111T is formed on the P-channel MOS transistor 111B. The P-channel MOS transistor 1311P is formed on the N-channel MOS transistor 1311N. The P-channel MOS transistor 1321P is formed on the N-channel MOS transistor 1321N.

As will be described in detail below, the power supply switch circuit 110 is disposed in the P-type area 10P. The switch transistor 111 is disposed in an N-type area 10N on the surface of the substrate having an N-type conductivity type inside the P-type area 10P. The N-type area 10N is, for example, an N-well. A well tap 620N is disposed between the switch transistor 111 and the power supply switch control circuit 113. The well tap 620N is an area for supplying power to the N-type area 10N. The well tap 620N includes a pseudo-transistor structure 621N with the source and the drain of the P-channel MOS transistor being N-type, and a P-channel MOS transistor 1331P. The P-channel MOS transistor 1331P is formed on a pseudo-transistor structure 621N. The VSS potential is supplied from the well tap 610P to the P-type area 10P.

Figure 10:
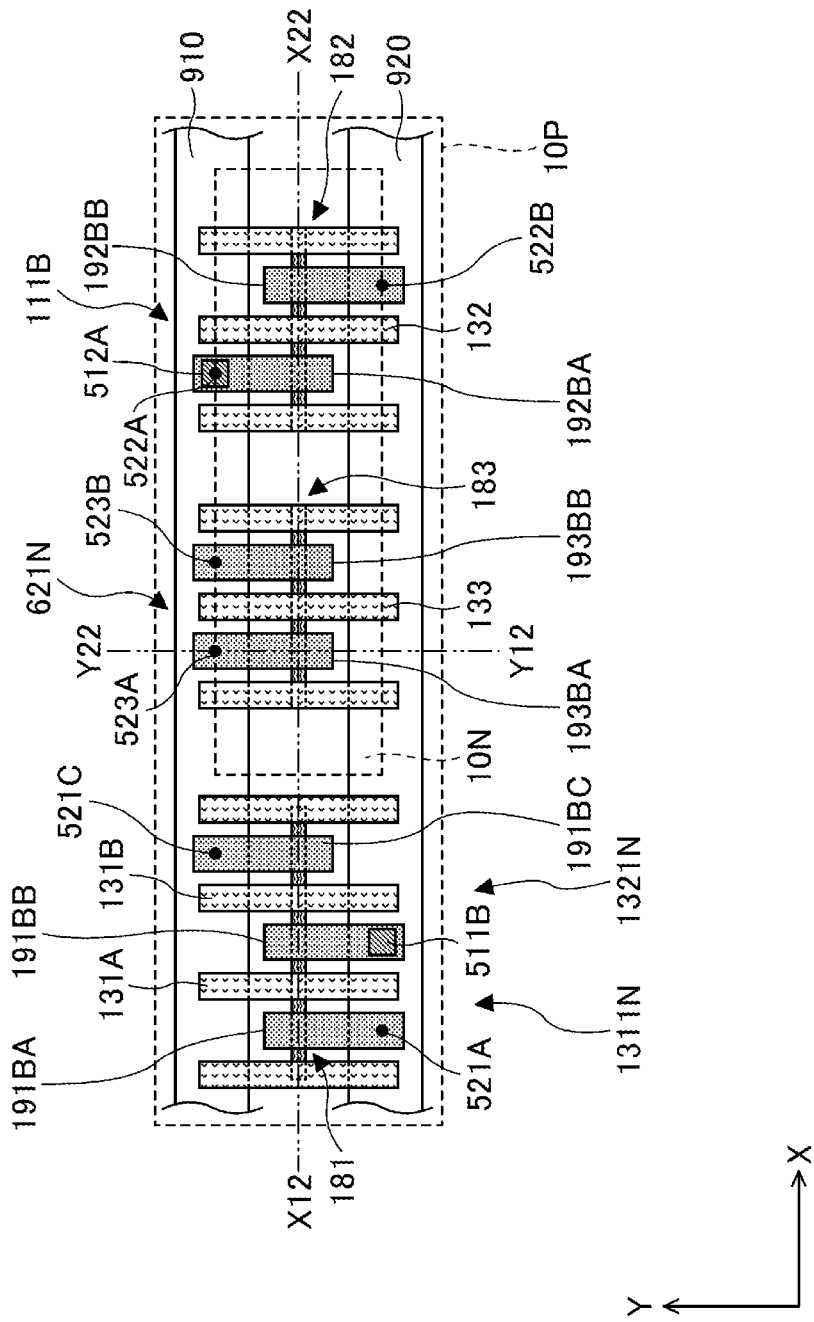
FIG. 10 is a schematic plan view (Part 1) illustrating a configuration of a power supply switch circuit according to the second embodiment.
Figure 11:
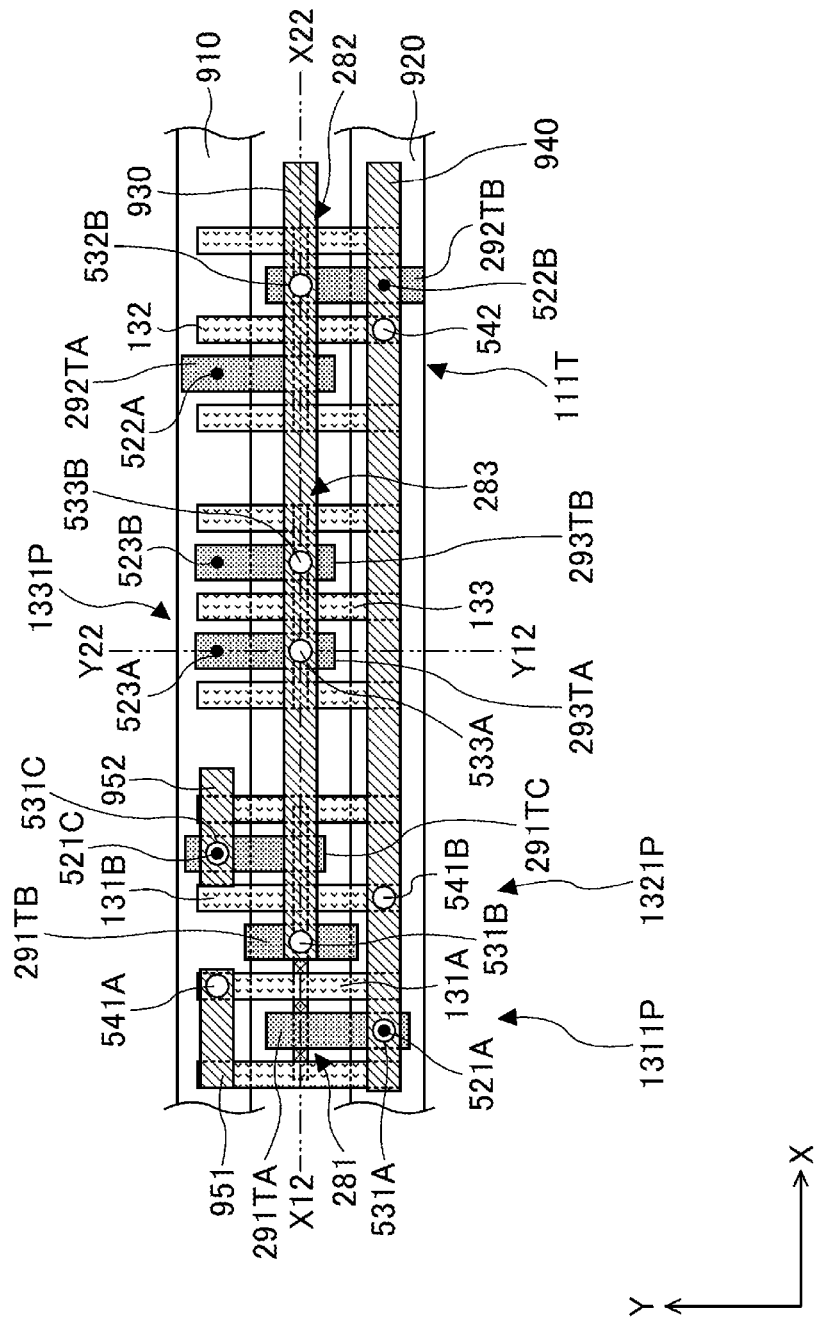
FIG. 11 is a schematic plan view (Part 2) illustrating a configuration of a power supply switch circuit according to a second embodiment.
Figure 12:
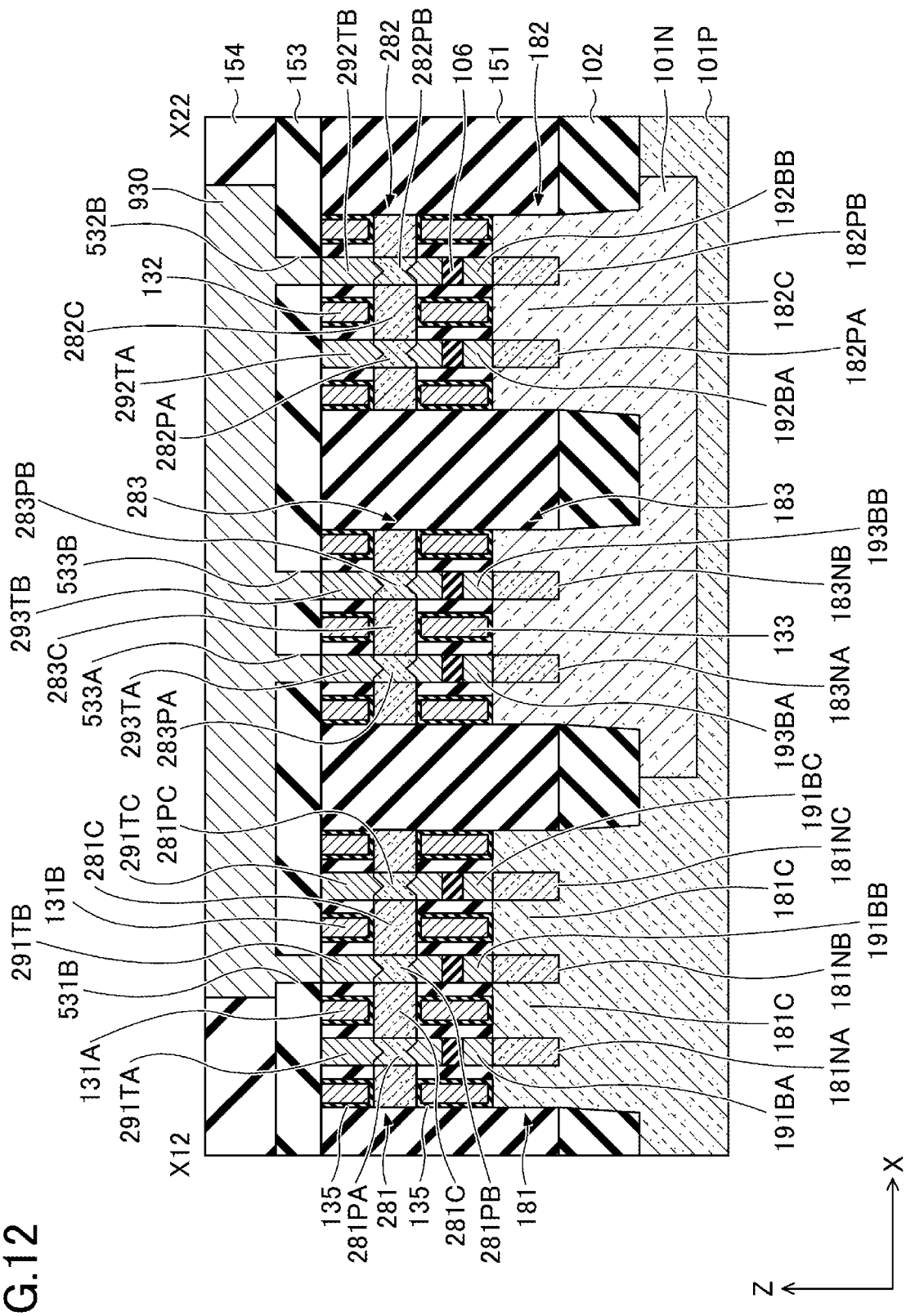
FIG. 12 is a cross-sectional view (Part 1) illustrating a power supply switch circuit according to a second embodiment.
Figure 13:
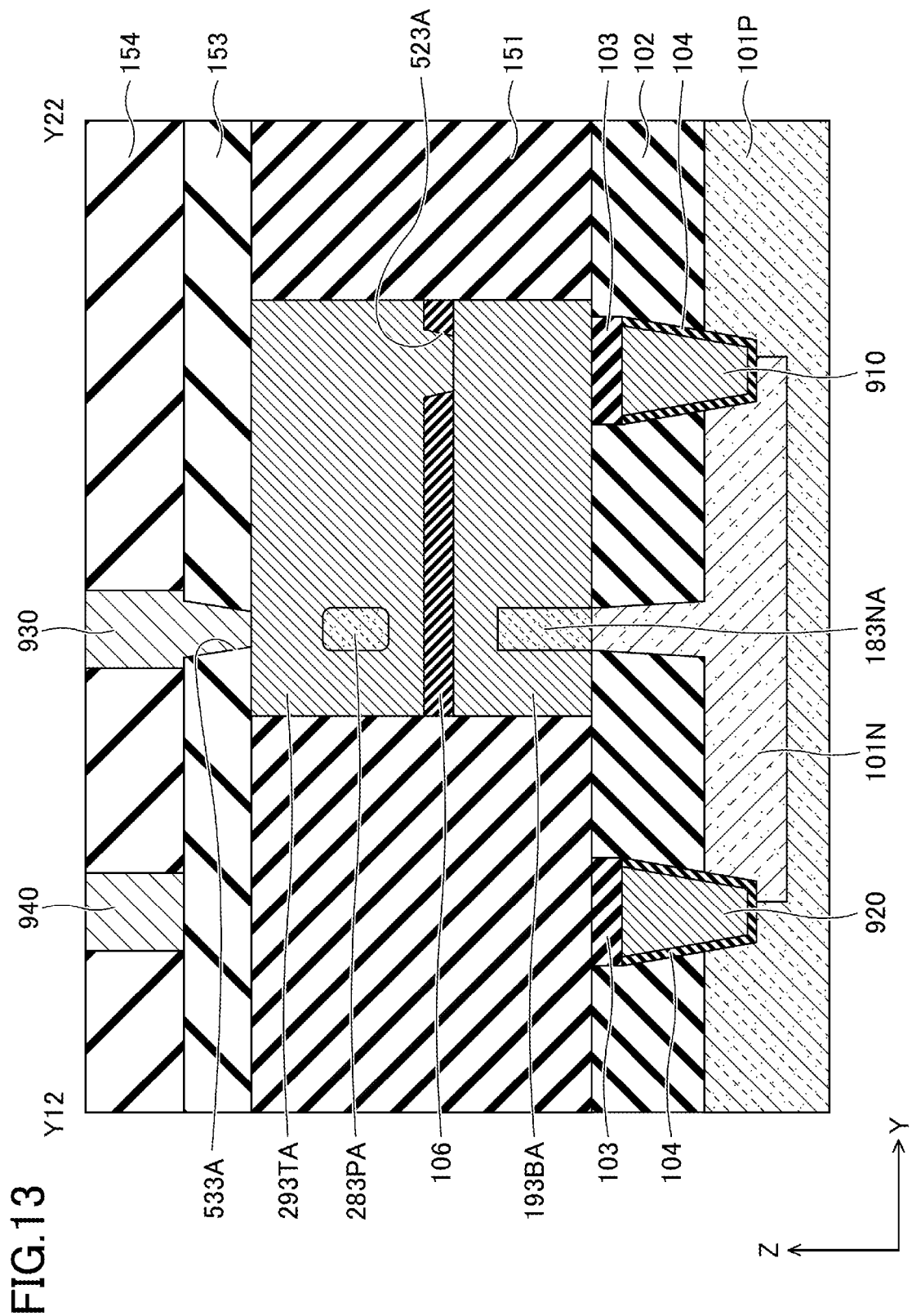
FIG. 13 is a cross-sectional view (Part 2) illustrating a power supply switch circuit according to a second embodiment.

FIGS. 10 and 11 are schematic plan views illustrating a configuration of the power supply switch circuit 110 according to the second embodiment. FIG. 10 primarily illustrates a layout of N-channel MOS transistors 1311N and 1321N, a P-channel MOS transistor 111B, and a pseudo-transistor structure 621N. FIG. 11 primarily illustrates a layout of the P-channel MOS transistors 1311P and 1321P, the P-channel MOS transistor 111T, and the P-channel MOS transistor 1331P. Except for the structures illustrated in both FIGS. 10 and 11, structures illustrated in FIG. 11 are located above the structures illustrated in FIG. 10. FIGS. 12 and 13 are cross-sectional views illustrating a power supply switch circuit 110 according to the second embodiment. FIG. 12 corresponds to a cross-sectional view cut along the X12-X22 line in FIGS. 10 and 11. FIG. 13 corresponds to a cross-sectional view cut along the Y12-Y22 line in FIGS. 10 and 11.

An element isolation film 102 is formed on the surface of the P-type substrate 101P. Of the fins defined by element isolation film 102, an N-well 101N is formed across the fins 182 and 183. Multiple grooves extending in the X direction are formed in the substrate 101P, the N-well 101N, and the element isolation film 102, and the power supply lines 910 and 920 are formed in the substrate 101P, the N-well 101N, and the element isolation film 102 through an insulating film 104. For example, the surfaces of the power supply lines 910 and 920 are covered by an insulating film 103. The surface of the element isolation film 102 and the surface of the insulating film 103 may or may not be flush with the surface of the substrate 101P.

Fins 181, 182 and 183 extending in the X direction and rising in the Z direction are formed on the substrate 101P. The substrate 101P is exposed from the element isolation film 102 between the power supply line 910 and the power supply line 920. In the X direction, a fin 183 is located between the fins 181 and 182. The fin 181 is formed across the N-channel MOS transistor 1311N and the N-channel MOS transistor 1321N, and the fin 182 is formed in the P-channel MOS transistor 111B. The fin 183 is included in the well tap 620N.

The fin 181 includes an N-type area 181NA, an N-type area 181NC, and an N-type area 181NB between the N-type area 181NA and the N-type area 181NC. The N-type area 181NA is the drain of the N-channel MOS transistor 1311N. The N-type area 181NC is the drain of the N-channel MOS transistor 1321N. The N-type area 181NB is the source of the N-channel MOS transistor 1311N and the source of the N-channel MOS transistor 1321N. A portion of the fin 181 between the N-type area 181NA and the N-type area 181NB is a channel 181C of the N-channel MOS transistor 1311N. A portion of the fin 181 between the N-type area 181NB and the N-type area 181NC is a channel 181C of the N-type channel MOS transistor 1321N.

The fin 182 includes a P-type area 182PA and a P-type area 182PB aligned in the X-direction. The P-type area 182PA is the drain of the P-channel MOS transistor 111B. The P-type area 182PB is the source of the P-channel MOS transistor 111B. A portion of the fin 182 between the P-type area 182PA and the P-type area 182PB is a channel 182C of the P-channel MOS transistor 111B.

The fin 183 includes an N-type area 183NA and an N-type area 183NB aligned in the X-direction. The conductivity type of a portion of the fin 183 between the N-type area 183NA and the N-type area 183NB is N-type. The N-type areas 183NA and 183NB contain N-type impurities at concentrations greater than the N-well 101N.

A local conductive trace 191BA extending from the N-type area 181NA in the Y-direction, a local conductive trace 191BB extending from the N-type area 181NB in the Y-direction, and a local conductive trace 191BC extending from the N-type area 181NC in the Y-direction are formed on the element isolation film 102. The local conductive traces 191BA and 191BB extend above the power supply line 920. The local conductive trace 191BC extends above the power supply line 910.

A contact hole 511B is formed in the insulating film 103 between the local conductive trace 191BB and the power supply line 920, and the local conductive trace 191BB is connected to the power supply line 920 through a conductor in the contact hole 511B. The local conductive trace 191BB electrically connects the power supply line 920 to the N-type area 181NB.

The local conductive trace 192BA extending in the Y direction from the P-type area 182PA and the local conductive trace 192BB extending in the Y direction from the P-type area 182PB are formed on the element isolation film 102. The local conductive trace 192BA extends above the power supply line 910. The local conductive trace 192BB extends above the power supply line 920.

A contact hole 512A is formed in the insulating film 103 between the local conductive trace 192BA and the power supply line 910, and the local conductive trace 192BA is connected to the power supply line 910 through an electrical conductor in the contact hole 512A. The local conductive trace 192BA electrically connects the power supply line 910 to the P-type area 182PA.

The local conductive trace 193BA extending in the Y direction from the N-type area 183NA and the local conductive trace 193BB extending in the Y direction from the N-type area 183NB are formed on the element isolation film 102. The local conductive traces 193BA and 193BB extend above the power supply line 910.

The insulating film 106 is formed on the local conductive traces 191BA, 191BB, 191BC, 192BA, 192BB, 193BA, and 193BB.

Through the insulating film 106, a local conductive trace 291TA is formed on the local conductive trace 191BA, a local conductive trace 291TB is formed on the local conductive trace 191BB, and a local conductive trace 291TC is formed on the local conductive trace 191BC.

A contact hole 521A is formed in the insulating film 106 between the local conductive trace 291TA and the local conductive trace 191BA above the power supply line 920. The local conductive trace 291TA and the local conductive trace 191BA are electrically connected to each other through a conductor in the contact hole 521A.

A contact hole 521C is formed in the insulating film 106 between the local conductive trace 291TC and the local conductive trace 191BC above the power supply line 910. The local conductive trace 291TC and the local conductive trace 191BC are electrically connected to each other through a conductor in the contact hole 521C.

The local conductive trace 291TB and the local conductive trace 191BB are electrically isolated from each other by an insulating film 106.

Through the insulating film 106, a local conductive trace 292TA is formed on the local conductive trace 192BA, and a local conductive trace 292TB is formed on the local conductive trace 192BB.

A contact hole 522A is formed in the insulating film 106 between the local conductive trace 292TA and the local conductive trace 192BA above the power supply line 910. The local conductive trace 292TA and the local conductive trace 192BA are electrically connected to each other through a conductor in the contact hole 522A.

A contact hole 522B is formed in the insulating film 106 between the local conductive trace 292TB and the local conductive trace 192BB above the power supply line 920. The local conductive trace 292TB and the local conductive trace 192BB are electrically connected to each other through a conductor in the contact hole 522B.

As illustrated in FIG. 13, a contact hole 523A is formed in the insulating film 106 between the local conductive trace 293TA and the local conductive trace 193BA above the power supply line 910. The local conductive trace 293TA and the local conductive trace 193BA are electrically connected to each other through a conductor in the contact hole 523A.

A contact hole 523B is formed in the insulating film 106 between the local conductive trace 293TB and the local conductive trace 193BB above the power supply line 910. The local conductive trace 293TB and the local conductive trace 193BB are electrically connected to each other through a conductor in the contact hole 523B.

A semiconductor area 281 extending in the X direction and overlapping the local conductive traces 291TA, 291TB and 291TC in a plan view is disposed above the fin 181. A semiconductor area 282 extending in the X direction and overlapping the local conductive traces 292TA and 292TB in a plan view is disposed above the fin 182. A semiconductor area 283 extending in the X direction and overlapping the local conductive traces 293TA and 293TB in a plan view is disposed above the fin 183.

The semiconductor area 281 includes a P-type area 281PA, a P-type area 281PC, and a P-type area 281PB between the P-type area 281PA and the P-type area 281PC. The P-type area 281PA is the drain of the P-channel MOS transistor 1311P. The P-type area 281PC is the drain of the P-channel MOS transistor 1321P. The P-type area 281PB is the source of the P-channel MOS transistor 1311P and is the source of the P-channel MOS transistor 1321P. A portion of the semiconductor area 281 between the P-type area 281PA and the P-type area 281PB is a channel 281C of the P-channel MOS transistor 1311P. A portion of the semiconductor area 281 between the P-type area 281PB and the P-type area 281PC is a channel 281C of the P-channel MOS transistor 1321P.

The semiconductor area 282 includes a P-type area 282PA and a P-type area 282PB aligned in the X-direction. The P-type area 282PA is the drain of the P-channel MOS transistor 111T. The P-type area 282PB is the source of the P-channel MOS transistor 111T. A portion of the semiconductor area 282 between the P-type area 282PA and the P-type area 282PB is a channel 282C of the P-channel MOS transistor 111T.

The semiconductor area 283 includes a P-type area 283PA and a P-type area 283PB aligned in the X-direction. The P-type area 283PA is the source or the drain of the P-channel MOS transistor 1331P. The P-type area 283PB is the drain or the source of the P-channel MOS transistor 1331P. A portion of the semiconductor area 283 between the P-type area 283PA and the P-type area 283PB is a channel 283C of the P-channel MOS transistor 1331P.

A gate electrode 131A common to the N-channel MOS transistor 1311N and the P-channel MOS transistor 1311P is formed between the stack of the local conductive traces 191BA and 291TA and the stack of the local conductive traces 191BB and 291TB. A gate electrode 131B common to the N-channel MOS transistor 1321N and the P-channel MOS transistor 1321P is formed between the stack of the local conductive traces 191BC and 291TC and the stack of the local conductive traces 191BB and 291TB. A gate electrode 132 common to the P-channel MOS transistors 111B and 111T is formed between the stack of the local conductive traces 192BA and 292TA and the stack of the local conductive traces 192BB and 292TB. A gate electrode 133 of the P-channel MOS transistor 1331P is formed between the stack of local conductive traces 193BA and 293TA and the stack of local conductive traces 193BB and 293TB.

A gate insulating film 135 is formed between each of the gate electrodes 131A and 131B and the channel 181C. A gate insulating film 135 is formed between each of the gate electrodes 131A and 131B and the channel 281C. A gate insulating film 135 is also formed between the gate electrode 132 and the channel 182C. A gate insulating film 135 is formed between the gate electrode 132 and the channel 282C, and a gate insulating film 135 is formed between the gate electrode 133 and the channel 283C.

An insulating film 151 is formed above the substrate 101 and the element isolation film 102. The local conductive traces 191BA, 191BB, 191BC, 192BA, 192BB, 193BA, 193BB, 291TA, 291TB, 291TC, 292TA, 292TB, 293TA, and 293TB are embedded in the insulating film 151. The gate electrodes 131A, 131B, 132, and 133 are also embedded in the insulating film 151.

An insulating film 153 is formed on the insulating film 151, the local conductive traces 291TA, 291TB, 291TC, 292TA, 292TB, 293TA and 293TB, and the gate electrodes 131A, 131B, 132 and 133, and an insulating film 154 is formed on the insulating film 153.

A contact hole 531A extending to the local conductive trace 291TA is formed above the power supply line 920 of the insulating film 153. A contact hole 541A extending to the gate electrode 131A is formed above the power supply line 910 of the insulating film 153. A contact hole 531B extending to the local conductive trace 291TB is formed above the N-type area 181NB and the P-type area 281PB of the insulating film 153. A contact hole 541B extending to the gate electrode 131B is formed above the power supply line 920 of the insulating film 153. A contact hole 531C extending to the local conductive trace 291TC is formed above the power supply line 910 of the insulating film 153.

A contact hole 532B extending to the local conductive trace 292TB is formed above the P-area 182PB and 282PB of the insulating film 153. A contact hole 542 extending to the gate electrode 133 is formed above the power supply line 920 of the insulating film 153.

As illustrated in FIG. 13, a contact hole 533A extending to the local conductive trace 293TA is formed above the N-type area 183NA and the P-type area 283PA of the insulating film 153. A contact hole 533B extending to the local conductive trace 293TB is formed above the N-type area 183NB and the P-type area 283PB of the insulating film 153.

A signal line 951 and a signal line 952 are formed in the insulating film 154 above the power supply line 910. The signal line 951 is connected to the gate electrode 131A through an electrical conductor in the contact hole 541A. The signal line 952 is connected to the local conductive trace 291TC through an electrical conductor in the contact hole 531C. The signal lines 951 and 952 extend in the X direction. An input signal IN to the inverter 1310 is input to the signal line 951 and an output signal OUT from the inverter 1320 is output from the signal line 952.

A control signal line 940 is formed in the insulating film 154 above the power supply line 920. The control signal line 940 is connected to the local conductive trace 291TA through an electrical conductor in the contact hole 531A. The control signal line 940 is connected to the gate electrode 131B through an electrical conductor in the contact hole 541B. The control signal line 940 is connected to the gate electrode 132 through an electrical conductor in the contact hole 542. The control signal line 940 extends in the X direction. A control signal is transmitted from the power supply switch control circuit 113 to the switch transistor 111 (P-channel MOS transistors 111T and 111B) through the control signal line 940.

A power supply line 930 formed in the insulating film 154 is disposed between each of the signal lines 951 and 952 and the control signal line 940 in the Y direction. The power supply line 930 is connected to the local conductive trace 291TB through an electrical conductor in the contact hole 531B. The power supply line 930 is connected to the local conductive trace 292TB through an electrical conductor in the contact hole 532B. The power supply line 930 is also connected to the local conductive trace 293TA through an electrical conductor in the contact hole 533A. The power supply line 930 is also connected to the local conductive trace 293TB through an electrical conductor in the contact hole 533B.

For example, copper (Cu), ruthenium (Ru) or cobalt (Co) and the like are used as materials for the power supply line 930, the control signal line 940, and the signal lines 951 and 952. When copper or cobalt is used, a conductive underfilm (barrier metal film) is preferably formed. Examples of the conductive underfilm include a tantalum (Ta) film or a tantalum nitride (TaN) film. When ruthenium is used, it is not necessary to form an underfilm.

For example, the fins 181 and 182 can be formed by patterning the substrate 101P containing the N-well 101N. A high melting point metal silicide such as nickel (Ni) or cobalt (Co) may be disposed on portions of the fins 181 and 182 in contact with the local conductive traces. For example, channels of the semiconductor areas 281 and 282 may use semiconductor nanowires such as silicon (Si). The P-type and the N-type areas of the semiconductor areas 281 and 282 can use semiconductors such as Si, silicon carbide (SiC), silicon germanium (SiGe), and the like, which are epitaxially grown from the end faces of the nanowires of the channels.

For example, the gate electrodes 131A, 131B and 132 may be made of electrically conductive materials such as titanium (Ti), titanium nitride (TiN), polycrystalline silicon (polySi), or the like.

The signal lines 951 and 952 are formed, for example, by a dual damascene process. The signal lines 951 and 952 may be formed by a single damascene process.

According to the second embodiment, the fin 183 containing N-type areas 183NA and 183NB are connected to the power supply line 930 corresponding to the VDD line through the local conductive traces 193BA, 193BB, 293TA and 293TB. Accordingly, the VDD potential is supplied to the N-well 101N and the VDD potential is supplied to the back gate of the P-channel MOS transistor 111B of the switch transistor 111.

Although not illustrated in the figures, through the well tap 610P, the VSS potential is supplied to the P-type substrate 101P and the VSS potential is supplied to the back gates of the N-channel MOS transistors 1311N and 1321N in the power supply switch control circuit 113.

First Modification of Second Embodiment

Figure 14:
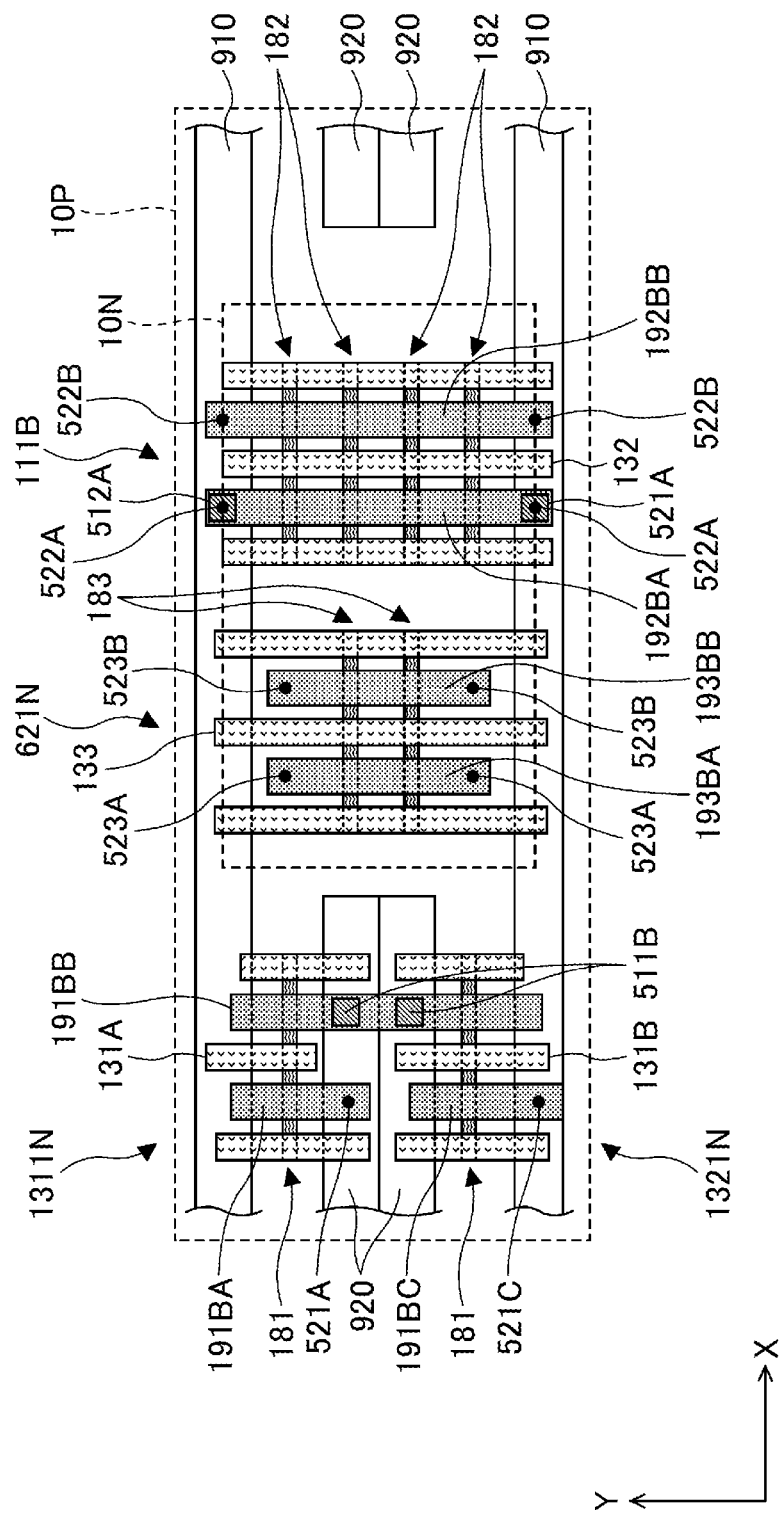
FIG. 14 is a schematic plan view (Part 1) illustrating a configuration of a power supply switch circuit according to a first modification of the second embodiment.
Figure 15:
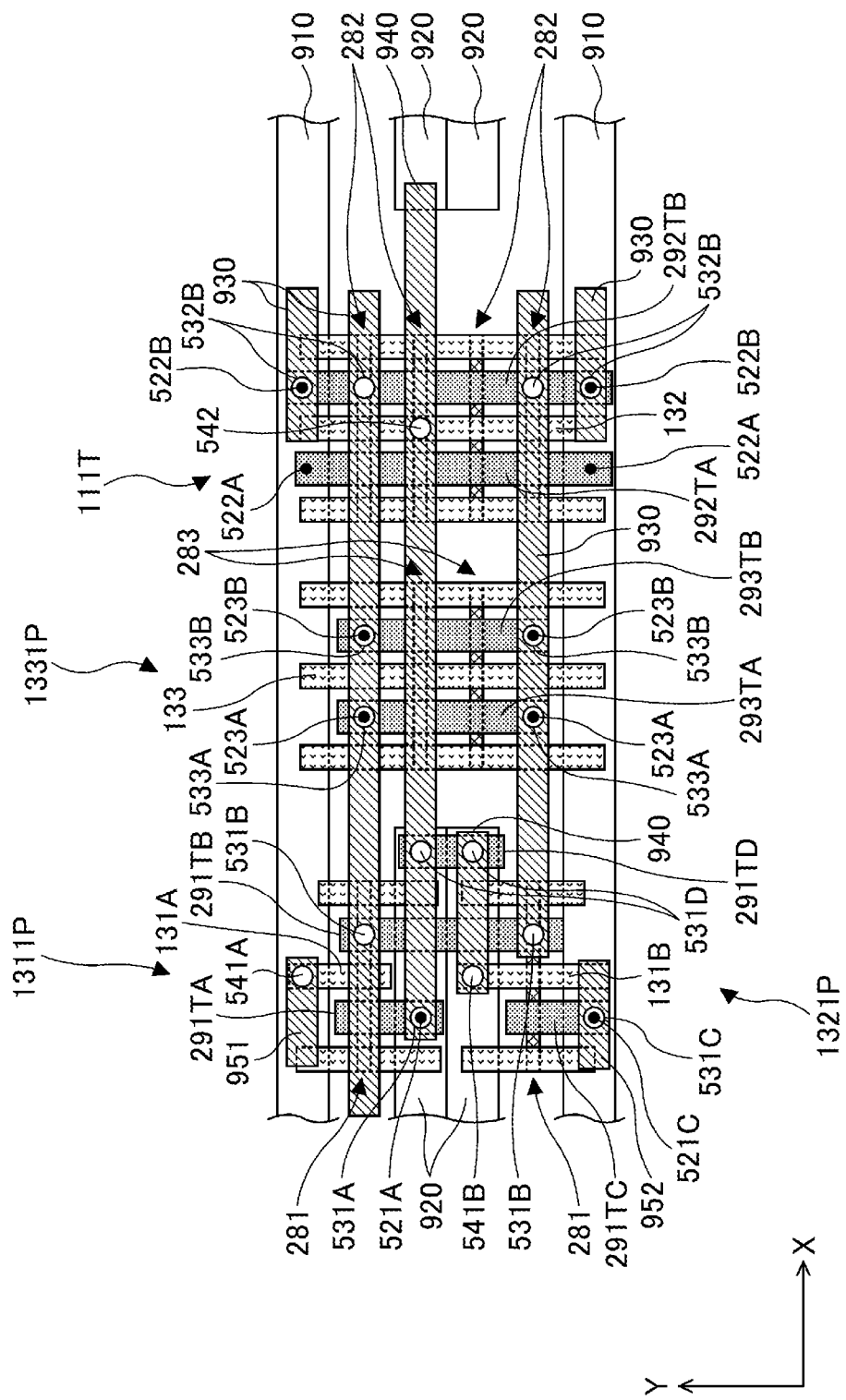
FIG. 15 is a schematic view (Part 2) illustrating the planar configuration of the power supply switch circuit according to the first modification of the second embodiment.

Next, a first modification of the second embodiment will be described. The first modification differs from the second embodiment in height of the cell. FIGS. 14 and 15 are schematic plan views illustrating configurations of a power supply switch circuit 110 according to the first modification of the second embodiment. FIG. 14 primarily illustrates a layout of the N-channel MOS transistors 1311N and 1321N, the P-channel MOS transistors 111B, and the pseudo-transistor structure 621N. FIG. 15 primarily illustrates a layout of the P-channel MOS transistors 1311P and 1321P, the P-channel MOS transistor 111T, and the P-channel MOS transistor 1331P. Except for the structures illustrated in both FIGS. 14 and 15, structures illustrated in FIG. 15 are located above the structure illustrated in FIG. 14.

According to the first modification, the power supply switch circuit 110 is a double-height cell, as illustrated in FIGS. 14 and 15. That is, the power supply switch circuit 110 is formed across two power supply lines 910 such that the power supply lines 920 are interposed between the two power supply lines 910 in the Y direction. The N-channel MOS transistor 1311N and the N-channel MOS transistor 1321N are adjacently disposed in the Y direction, and the P-channel MOS transistor 1311P and the P-channel MOS transistor 1321P are adjacently disposed in the Y direction. Control signal lines 940 are disposed above the power supply lines 920, and power supply lines 930 are disposed above the power supply lines 910 and the power supply lines 920 in the Y direction. The power supply lines 920 are not disposed on well taps 620N and the switch transistor 111. That is, the power supply lines 920 are interrupted by areas overlapping the fins 183 and the fins 182 in a plan view. A portion of the fins 183 and a portion of the fins 182 are disposed in the areas in which the power supply lines 920 are interrupted. The power supply lines 920 may extend to an area of the pseudo-transistor structure 621 where the switch transistor 111 is disposed between the power supply lines 920 in the X direction. In this case, the power supply lines 920 may be disposed between the two fins 183 of the pseudo-transistor structure 621P, such as the fins 181 of each of the N-channel MOS transistors 1311N and 1321N.

With respect to the power supply switch control circuit 113, two pairs of fins 181 and semiconductor areas 281 are disposed, for example. A signal line 951 is disposed above one power supply line 910 and the signal line 952 is disposed above the other power supply line 910. A local conductive trace 291TD connecting the drain of the P-channel MOS transistor 1311P and the gate of the P-channel MOS transistor 1321P is formed. The control signal lines 940 are connected to the local conductive trace 291TD through electrical conductors in the contact holes 531D.

With respect to the well tap 620N, two pairs of fins 183 and semiconductor areas 283 are disposed, for example. The fins 183 and the semiconductor area 283 are disposed on an extension of the power supply lines 920 in the X direction. Contact holes 523A and 523B are located above the power supply lines 910 and the power supply lines 920 in the Y direction.

With respect to the switch transistor 111, four pairs of the fins 182 and semiconductor areas 282 are disposed, for example. The four pairs of fins 182 and semiconductor areas 282 are disposed on an extension of power supply lines 920 in the X direction.

Other configurations are similar to the configuration of the second embodiment.

The first modification provides the same effect as the second embodiment. In addition, the pairs of fins 182 and semiconductor areas 282 of the switch transistor 111 may be disposed on an extension of power supply lines 920 when double-height cells are used. Thus, the switch transistor 111 can be disposed on a large scale in the same area as when two switch transistors of a single height cell are disposed. In other embodiments and modifications, the power supply switch circuit 110 can be a double height cell, such as the first modification.

Figure 16:
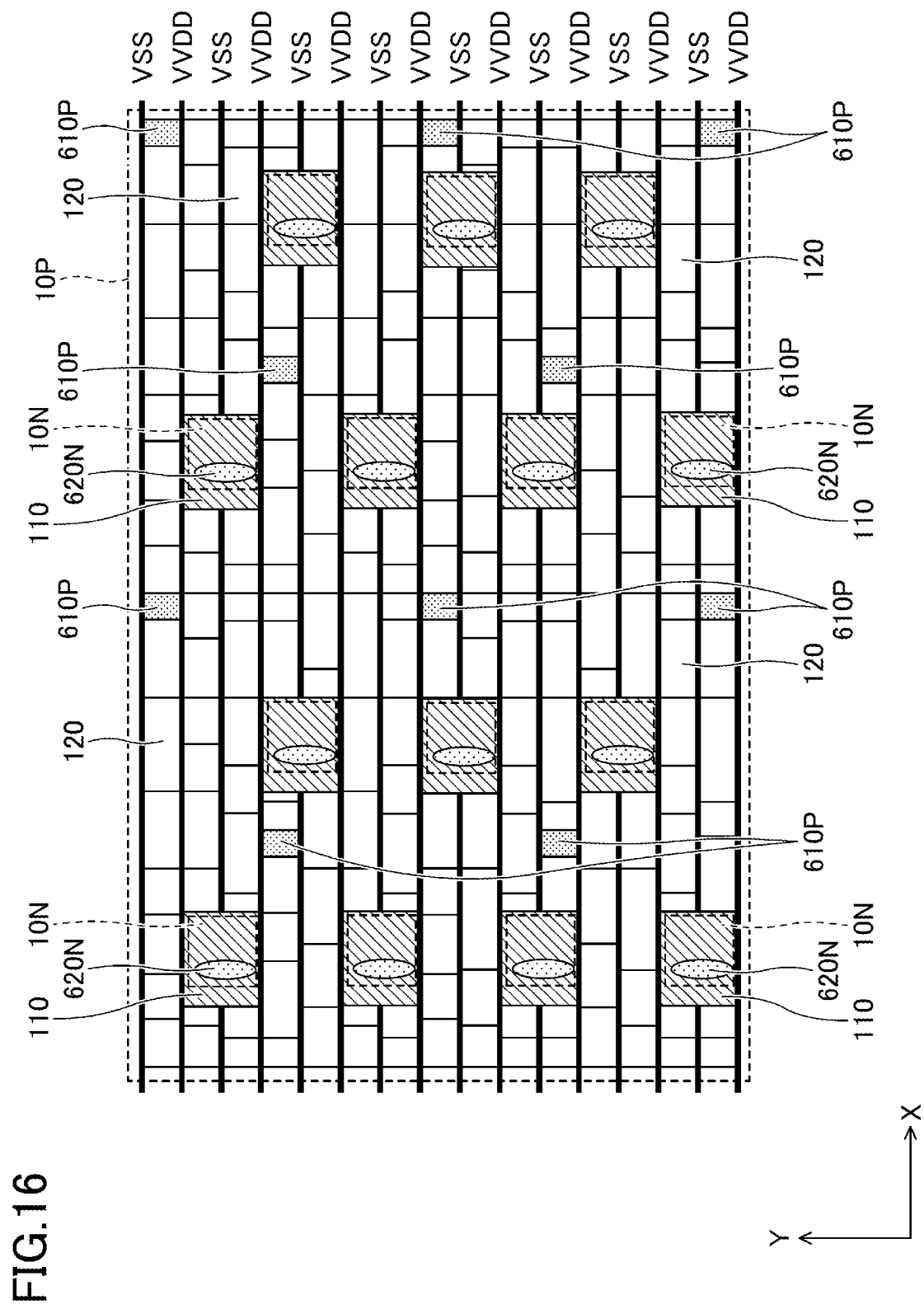
FIG. 16 is a schematic view illustrating a configuration of a standard cell area included in a semiconductor device according to a first modification of a second embodiment.

FIG. 16 is a schematic view illustrating a configuration of a standard cell area included in a semiconductor device according to the first modification of the second embodiment. As illustrated in FIG. 16, a power supply switch circuit 110 is disposed in the P-type area 10P, and an N-type area 10N is disposed within the power supply switch circuit 110. A well tap 620N is disposed within the N-type area 10N. A well tap 610P is disposed within the P-type area 10P. The VSS potential is supplied from the well tap 610P to the back gate of the N-channel MOS transistor 1341N of the standard cell 120. The VSS potential is also supplied from the well tap 610P to the back gates of the N-channel MOS transistors 1311N and 1321N of the power supply switch control circuit 113. The VDD potential is also supplied from the well tap 620N to the back gate of the P-channel MOS transistor 111B of the switch transistor 111. In this example, three nearest neighboring well taps 610P are preferably disposed in a triangular lattice, preferably disposed to form an equilateral triangle.

The power supply switch circuit 110 may be a single height.

Second Modification of Second Embodiment

Figure 17:
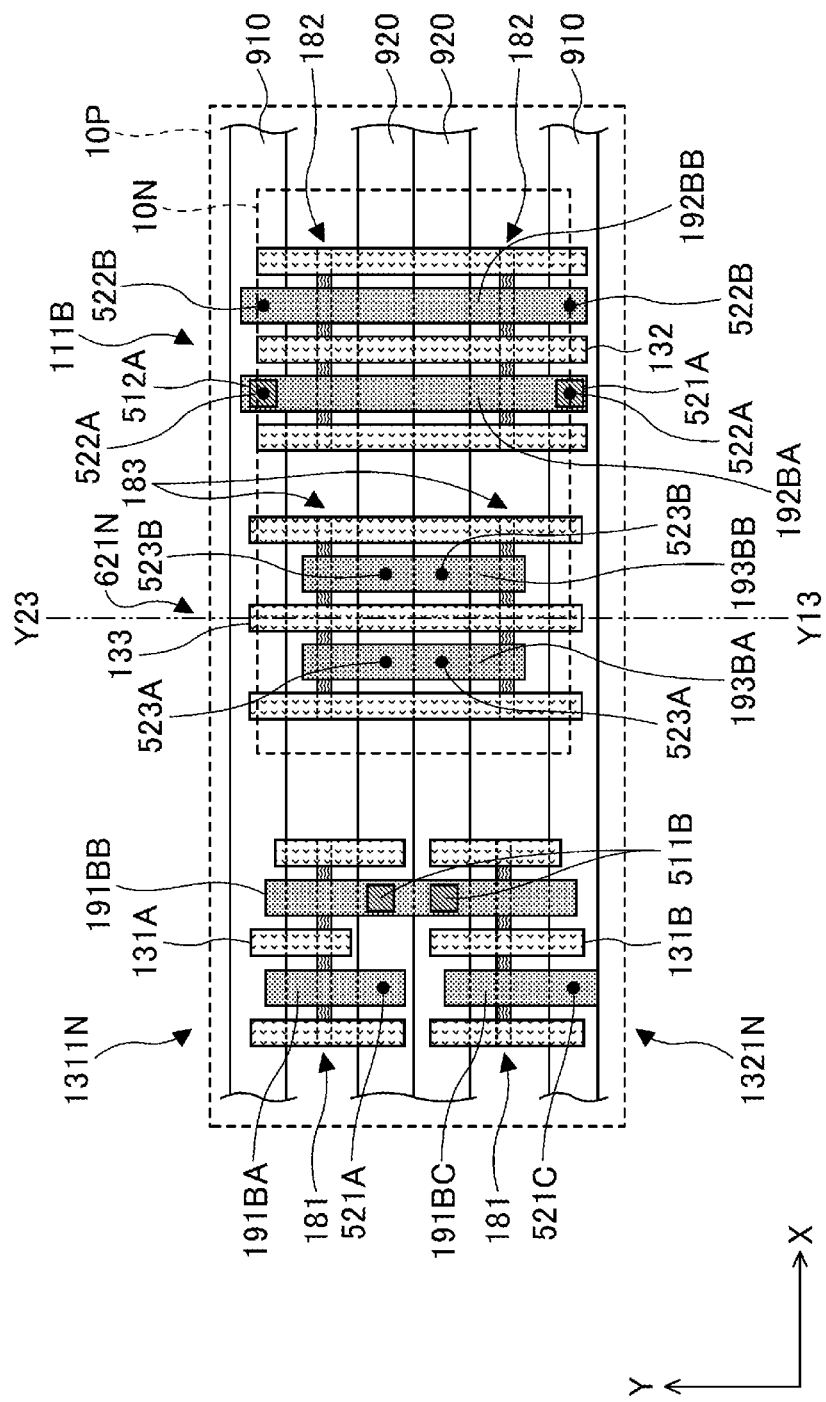
FIG. 17 is a schematic plan view (Part 1) illustrating a configuration of a power supply switch circuit according to a second modification of the second embodiment.
Figure 18:
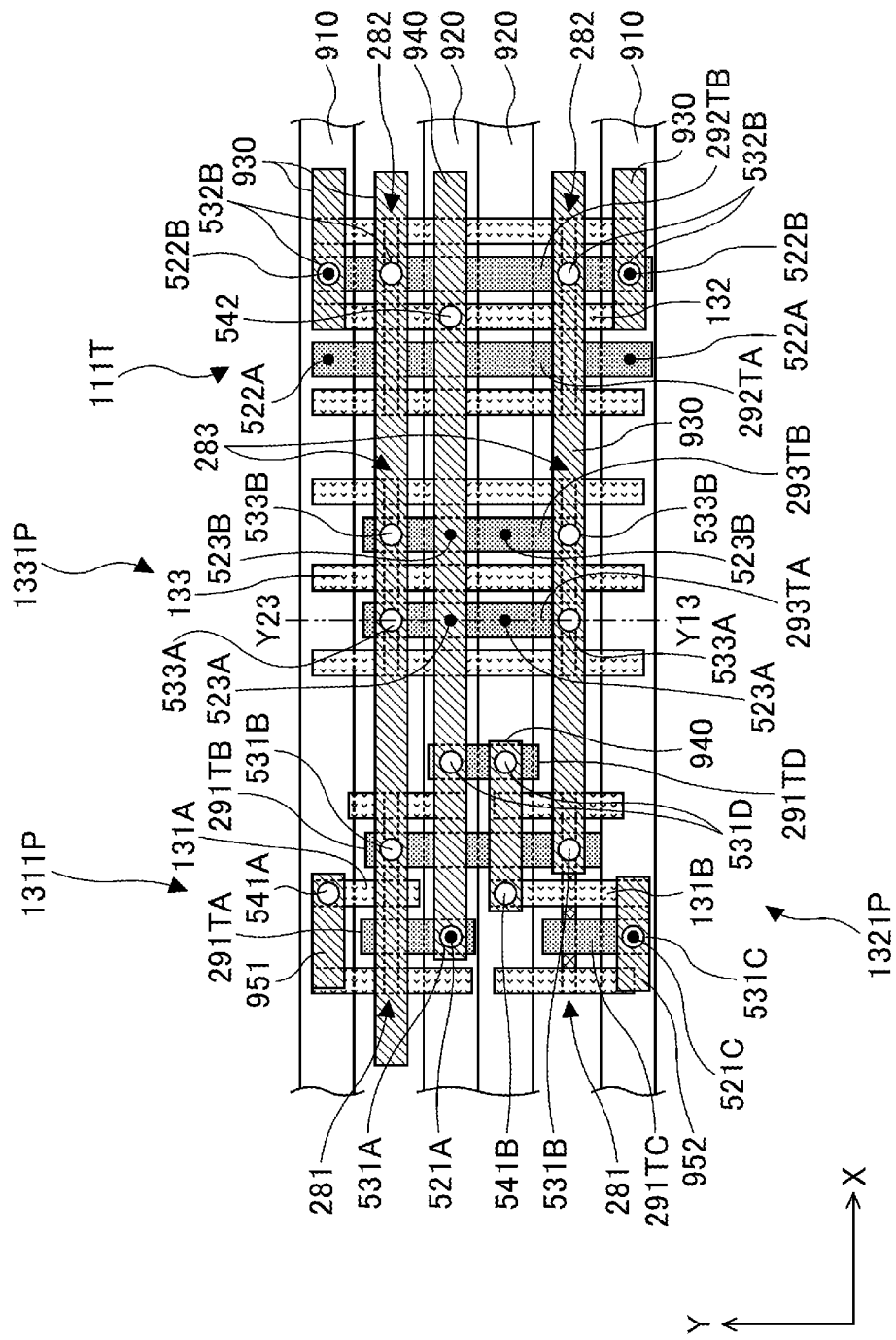
FIG. 18 is a schematic plan view (Part 2) illustrating a configuration of a power supply switch circuit according to a second modification of the second embodiment.
Figure 19:
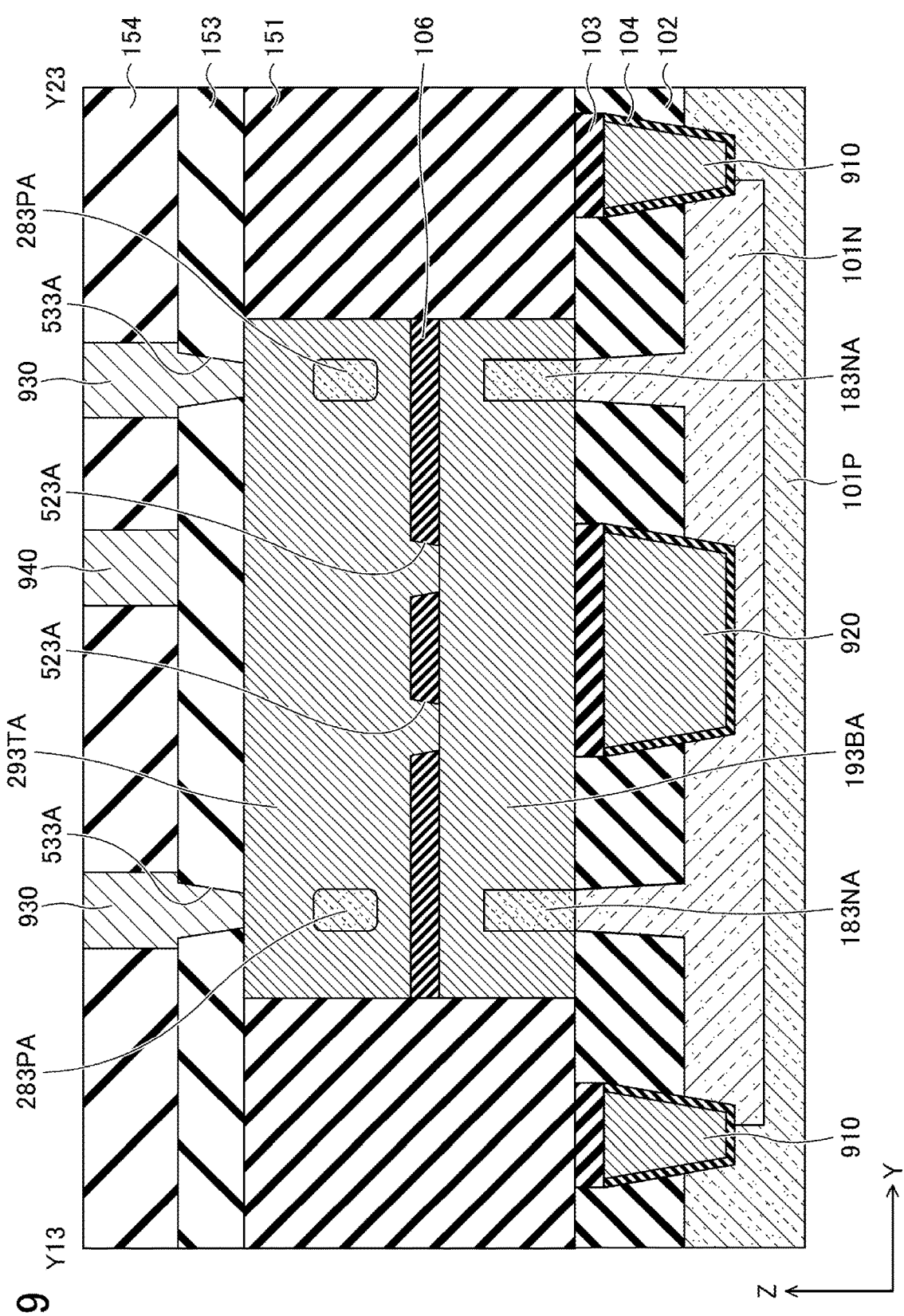
FIG. 19 is a cross-sectional view illustrating a power supply switch circuit according to a second modification of the second embodiment.

Next, a second modification of the second embodiment will be described. The second modification differs from the first modification of the second embodiment in terms of placement of the power supply line 920 and the like. FIGS. 17 and 18 are schematic plan views illustrating configurations of a power supply switch circuit 110 according to the second modification of the second embodiment. FIG. 17 primarily illustrates a layout of N-channel MOS transistors 1311N and 1321N, a P-channel MOS transistor 111B, and a pseudo-transistor structure 621N. FIG. 18 primarily illustrates a layout of P-channel MOS transistors 1311P and 1321P, a P-channel MOS transistor 111T, and a P-channel MOS transistor 1331P. Except for the structures illustrated in both FIGS. 17 and 18, structures illustrated in FIG. 18 are located above the structures illustrated in FIG. 17. FIG. 19 is a cross-sectional view illustrating a power supply switch circuit 110 according to the second modification of the second embodiment. FIG. 19 corresponds to a cross-sectional view cut along the Y13-Y23 line in FIG. 17 and FIG. 18.

In the second modification, the well taps 620N and the switch transistor 111 are also provided with the power supply lines 920. In the well tap 620N, a pair of fins 183 and semiconductor areas 283 are disposed between the power supply lines 910 and the power supply lines 920 in the Y direction. In the switch transistor 111, a pair of fins 182 and semiconductor areas 282 are disposed between the power supply lines 910 and the power supply lines 920 in the Y direction. Contact holes 523A and 523B are located above the power supply lines 920.

Other configurations are similar to the configuration of the first modification.

The second modification can provide the same effect as the second embodiment. According to the second embodiment, the power supply lines 920 are not interrupted, and the arrangement of the power supply lines 910 and 920 is uniform compared to the first modification of the second embodiment. The Y-direction arrangement of the fins 181, 182, and 183 is also uniform as compared to the first modification of the second embodiment. Thus, the variability in manufacturing such as dimensional variability in the power supply lines 910 and 920, and the fins 181, 182 and 183 can be reduced. In other embodiments and modifications, the power supply switch circuit 110 can be a double-height cell, such as a second modification.

In FIG. 19, a power supply line 920 is thicker than a power supply line 910 because two power supply lines 920 are illustrated as one thick power supply line 920 by standardization. If the power supply line 910 contained in the cell adjacent to the power supply switch circuit 110 is adjacent to the power supply line 910 of the power supply switch circuit 110 in the Y direction, these two power supply lines 910 may become a thick power supply line 910 by standardization. The same applies to other embodiments and modifications.

Third Modification of Second Embodiment

Figure 20:
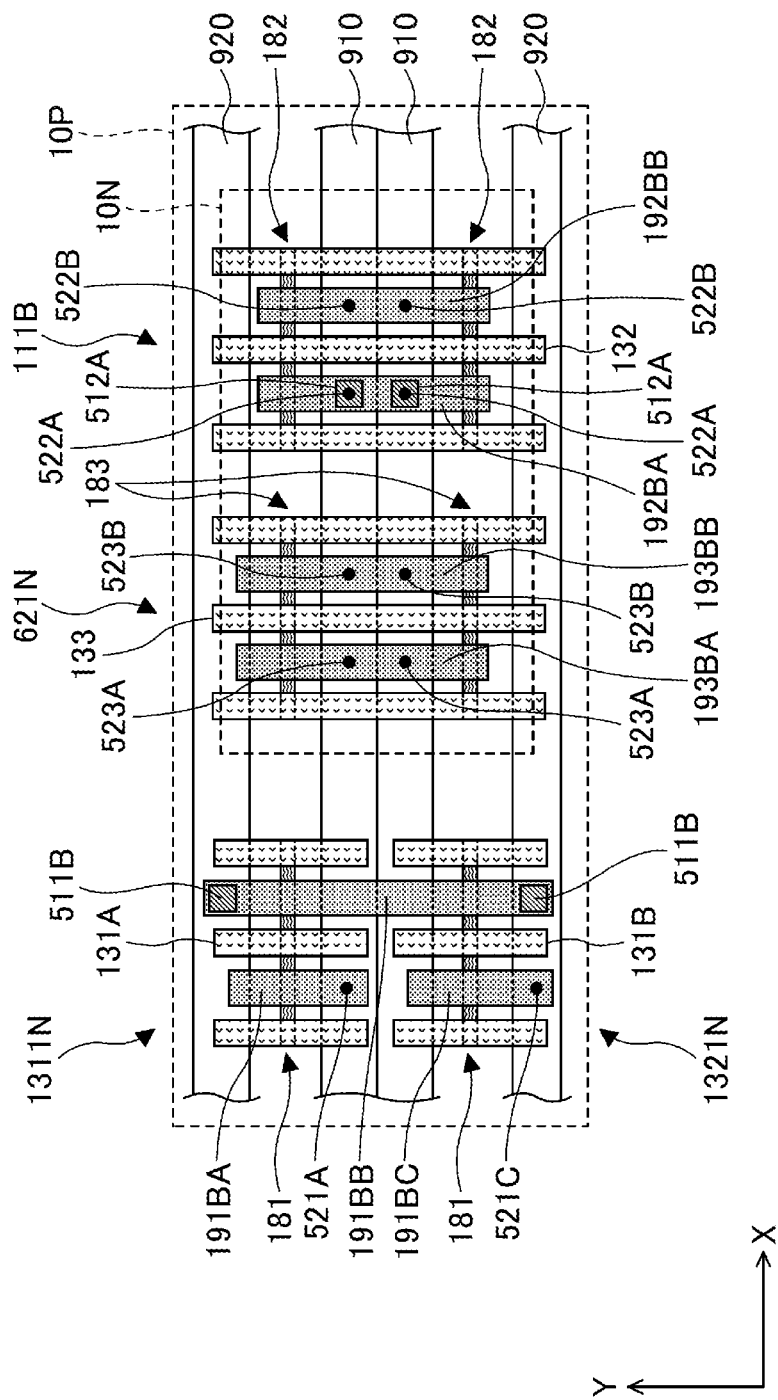
FIG. 20 is a schematic plan view (Part 1) illustrating a configuration of a power supply switch circuit according to a third modification of the second embodiment.
Figure 21:
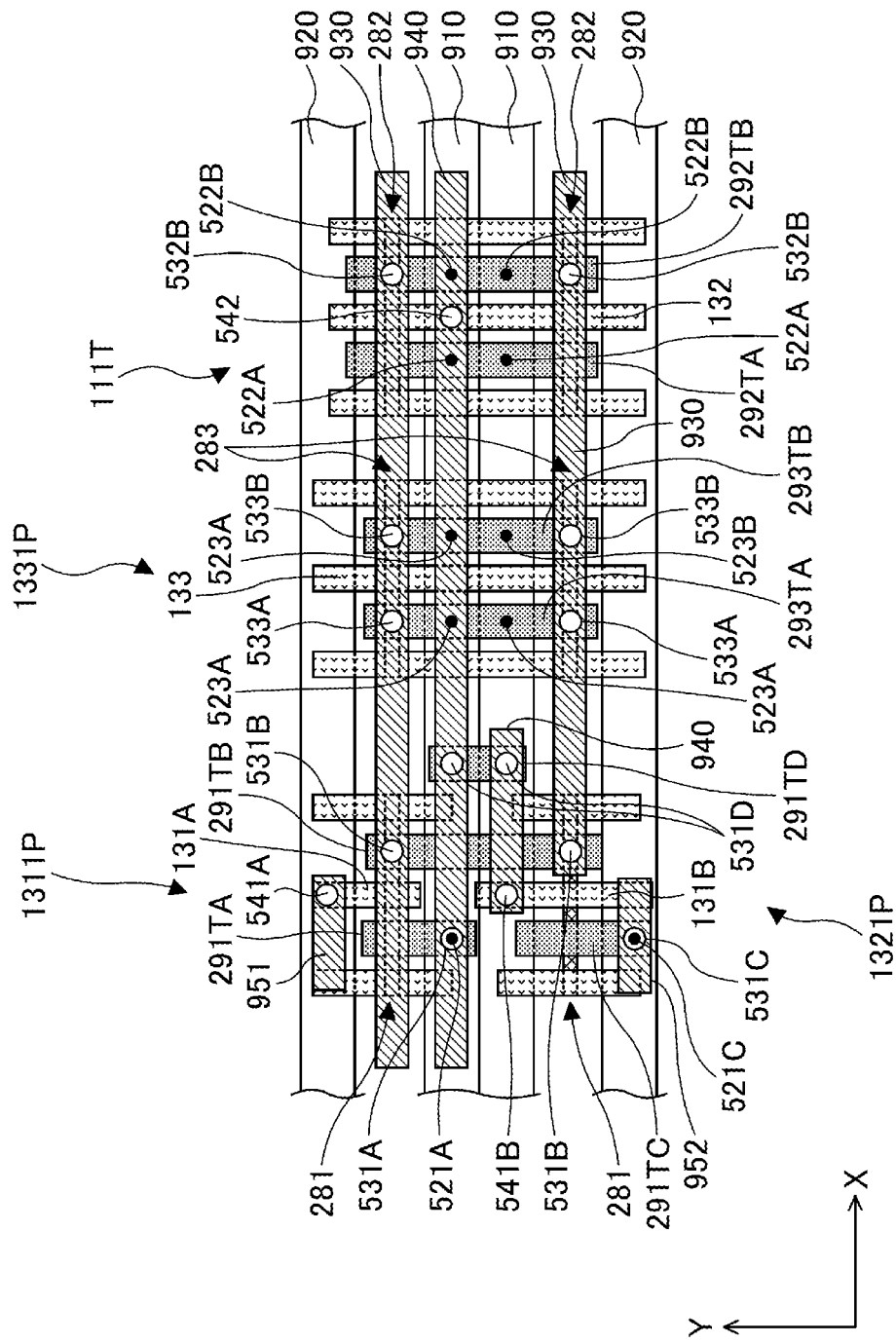
FIG. 21 is a schematic plan view (Part 2) illustrating a configuration of a power supply switch circuit according to a third modification of the second embodiment.

Next, a third modification of the second embodiment will be described. The third modification differs from the second modification of the second embodiment in terms of the positional relationship between the power supply lines 910 and the power supply lines 920. FIGS. 20 and 21 are schematic plan views illustrating configurations of a power supply switch circuit 110 according to the third modification of the second embodiment. FIG. 20 primarily illustrates a layout of N-channel MOS transistors 1311N and 1321N, a P-channel MOS transistor 111B, and a pseudo-transistor structure 621N. FIG. 21 primarily illustrates a layout of P-channel MOS transistors 1311P and 1321P, a P-channel MOS transistor 111T, and a P-channel MOS transistor 1331P. Except for structures illustrated in both FIGS. 20 and 21, structures illustrated in FIG. 21 are located above the structures illustrated in FIG. 20.

According to the third modification, a power supply switch circuit 110 is formed across the two power supply lines 920 located between the power supply lines 910 in the Y direction, as illustrated in FIGS. 20 and 21.

Other configurations are similar to the configuration of the second modification.

The third modification can provide the same effect as the second embodiment. In other embodiments and modifications, the power supply switch circuit 110 can be a double height cell, such as a third modification.

Fourth Modification of Second Embodiment

Figure 22:
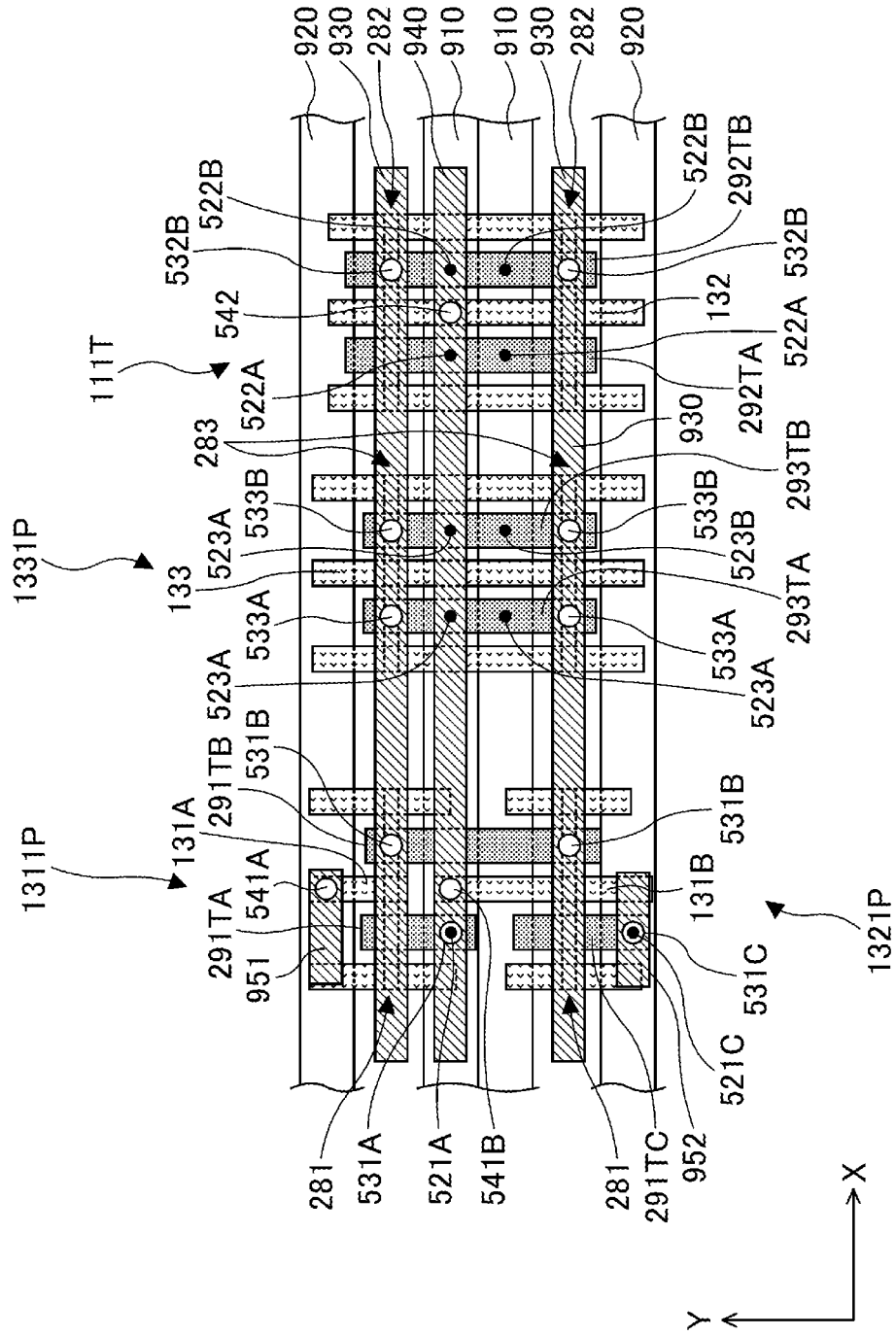
FIG. 22 is a schematic plan view illustrating a configuration of a power supply switch circuit according to a fourth modification of the second embodiment.

Next, a fourth modification of the second embodiment will be described. The fourth modification differs from the third modification of the second embodiment in terms of the configuration of the power supply switch control circuit 113. FIG. 22 is a schematic plan view illustrating a configuration of the power supply switch circuit 110 according to the fourth modification of the second embodiment. FIG. 22 primarily illustrates a layout of the P-channel MOS transistors 1311P and 1321P, the P-channel MOS transistor 111T, and the P-channel MOS transistor 1331P.

According to the fourth modification, as illustrated in FIG. 22, a gate electrode 131B extends to the P-channel MOS transistor 1311P side beneath the control signal line 940. Then, a contact hole 541B is formed in the insulating film 153 between the control signal line 940 and the gate electrode 131B, and the control signal line 940 is connected to the gate electrode 131B through an electrical conductor in the contact hole 541B.

Other configurations are similar to the configuration of the third modification.

The fourth modification can provide the same effect as the second embodiment. In the first and second modifications of the second embodiment, the power supply switch control circuit 113 may have the same configuration as the fourth modification.

Figure 23:
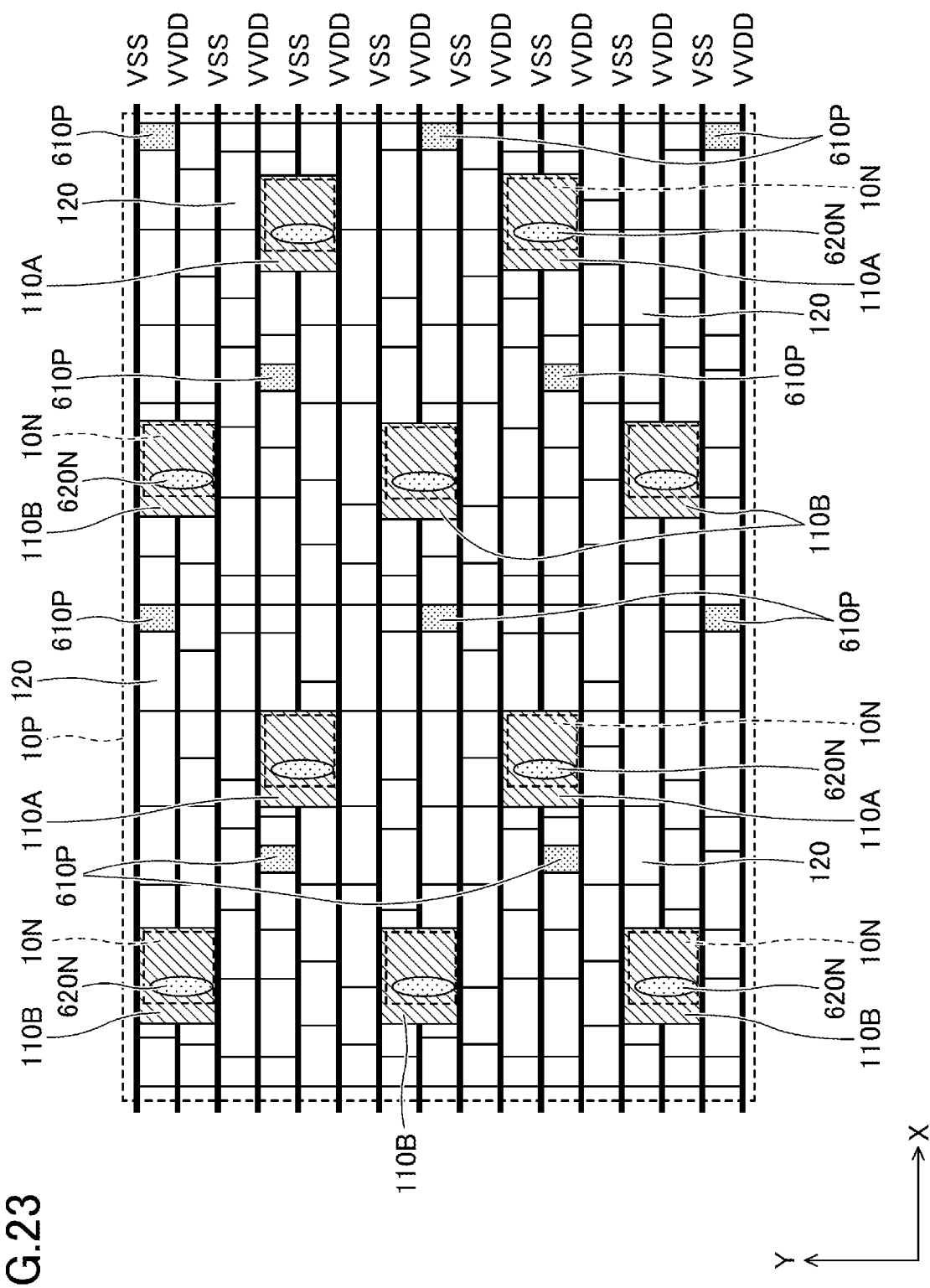
FIG. 23 is a schematic view illustrating an example of a configuration of a standard cell area.

FIG. 23 is a schematic view illustrating an example of a configuration of a standard cell area. In FIG. 23, as power supply switch circuits included in the power supply switch circuit 110, a power supply switch circuit 110A formed across two cells sharing a VSS line and a power supply switch circuit 110B formed across two cells sharing a VVDD line may both be present. The power supply switch circuit 110A is, for example, a power supply switch circuit included in the first and second reference examples of the second embodiment. The power supply switch circuit 110B is, for example, a power supply switch circuit included in the third and fourth reference examples of the second embodiment.

Fifth Modification of Second Embodiment

Figure 24:
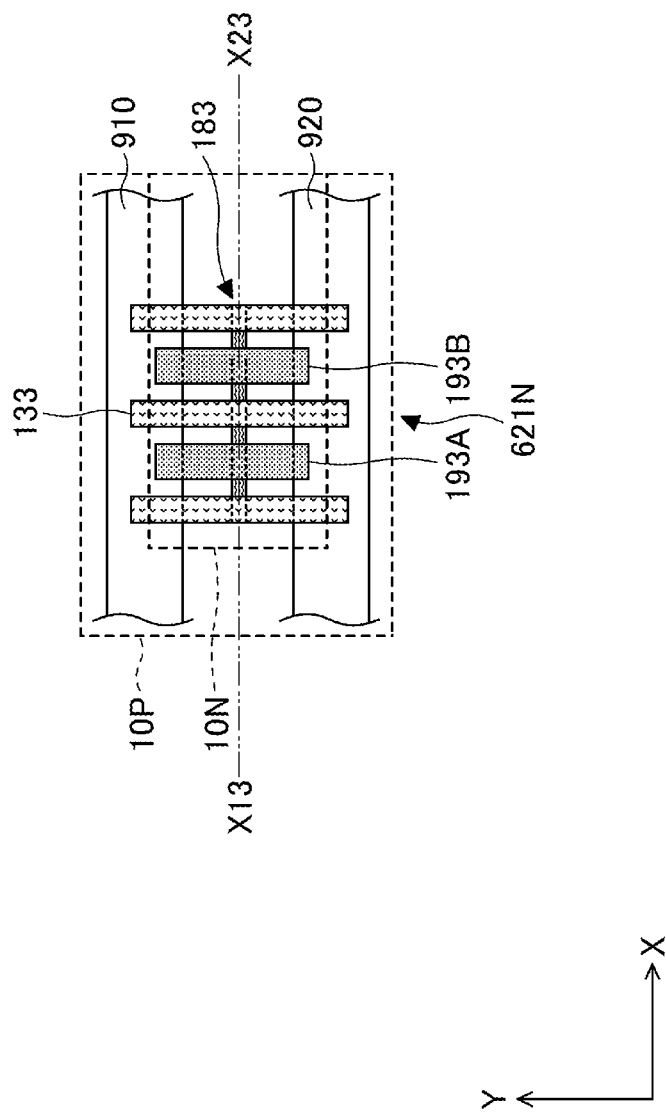
FIG. 24 is a schematic plan view (Part 1) illustrating a configuration of a well tap according to a fifth modification of the second embodiment.
Figure 25:
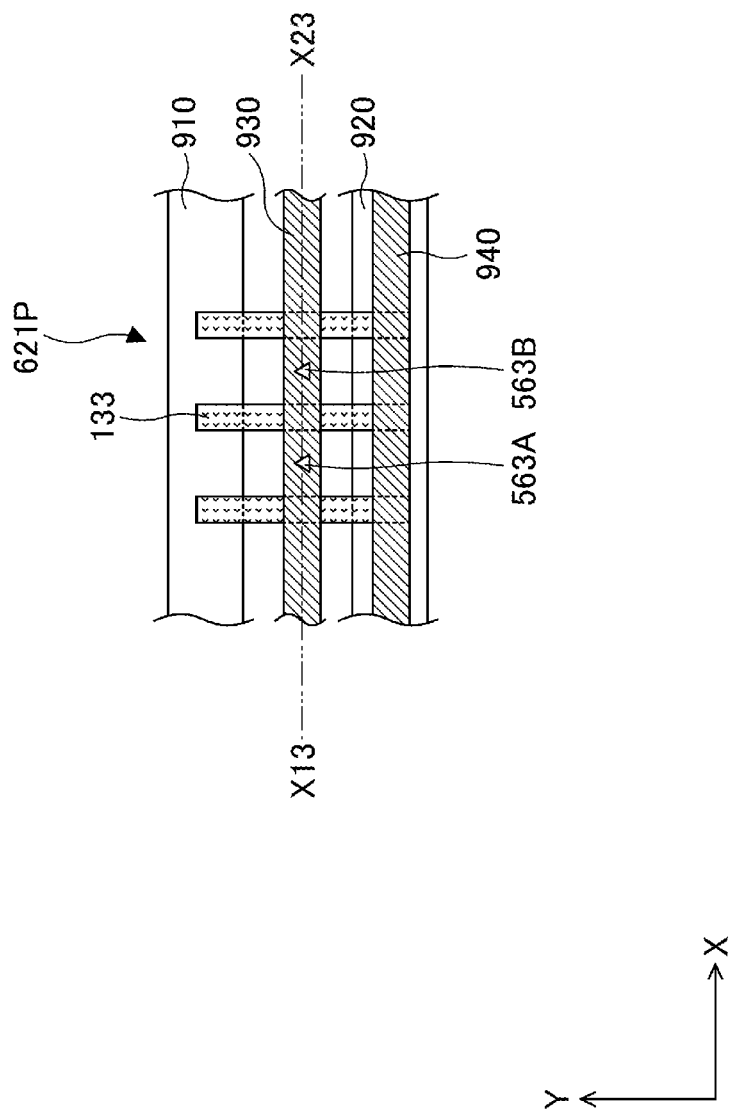
FIG. 25 is a schematic plan view (Part 2) illustrating a configuration of a well tap according to a fifth modification of the second embodiment.
Figure 26:
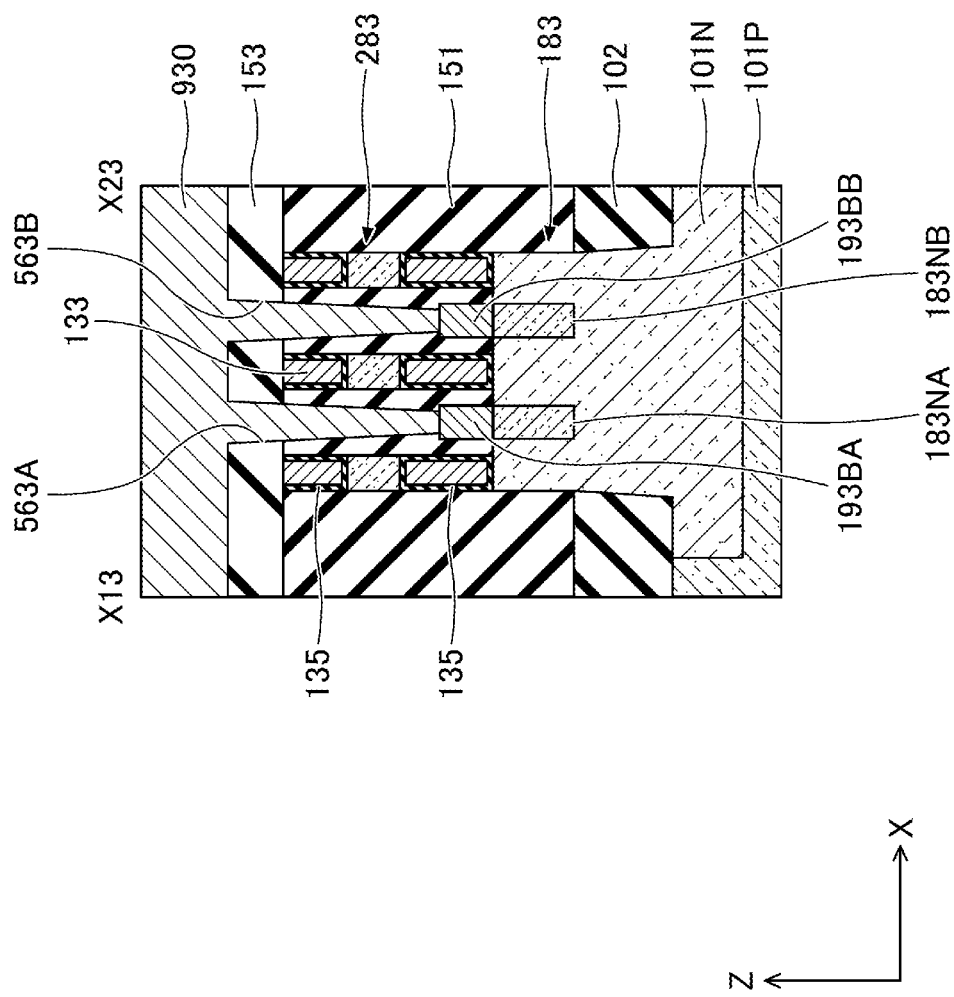
FIG. 26 is a cross-sectional view illustrating a well tap in a fifth modification of the second embodiment.

Next, a fifth modification of the second embodiment will be described. The fifth modification differs from the second embodiment in terms of the configuration of the well tap 620N. That is, the P-channel MOS transistor 1331P is replaced by a pseudo-transistor structure 621P, which is obtained by removing the source and the drain of the P-channel MOS transistor 1331P. FIGS. 24 and 25 are schematic plan views illustrating configurations of a well tap 620N according to the fifth modification of the second embodiment. FIG. 24 primarily illustrates a layout of a pseudo-transistor structure 621 N. FIG. 25 primarily illustrates a layout of a pseudo-transistor structure 621P. Except for the structures illustrated in both FIGS. 25 and 24, structures illustrated in FIG. 25 are located above the structures illustrated in FIG. 24. FIG. 26 is a cross-sectional view illustrating the well tap 620N according to the fifth modification of the second embodiment. FIG. 26 corresponds to a cross-sectional view cut along the X13-X23 line in FIGS. 24 and 25.

According to the fifth modification, the local conductive traces 293TA and 293TB and the P-type areas 283PA and 283PB are not formed, as illustrated in FIGS. 24 to 26. A contact hole 563A extending to the local conductive trace 193BA and a contact hole 563B extending to the local conductive trace 193BB are formed in the insulating films 153 and 151 above the fins 183. The power supply line 930 is connected to the local conductive trace 193BA through an electrical conductor in the contact hole 563A, and is also connected to the local conductive trace 193BB through an electrical conductor in the contact hole 563B.

After forming the local conductive traces 293TA and 293TB and the P-type areas 283PA and 283PB in the forming process, the local conductive traces 293TA and 293TB, and the P-type areas 283PA and 283PB may be removed. In other embodiments and modifications, the power supply line 930 may be in direct contact with the local conductive traces 193BA and 193BB.

Third Embodiment

Figure 27:
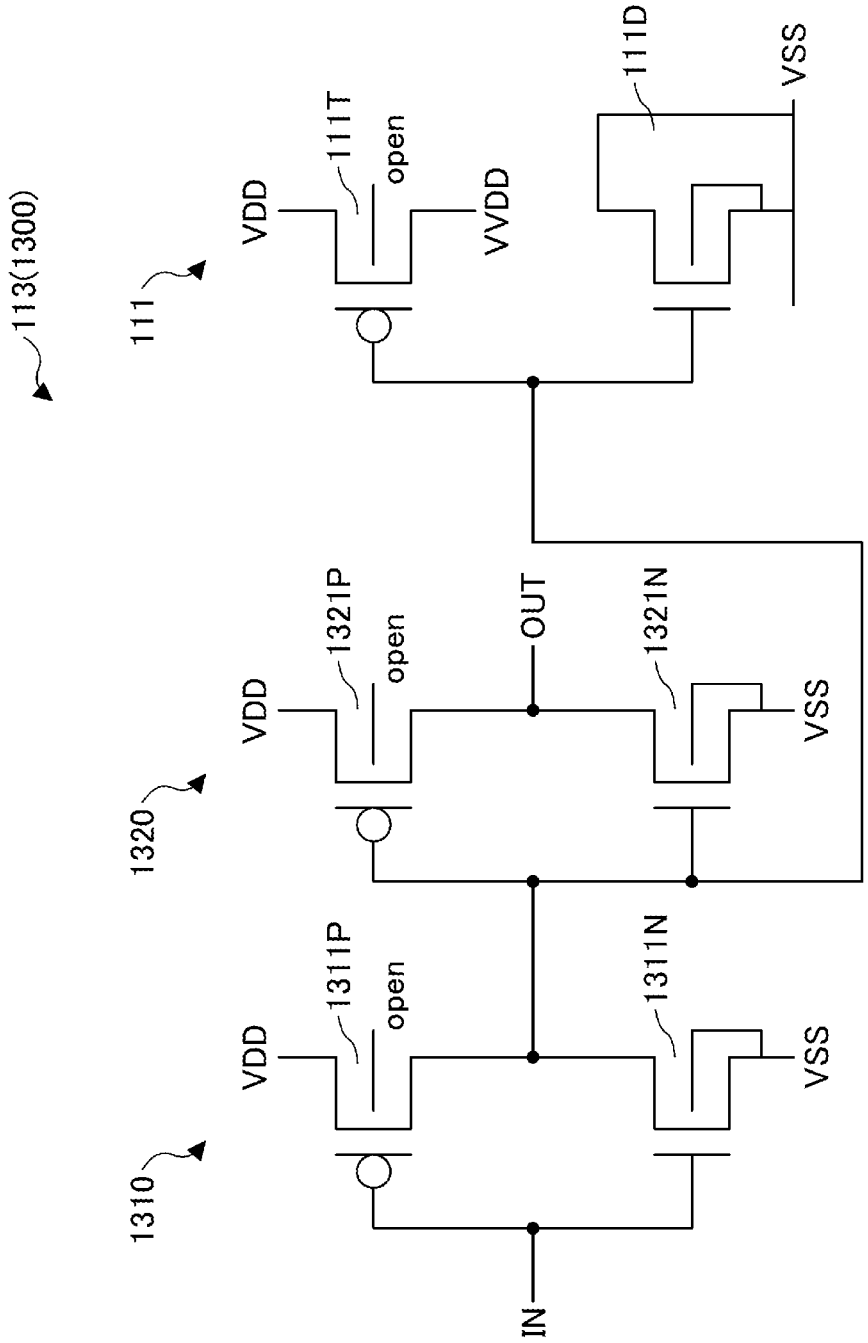
FIG. 27 is a circuit diagram illustrating the configuration of a buffer and a switch transistor in a third embodiment.

Next, a third embodiment will be described. The third embodiment differs from the second embodiment in the configuration of the power supply switch circuit 110. FIG. 27 is a circuit diagram illustrating a configuration of a buffer and a switch transistor according to the third embodiment.

As illustrated in FIG. 27, the power supply switch control circuit 113 has a configuration similar to the second embodiment. The switch transistor 111 includes a pseudo-transistor structure 111D instead of the P-channel MOS transistor 111B. The pseudo-transistor structure 111D is configured to include the source and the drain of the N-channel MOS transistor that are connected to the VSS line. A P-channel MOS transistor 111T is formed on the pseudo-transistor structure 111D.

Figure 28:
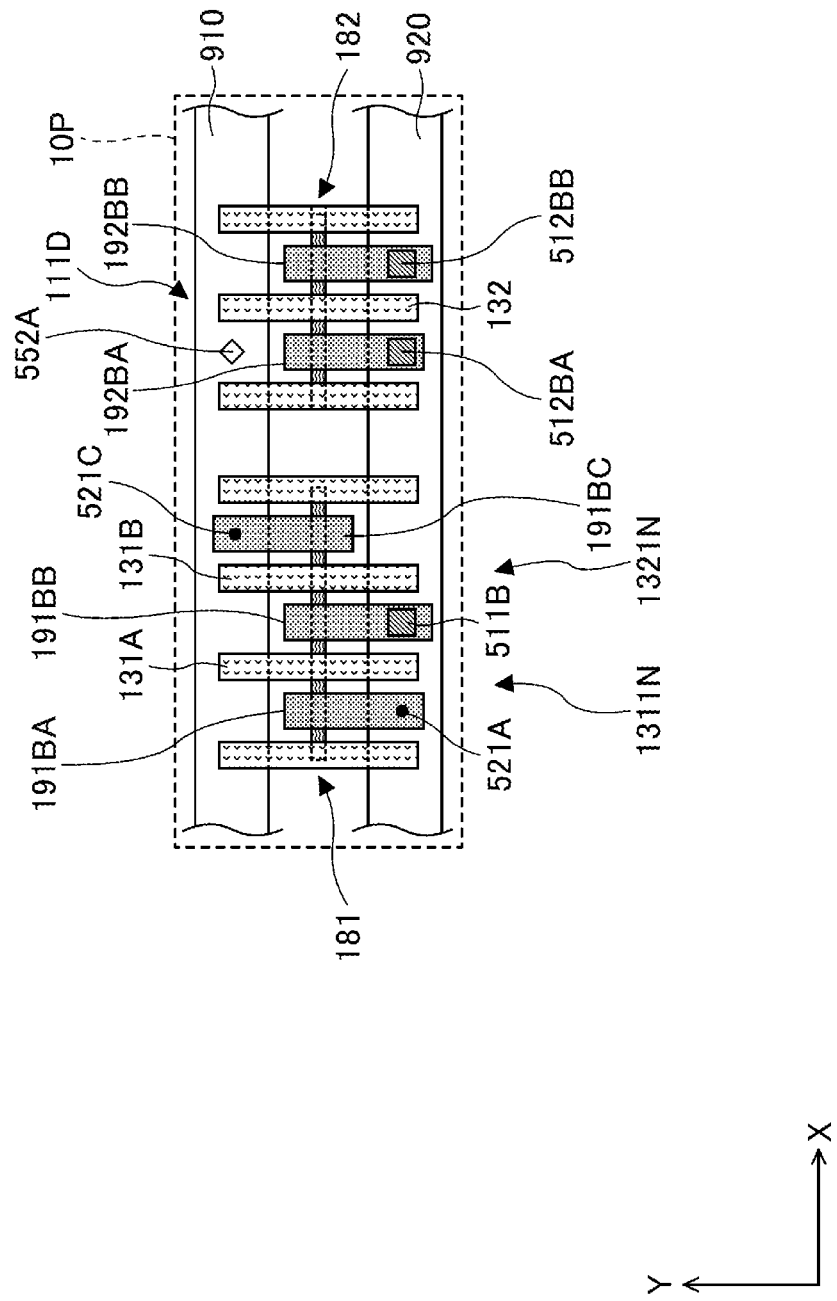
FIG. 28 is a schematic view (first diagram) illustrating the planar configuration of the power supply switch circuit according to the third embodiment.
Figure 29:
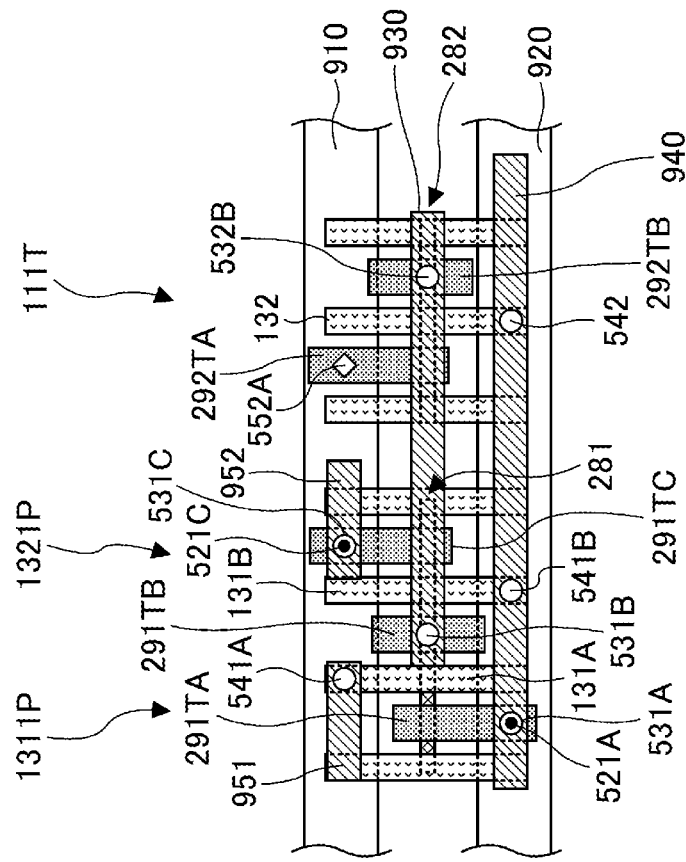
FIG. 29 is a schematic plan view (Part 2) illustrating a configuration of a power supply switch circuit according to the third embodiment.

FIGS. 28 and 29 are schematic plan views illustrating configurations of a power supply switch circuit 110 according to the third embodiment. FIG. 28 primarily illustrates a layout of N-channel MOS transistors 1311N and 1321N and a pseudo-transistor structure 111D. FIG. 29 primarily illustrates a layout of P-channel MOS transistors 1311P and 1321P, and a P-channel MOS transistor 111T. Except for the structures illustrated in both FIGS. 28 and 29, structures illustrated in FIG. 29 are located above the structures illustrated in FIG. 28.

As illustrated in FIGS. 28 and 29, according to the third embodiment, the power supply switch circuit 110 is also disposed in the P-type area 10P. The VSS potential is supplied from the well tap 610P to the P-type area 10P. The power supply switch control circuit 113 has the same configuration as the second embodiment.

In the switch transistor 111, the local conductive trace 192BA extends from the P-type area 182PA to above the power supply line 920. A contact hole 512A is formed in the insulating film 103 between the local conductive trace 192BA and the power supply line 920, and the local conductive trace 192BA is connected to the power supply line 920 through an electrical conductor in the contact hole 512A. The local conductive trace 192BA electrically connects the power supply line 920 to the P-type area 182PA. A contact hole 512B is formed in the insulating film 103 between the local conductive trace 192BB and the power supply line 920, and the local conductive trace 192BB is connected to the power supply line 920 through a conductor in the contact hole 512B. The local conductive trace 192BB electrically connects the power supply line 920 to the P-type area 182PB.

A contact hole 552A is formed in the insulating films 151 and 103 between the local conductive trace 292TA and the power supply line 910 above the power supply line 910. The local conductive trace 292TA and the power supply line 910 are electrically connected to each other through a conductor in the contact hole 552A. The local conductive trace 292TA electrically connects the power supply line 910 to the P-type area 282PA.

No contact holes are formed in the insulating film 106 between the local conductive trace 292TA and the local conductive trace 192BA. Thus, the local conductive trace 292TA and the local conductive trace 192BA are electrically isolated from each other. Further, there is no contact hole formed in the insulating film 106 between the local conductive trace 292TB and the local conductive trace 192BB. Thus, the local conductive trace 292TB and the local conductive trace 192BB are electrically isolated from each other.

Figure 30:
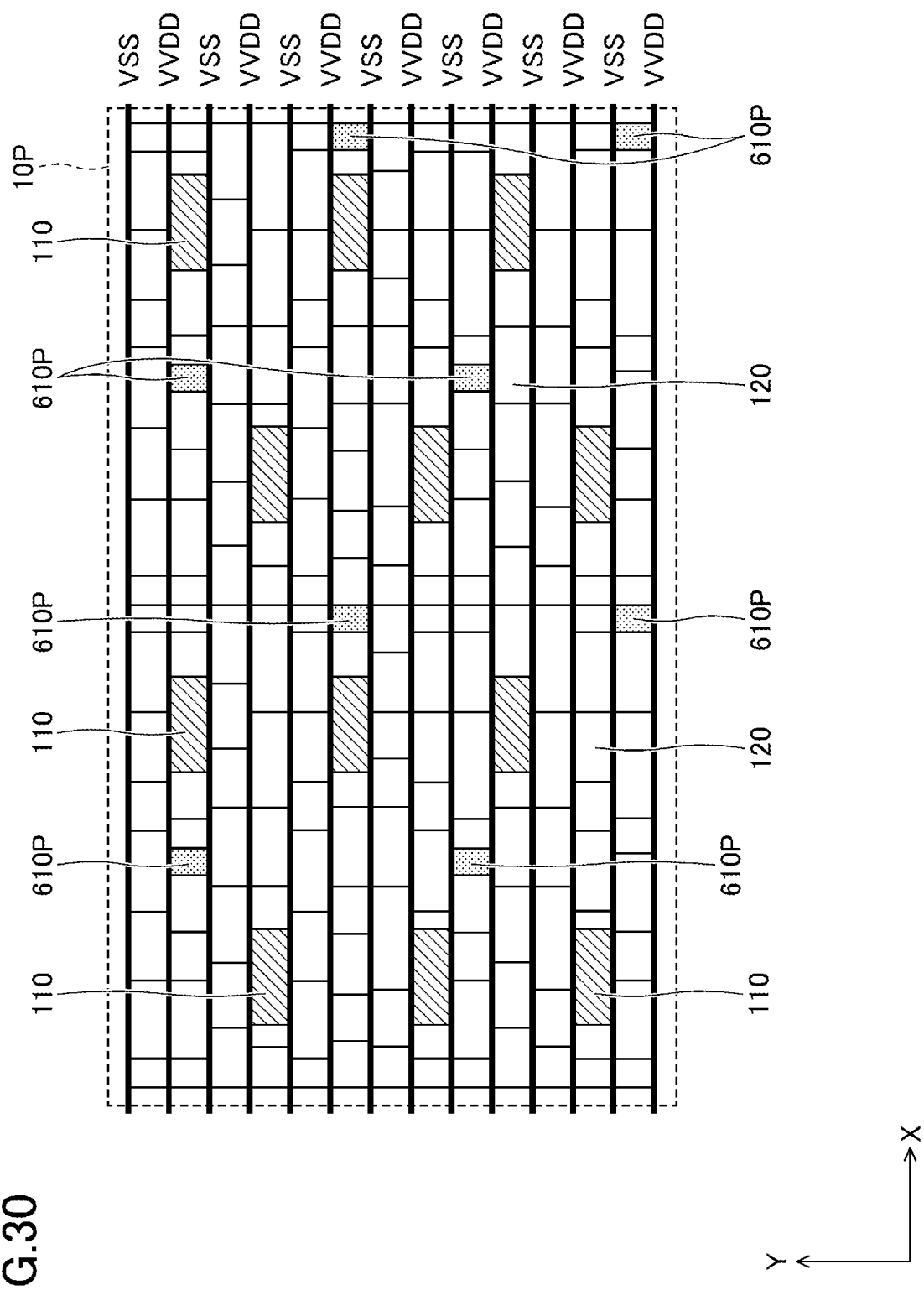
FIG. 30 is a schematic view illustrating a configuration of a standard cell area included in a semiconductor device according to a third embodiment.

FIG. 30 is a schematic view illustrating a configuration of a standard cell area included in a semiconductor device according to the third embodiment. As illustrated in FIG. 30, well taps 610P and power supply switch circuits 110 are disposed in the P-type area 10P. The VSS potential is supplied from the well tap 610P to the back gate of the N-channel MOS transistor 1341N of the standard cell 120. The VSS potential is also supplied from the well tap 610P to the back gates of the N-channel MOS transistors 1311N and 1321N of the power supply switch control circuit 113. In this example, three nearest neighboring well taps 610P are preferably arranged in a triangular lattice, and preferably arranged to form an equilateral triangle in a plan view.

According to the third embodiment, the VSS potential is supplied through the well taps 610P to the back gate of the N-channel MOS transistors 1311N and 1321N. The VSS potential is also supplied to an area that does not operate but corresponds to the back gate of the pseudo-transistor structure 111D.

Thus, according to the third embodiment, there is no N-well in the P-type area 10P, and no area is required to isolate the P-well and the N-well from each other. Also, a well tap for supplying power to N wells is not required. Thus, according to the third embodiment, the circuit area can be further reduced.

First Modification of Third Embodiment

Figure 31:
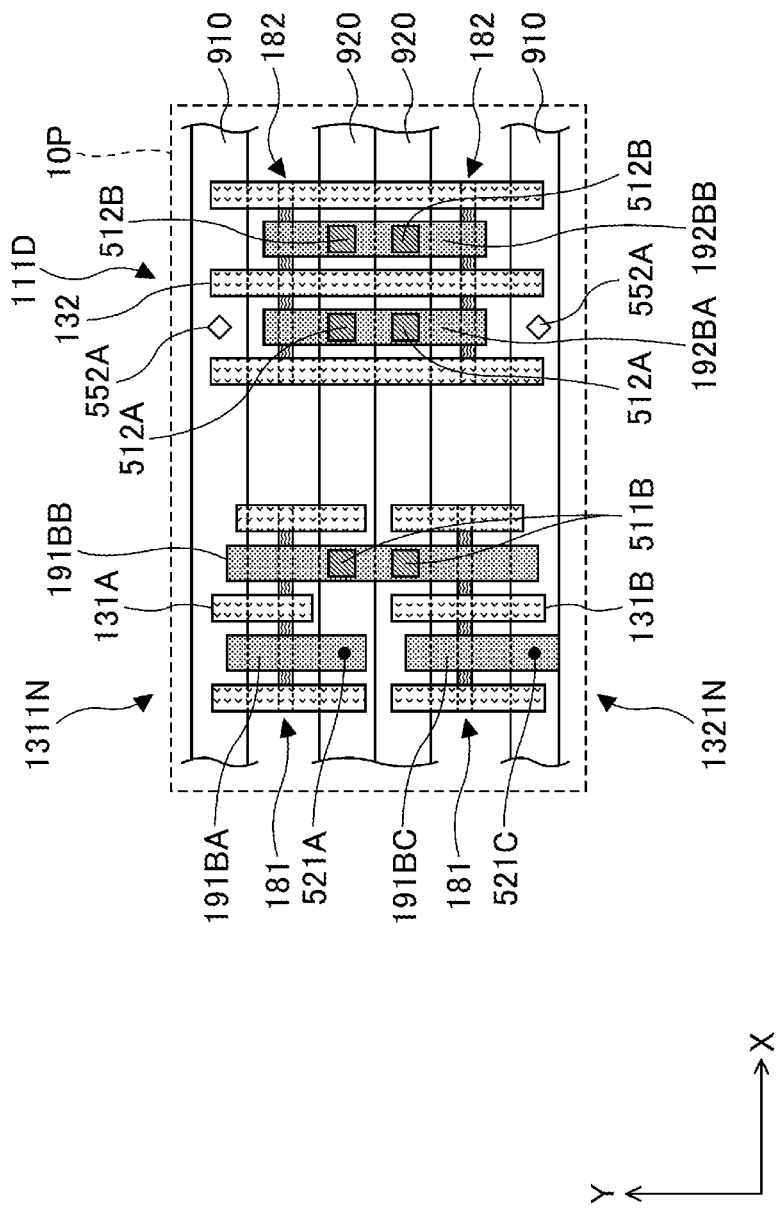
FIG. 31 is a schematic plan view (Part 1) illustrating a configuration of a power supply switch circuit according to a first modification of the third embodiment.
Figure 32:
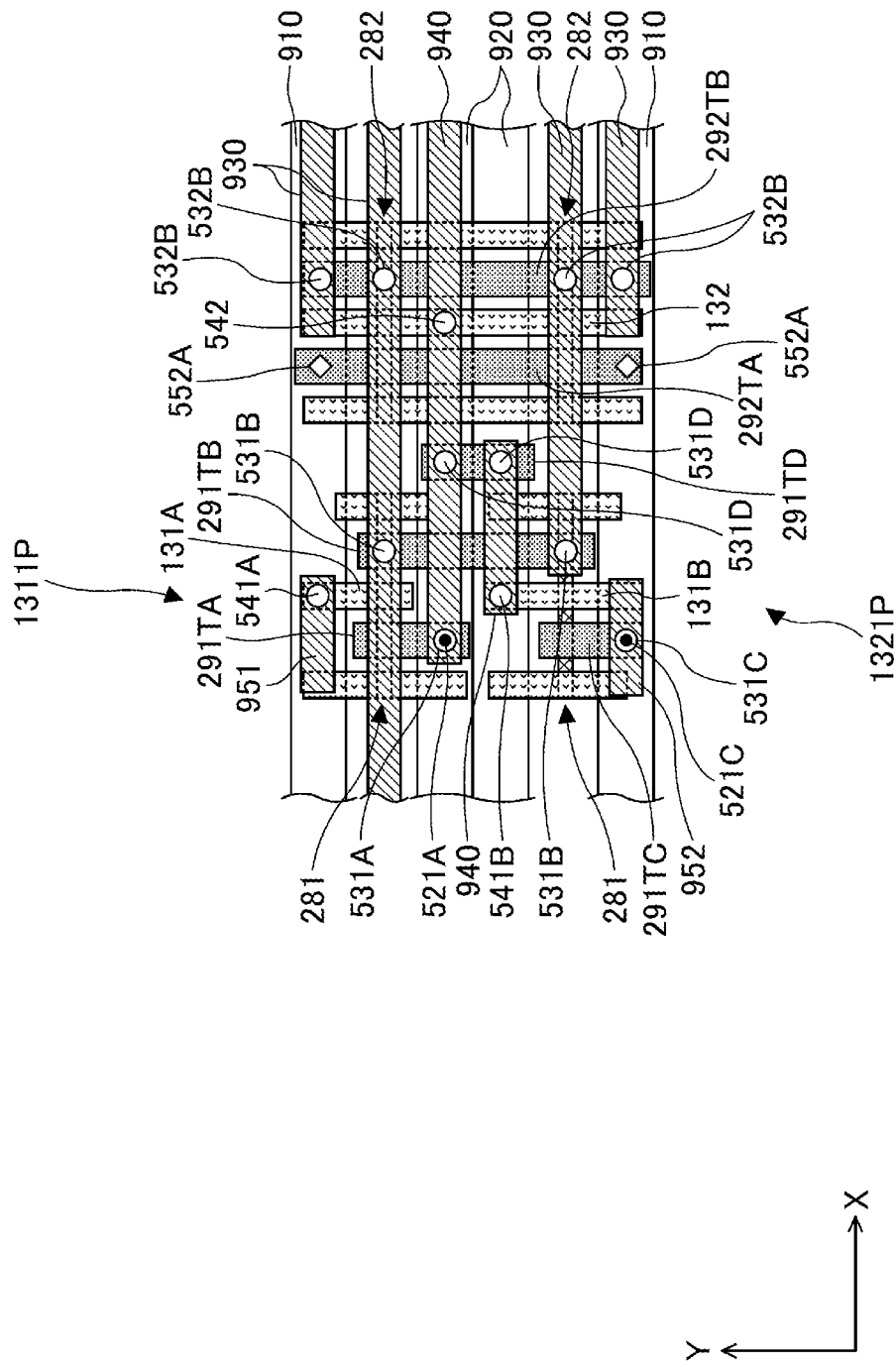
FIG. 32 is a schematic view (Part 2) illustrating the planar configuration of the power supply switch circuit according to the first modification of the third embodiment.

Next, a first modification of the third embodiment will be described. The first modification differs from the third embodiment in height of the cell. FIGS. 31 and 32 are schematic plan views illustrating configurations of a power supply switch circuit 110 according to the first modification of the third embodiment. FIG. 31 primarily illustrates a layout of N-channel MOS transistors 1311N and 1321N and a pseudo-transistor structure 111D. FIG. 32 primarily illustrates a layout of P-channel MOS transistors 1311P and 1321P, and a P-channel MOS transistor 111T. Except for the structures illustrated in both FIGS. 31 and 32, structures illustrated in FIG. 32 are located above the structures illustrated in FIG. 31.

According to the first modification, the power supply switch circuit 110 is a double-height cell, as illustrated in FIGS. 31 and 32. That is, the power supply switch circuit 110 is formed across the two power supply lines 910 located between the power supply lines 920 in the Y direction. The N-channel MOS transistor 1311N and the N-channel MOS transistor 1321N are adjacently disposed in the Y direction, and the P-channel MOS transistor 1311P and the P-channel MOS transistor 1321P are adjacently disposed in the Y direction. A control signal line 940 is disposed above the power supply line 920, and a power supply line 930 is disposed above the power supply line 910 and the power supply line 920 in the Y direction.

The power supply switch control circuit 113 has the same configuration as the second modification of the second embodiment.

With respect to the switch transistor 111, a pair of a fin 182 and a semiconductor area 282 is disposed, for example, between one pair of a power supply line 910 and a power supply line 920, and another pair of a fin 182 and a semiconductor area 282 is disposed, for example, between the other pair of a power supply line 910 and a power supply line 920.

Other configurations are similar to the configuration of the third embodiment.

The first modification provides the same effect as the third embodiment.

Second Modification of Third Embodiment

Figure 33:
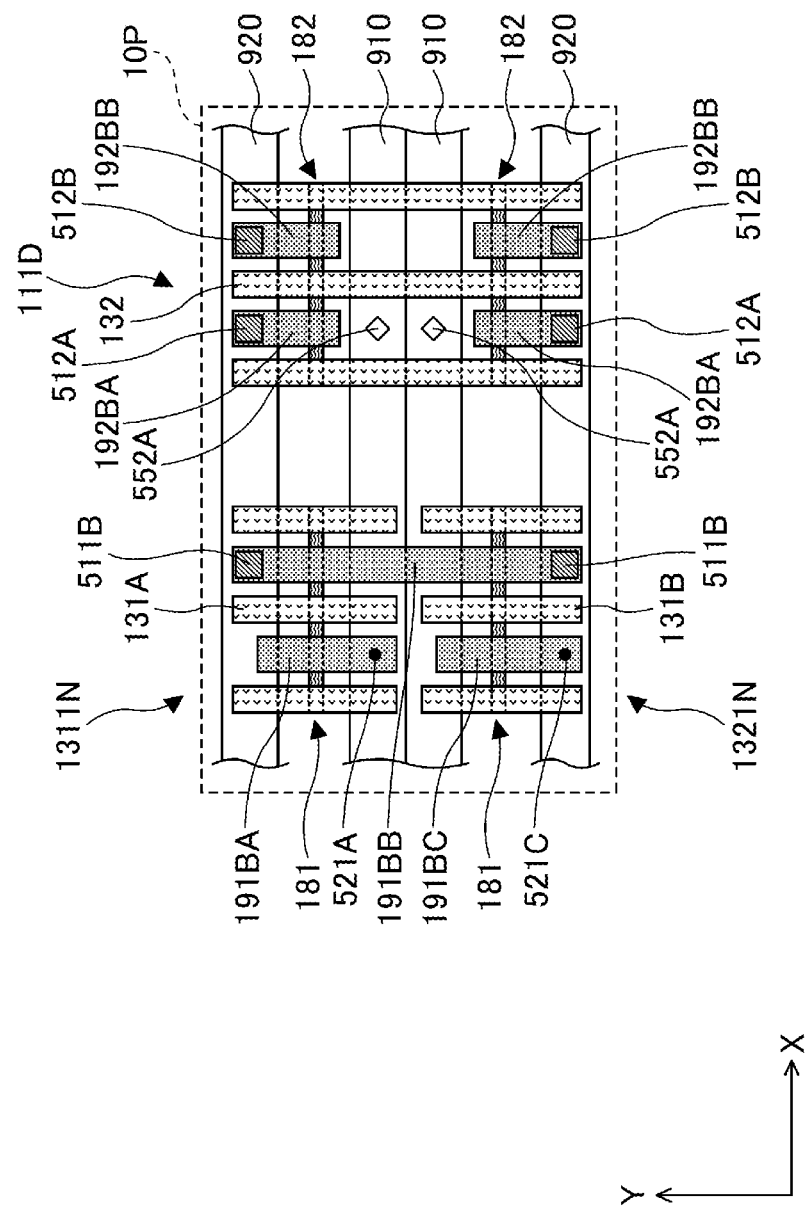
FIG. 33 is a schematic view (Part 1) illustrating a planar configuration of a power supply switch circuit according to a second modification of the third embodiment.
Figure 34:
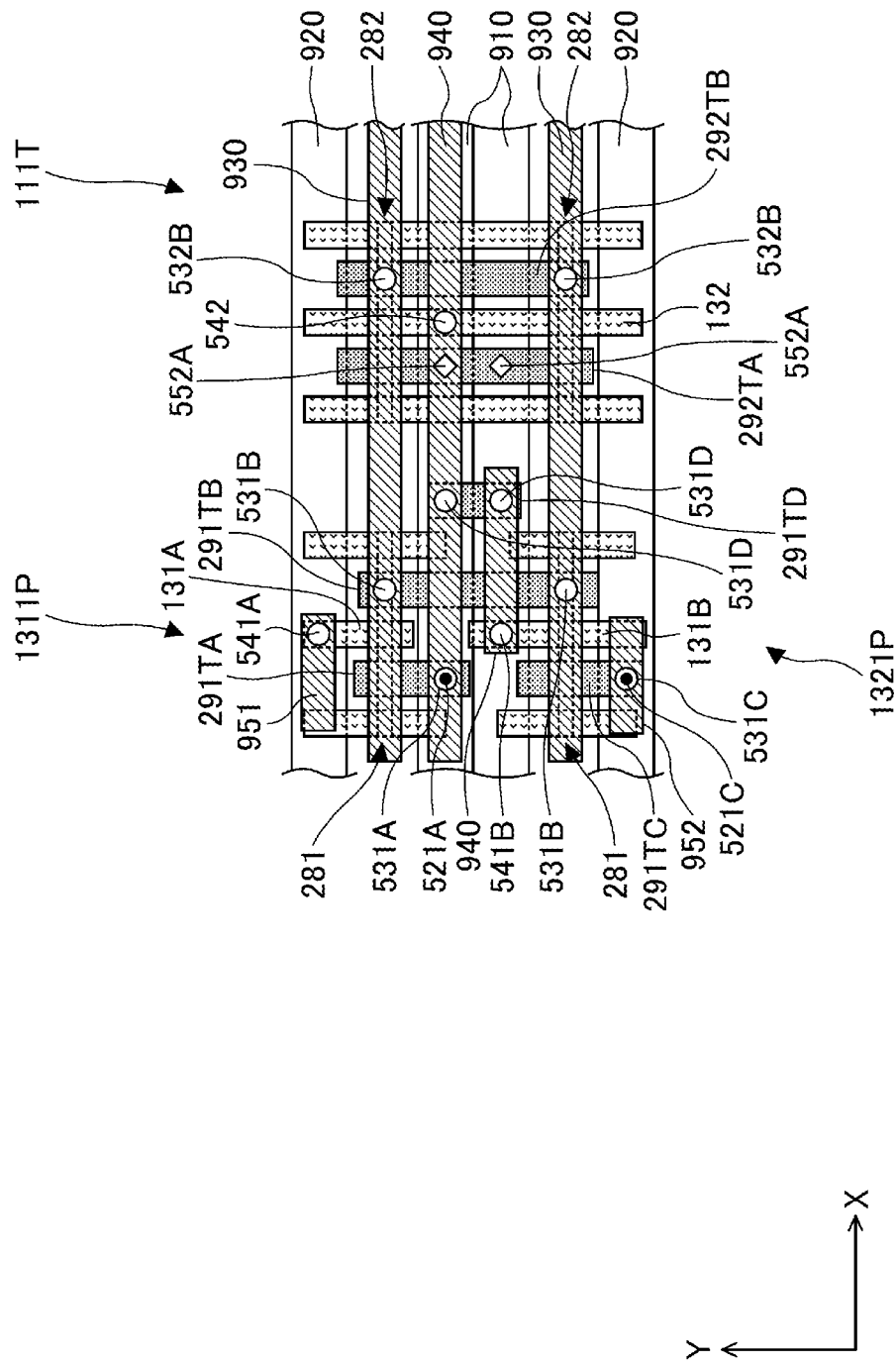
FIG. 34 is a schematic view (Part 2) illustrating the planar configuration of the power supply switch circuit according to the second modification of the third embodiment.

Next, a second modification of the third embodiment will be described. The second modification differs from the first modification of the third embodiment in terms of a positional relationship between the power supply line 910 and the power supply line 920, and the like. FIGS. 33 and 34 are schematic plan views illustrating configurations of a power supply switch circuit 110 according to the second modification of the third embodiment. FIG. 33 primarily illustrates a layout of N-channel MOS transistors 1311N and 1321N, and a pseudo-transistor structure 111D. FIG. 34 primarily illustrates a layout of P-channel MOS transistors 1311P and 1321P, and a P-channel MOS transistor 111T. Except for the structures illustrated in both FIGS. 33 and 34, structures illustrated in FIG. 34 are located above the structures illustrated in FIG. 33.

According to the second modification, as illustrated in FIGS. 33 and 34, a power supply switch circuit 110 is formed across two adjacent cells of the power supply line 910 in the Y direction. That is, two power supply lines 910 are located so as to be in contact with each other between the two power supply lines 920 in the Y direction.

Other configurations are similar to the configuration of the first modification.

The second modification provides the same effect as the first modification.

Third Modification of Third Embodiment

Figure 35:
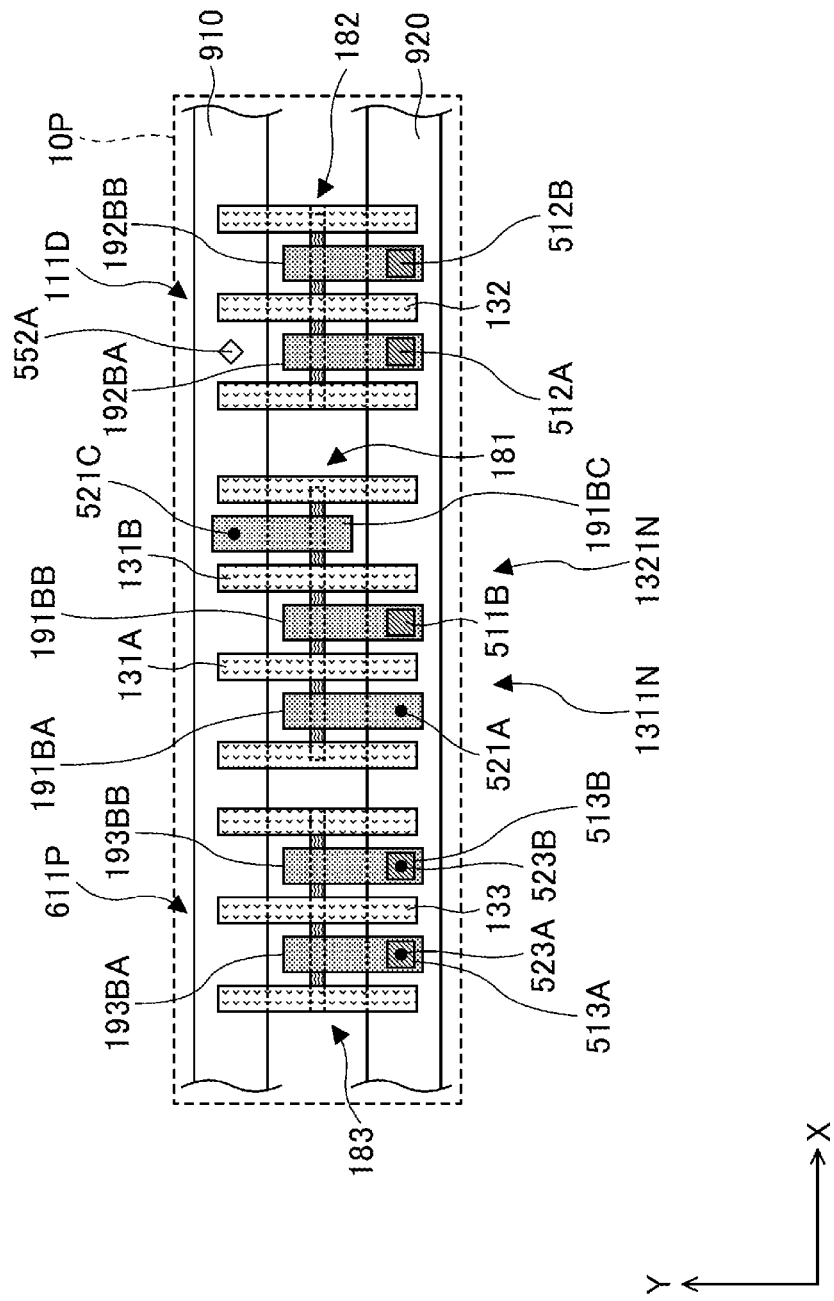
FIG. 35 is a schematic plan view (Part 1) illustrating a configuration of a power supply switch circuit according to a third modification of the third embodiment.
Figure 36:
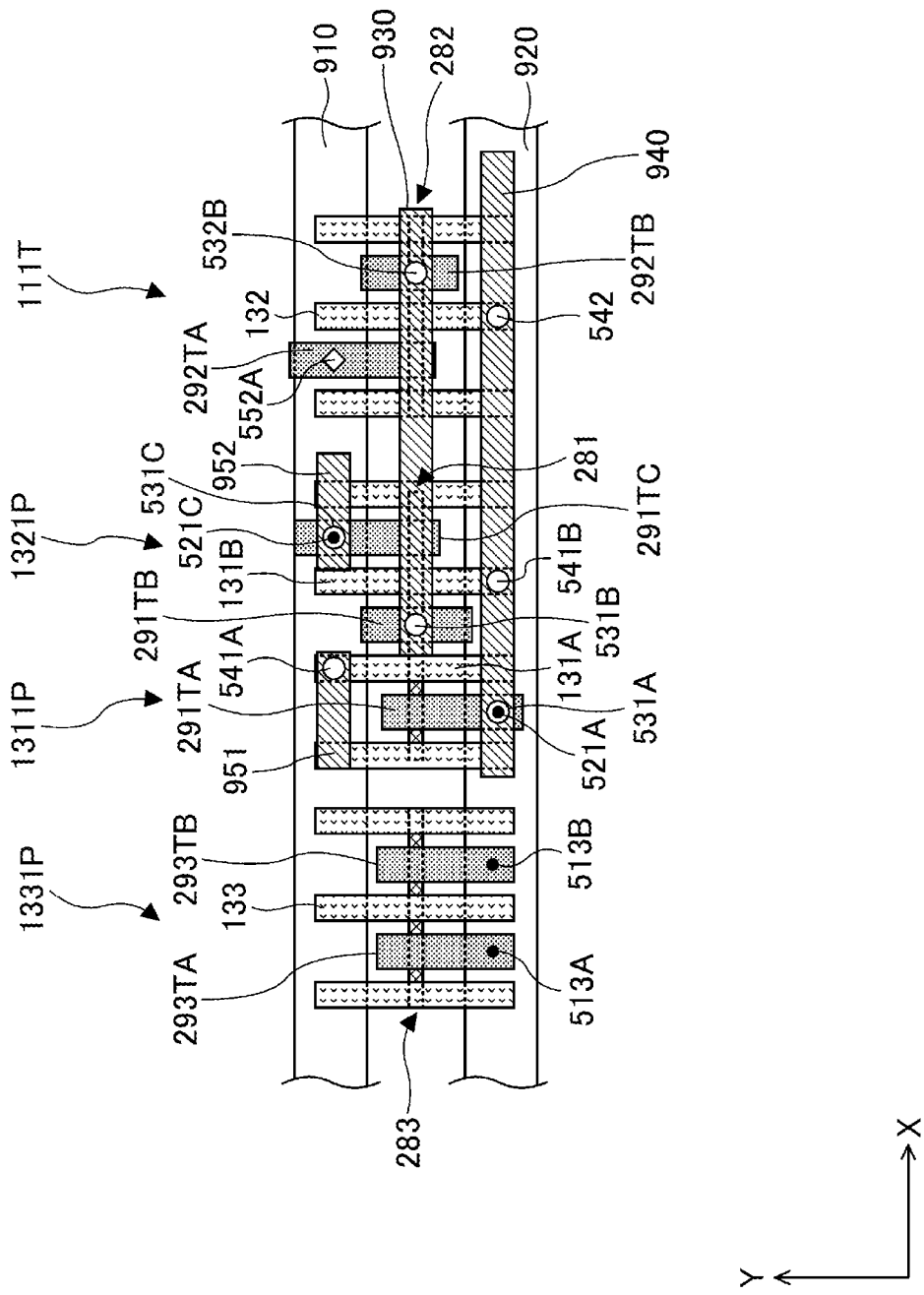
FIG. 36 is a schematic plan view (Part 2) illustrating a configuration of a power supply switch circuit according to a third modification of the third embodiment.

Next, a third modification of the third embodiment will be described. The third modification differs from the third embodiment in that the power supply switch circuit 110 includes a well tap 610P. FIGS. 35 and 36 are schematic plan views illustrating configurations of a power supply switch circuit 110 according to the third modification of the third embodiment. FIG. 35 primarily illustrates a layout of N-channel MOS transistors 1311N and 1321N, a pseudo-transistor structure 111D, and a pseudo-transistor structure 611P. FIG. 36 primarily illustrates a layout of P-channel MOS transistors 1311P and 1321P, a P-channel MOS transistor 111T, and a P-channel MOS transistor 1331P. Except for the structures illustrated in both FIGS. 35 and 36, structures illustrated in FIG. 36 are located above the structures illustrated in FIG. 35.

According to the third modification, as illustrated in FIGS. 35 and 36, the power supply switch circuit 110 has a well tap 610P that includes a P-channel MOS transistor 1331P and a pseudo-transistor structure 611P.

Figure 37:
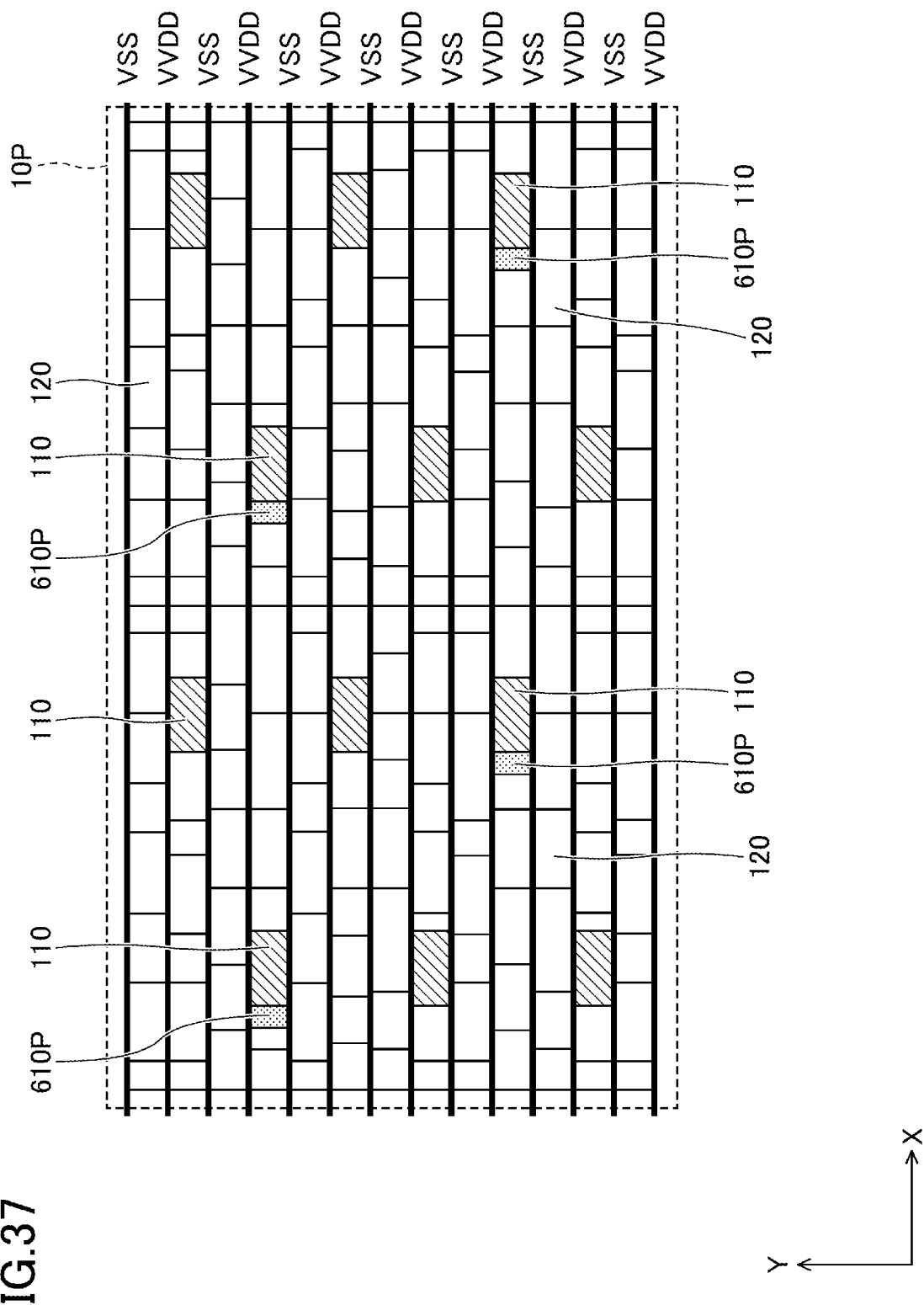
FIG. 37 is a schematic view illustrating the configuration of the standard cell area included in the semiconductor device according to a third modification of the third embodiment.

FIG. 37 is a schematic view illustrating a configuration of a standard cell area included in a semiconductor device according to the third modification of the third embodiment. As illustrated in FIG. 37, a well tap 610P is included in the power supply switch circuit 110. In this example, three nearest neighboring well taps 610P are preferably arranged in a triangular lattice, preferably arranged to form an equilateral triangle in a plan view. Some of the well taps 610P may include a power supply switch circuit 110, or all the well taps 610P may include a power supply switch circuit 110

It should be noted that the arrangement illustrated in FIG. 37 may be regarded as an arrangement in which the well taps 610P are adjacent to some of the power supply switch circuits 110.

Other configurations are similar to the configuration of the third embodiment.

The third modification can provide the same effect as the third embodiment.

The power supply switch circuit 110 according to the third modification may be a double-height.

Fourth Embodiment

Figure 38:
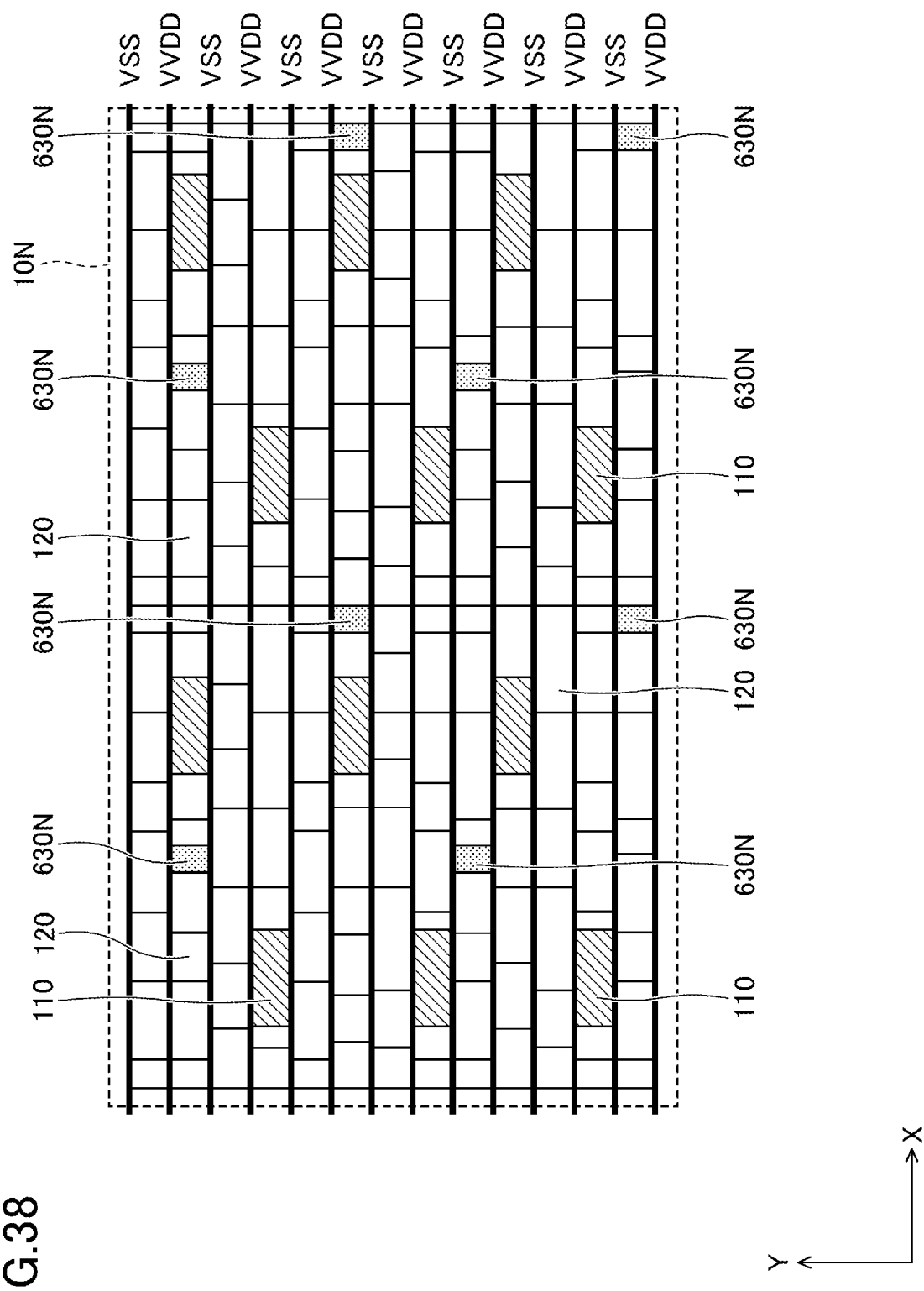
FIG. 38 is a schematic view illustrating a configuration of a standard cell area included in a semiconductor device according to a fourth embodiment.

Next, a fourth embodiment will be described. The fourth embodiment differs from the first embodiment primarily in terms of transistors included in the standard cell 120. FIG. 38 is a schematic view illustrating a configuration of a standard cell area included in a semiconductor device according to the fourth embodiment.

According to the fourth embodiment, the standard cell area 10 includes well taps 630N and standard cells 120, as illustrated in FIG. 38. The standard cell 120 includes various logic circuits such as, for example, a NAND circuit, an inverter circuit, and the like. In the standard cell area 10, VSS lines for providing a ground potential to the standard cell 120 and VVDD lines for supplying a power potential to the standard cell 120 are arranged. The standard cell 120 is disposed in the N-type area 10N. The well taps 630N are each an area for supplying power to the N-type area 10N. The standard cell area 10 further includes a VDD line (not illustrated) to which an external power potential is supplied, and a power supply switch circuit 110 between the VDD line and the VVDD line.

The standard cell 120 has an inverter that includes a P-channel MOS transistor 1341P and an N-channel MOS transistor 1341N, as described in detail below. The well tap 630N has a pseudo-transistor structure 631N in which the source and drain of the P-channel MOS transistor are N-type, and an N-channel MOS transistor 1331N. Unlike the first embodiment, the N-channel MOS transistor 1341N is formed on the P-channel MOS transistor 1341P.

Figure 39:
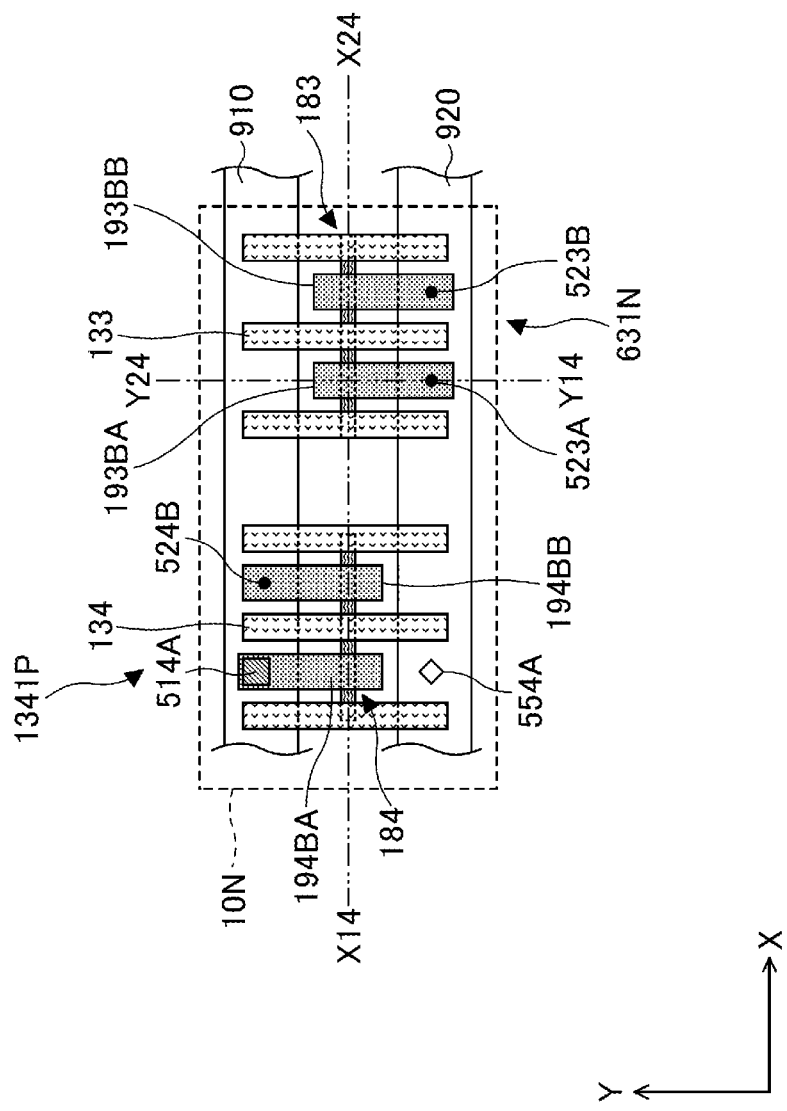
FIG. 39 is a schematic plan view (Part 1) illustrating a configuration of a well tap and a standard cell according to a fourth embodiment.
Figure 40:
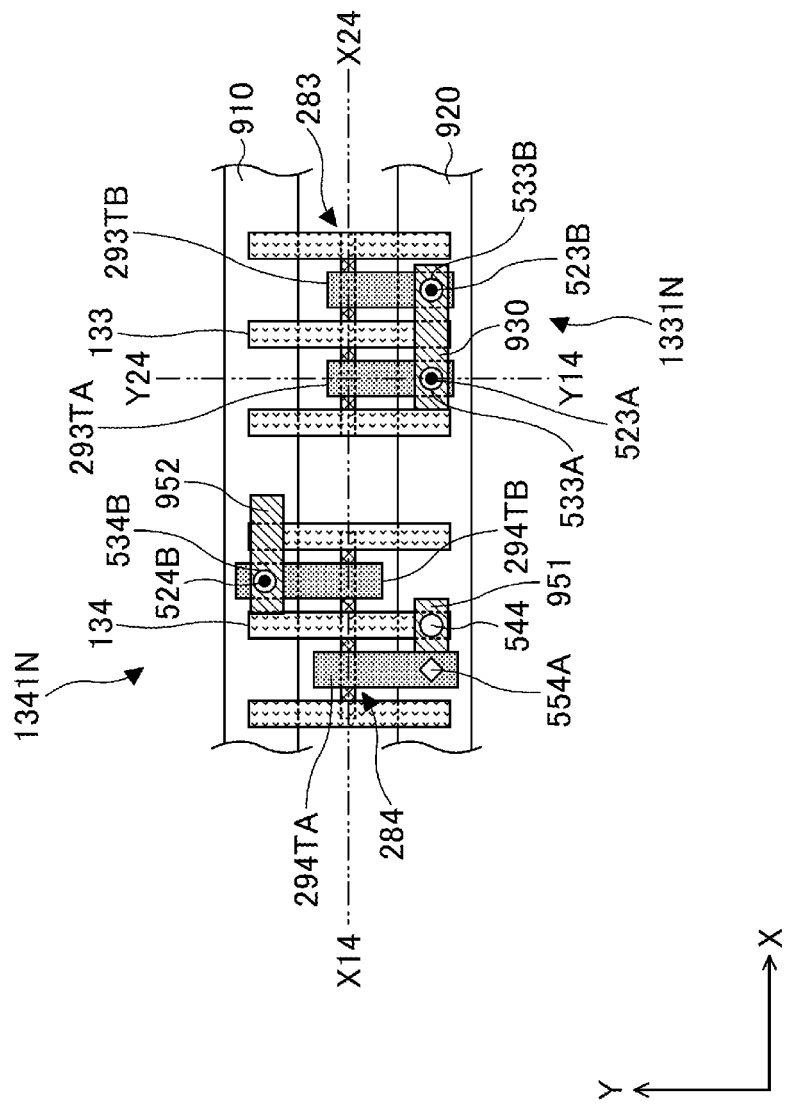
FIG. 40 is a schematic plan view (Part 2) illustrating a configuration of a well tap and a standard cell according to a fourth embodiment.
Figure 41:
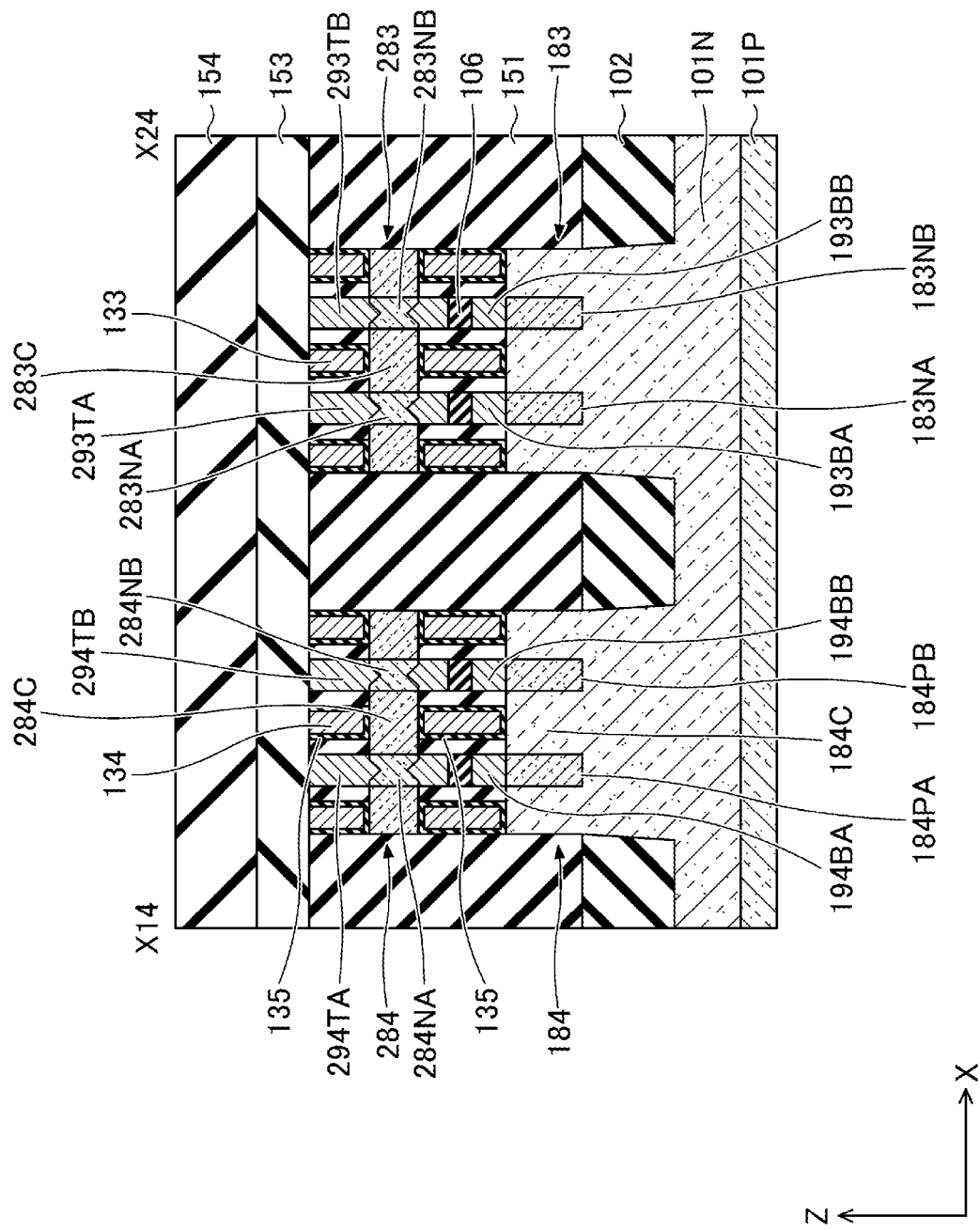
FIG. 41 is a cross-sectional view (Part 1) illustrating a well tap and a standard cell in a fourth embodiment.
Figure 42:
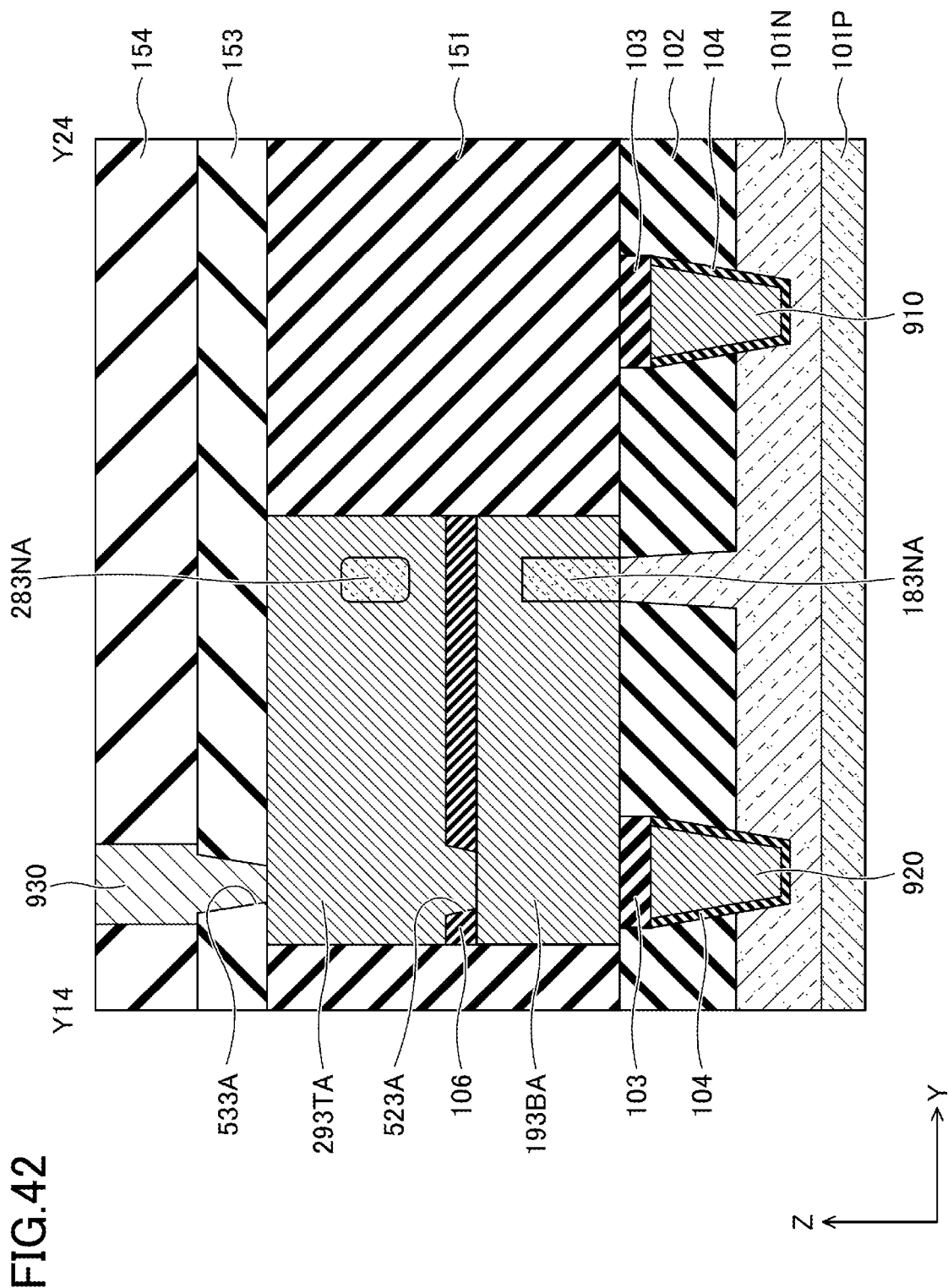
FIG. 42 is a cross-sectional view (Part 2) illustrating a well tap and a standard cell in a fourth embodiment.

Next, configurations of the well tap 630N and the standard cell 120 will be described. FIGS. 39 and 40 are schematic plan views illustrating configurations of a well tap 630N and a standard cell 120 according to the fourth embodiment. FIG. 39 primarily illustrates a layout of a P-channel MOS transistor 1341P and a pseudo-transistor structure 631N. FIG. 40 primarily illustrates a layout of an N-channel MOS transistor 1341N and an N-channel MOS transistor 1331N. Except for the structures illustrated in both FIGS. 39 and 40, structures illustrated in FIG. 40 are located above the structures illustrated in FIG. 39. FIGS. 41 and 42 are cross-sectional views illustrating a well tap 630N and a standard cell 120 according to the fourth embodiment. FIG. 41 corresponds to a cross-sectional view cut along the X14-X24 line in FIGS. 39 and 40. FIG. 42 corresponds to a cross-sectional view cut along the Y14-Y24 line in FIGS. 39 and 40.

As illustrated in FIGS. 39 to 42, according to the fourth embodiment, a power supply switch circuit 110 is disposed in the N-type area 10N. The N-type area 10N is supplied with the VDD potential from the well tap 620N.

In a fourth embodiment, fins 183 and 184 extending in the X direction and rising in the Z direction are formed on the N-well 101N exposed from the element isolation film 102 between the power supply line 910 and the power supply line 920. The fin 183 is included in the well tap 630N, and the fin 184 is included in the standard cell 120.

The fin 184 includes a P-type area 184PA and a P-type area 184PB aligned in the X-direction. The P-type area 184PA is the source of the P-channel MOS transistor 1341P. The P-type area 184PB is the drain of the P-channel MOS transistor 1341P. An N-type portion of the fin 184 between the P-type area 184PA and the P-type area 184PB is a channel 184C of the P-channel MOS transistor 1341P. The P-channel MOS transistor 1341P has a back gate beneath the gate electrode 134 in the fin 184.

The fin 183 includes an N-type area 183NA and an N-type area 183NB aligned in the X-direction. The conductivity of a portion of the fin 183 between the N-type area 183NA and the N-type area 183NB is N-type.

A local conductive trace 194BA extending in the Y direction from the P-type area 184PA and a local conductive trace 194BB extending in the Y direction from the P-type area 184PB are formed on the element isolation film 102. The local conductive traces 194BA and 194BB extend above the power supply line 910.

A contact hole 514A is formed in the insulating film 103 between the local conductive trace 194BA and the power supply line 910, and the local conductive trace 194BA is connected to the power supply line 910 through an electrical conductor in the contact hole 514A. The local conductive trace 194BA electrically connects the power supply line 910 to the P-type area 184PA.

A semiconductor area 284 includes an N-type area 284NA and an N-type area 284NB aligned in the X-direction. The N-type area 284NA is the source of the N-channel MOS transistor 1341N. The N-type area 284NB is the drain of the N-channel MOS transistor 1341N. A portion of the semiconductor area 284 between the N-type area 284NA and the N-type area 284NB is a channel 284C of the N-channel MOS transistor 1341N.

A semiconductor area 283 includes an N-type area 283NA and an N-type area 283NB aligned in the X direction. The N-type area 283NA is the source or drain of the N-channel MOS transistor 1331N. The N-type area 283NB is the drain or the source of the N-channel MOS transistor 1331N. A portion of the semiconductor area 283 between the N-type area 283NA and the N-type area 283NB is a channel 283C of the N-channel MOS transistor 1331N.

A gate electrode 134 common to the N-channel MOS transistor 1314N and the P-channel MOS transistor 1341P is formed between the stack of the local conductive traces 194BA and 294TA and the stack of the local conductive traces 194BB and 294TB. A gate electrode 133 of the N-channel MOS transistor 1331N is formed between the stack of the local conductive traces 193BA and 293TA and the stack of the local conductive traces 193BB and 293TB. A gate insulating film 135 is formed between a gate electrode 133 and a channel 283C. A gate insulating film 135 is formed between a gate electrode 134 and a channel 284C, and a gate insulating film 135 is formed between the gate electrode 134 and the channel 184C.

A contact hole 554A is formed in the insulating films 151 and 103 between the local conductive trace 294TA and the power supply line 920 above the power supply line 920. A local conductive trace 294TA and the power supply line 920 are electrically connected to each other through a conductor in the contact hole 554A. The local conductive trace 294TA electrically connects the power supply line 920 to the N-type area 284NA.

As illustrated in FIG. 42, a contact hole 523A is formed in the insulating film 106 between the local conductive trace 293TA and the local conductive trace 193BA above the power supply line 920. The local conductive trace 293TA and the local conductive trace 193BA are electrically connected to each other through a conductor in the contact hole 523A. A contact hole 533A extending to the local conductive trace 293TA is formed above the power supply line 920 of the insulating film 153.

A contact hole 523B is formed in the insulating film 106 between the local conductive trace 293TB and the local conductive trace 193BB above the power supply line 920. The local conductive trace 293TB and the local conductive trace 193BB are electrically connected to each other through a conductor in the contact hole 523B. A contact hole 533B extending to the local conductive trace 293TB is formed above the power supply line 920 of the insulating film 153.

As illustrated in FIG. 42, a contact hole 533A extending to the local conductive trace 293TA is formed above the power supply line 920 of the insulating film 153. A contact hole 533B extending to the local conductive trace 293TB is formed above the power supply line 920 of the insulating film 153. A power supply line 930 is formed in the insulating film 154. The power supply line 930 is connected to the local conductive trace 293TA through a conductor in the contact hole 533A, and is also connected to the local conductive trace 293TB through a conductor in the contact hole 533B. The local conductive trace 293TA electrically connects the power supply line 930 to the N-area 283NA, and the local conductive trace 293TB electrically connects the power supply line 930 to the N-area 283NB.

Figure 43:
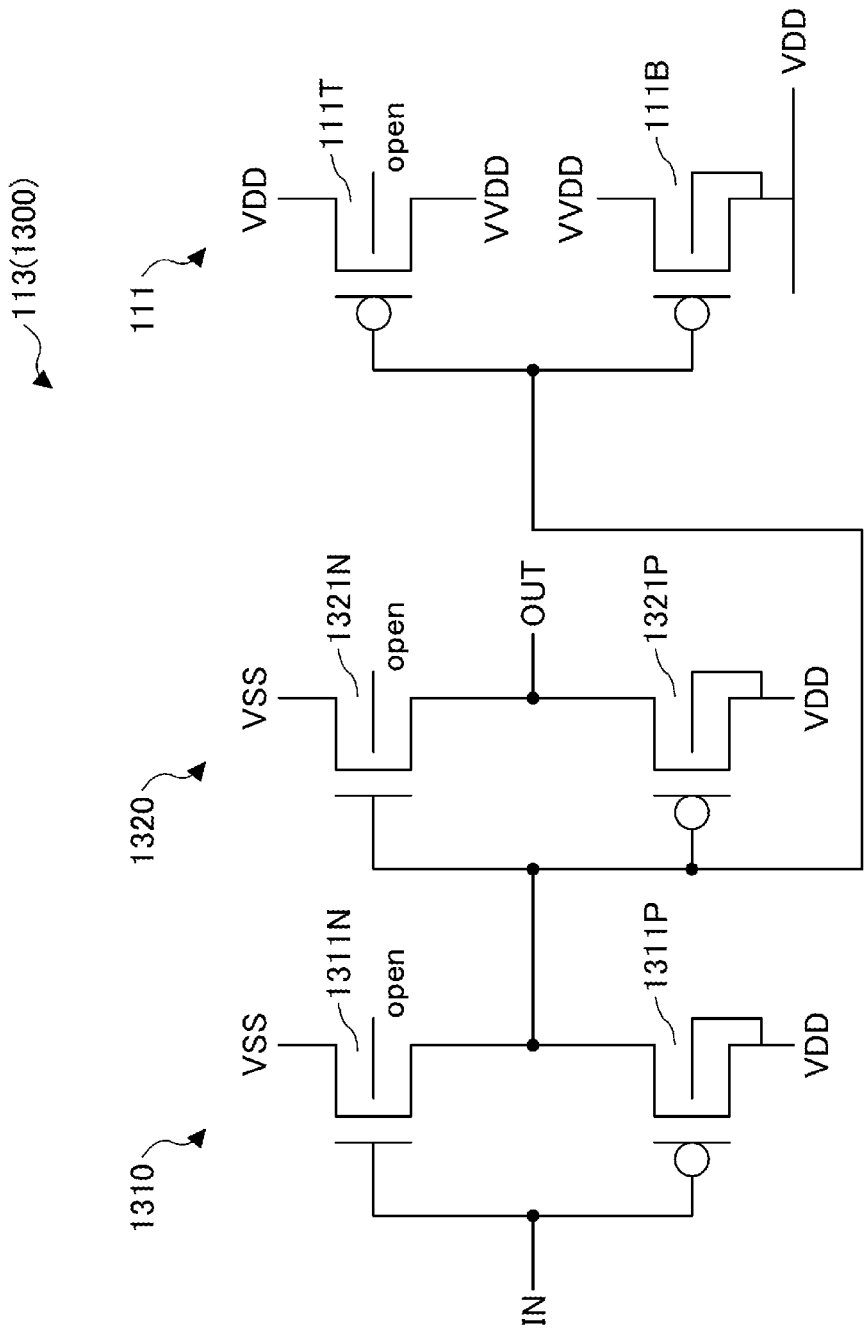
FIG. 43 is a circuit diagram illustrating the configuration of a buffer and switch transistor in a fourth embodiment.

Next, configurations of a buffer and a switch transistor 111 used in a power supply switch control circuit 113 will be described. FIG. 43 is a circuit diagram illustrating the configurations of a buffer and a switch transistor according to the fourth embodiment.

As illustrated in FIG. 43, a buffer 1300 includes inverters 1310 and 1320, as according to the second embodiment. However, the N-channel MOS transistor 1311N is formed on the P-channel MOS transistor 1311P, and the N-channel MOS transistor 1321N is formed on the P-channel MOS transistor 1321P. A switch transistor 111 also includes a pair of a P-channel MOS transistor 111T, and a P-channel MOS transistor 111B, where the P-channel MOS transistor 111T is formed on the P-channel MOS transistor 111B.

Figure 44:
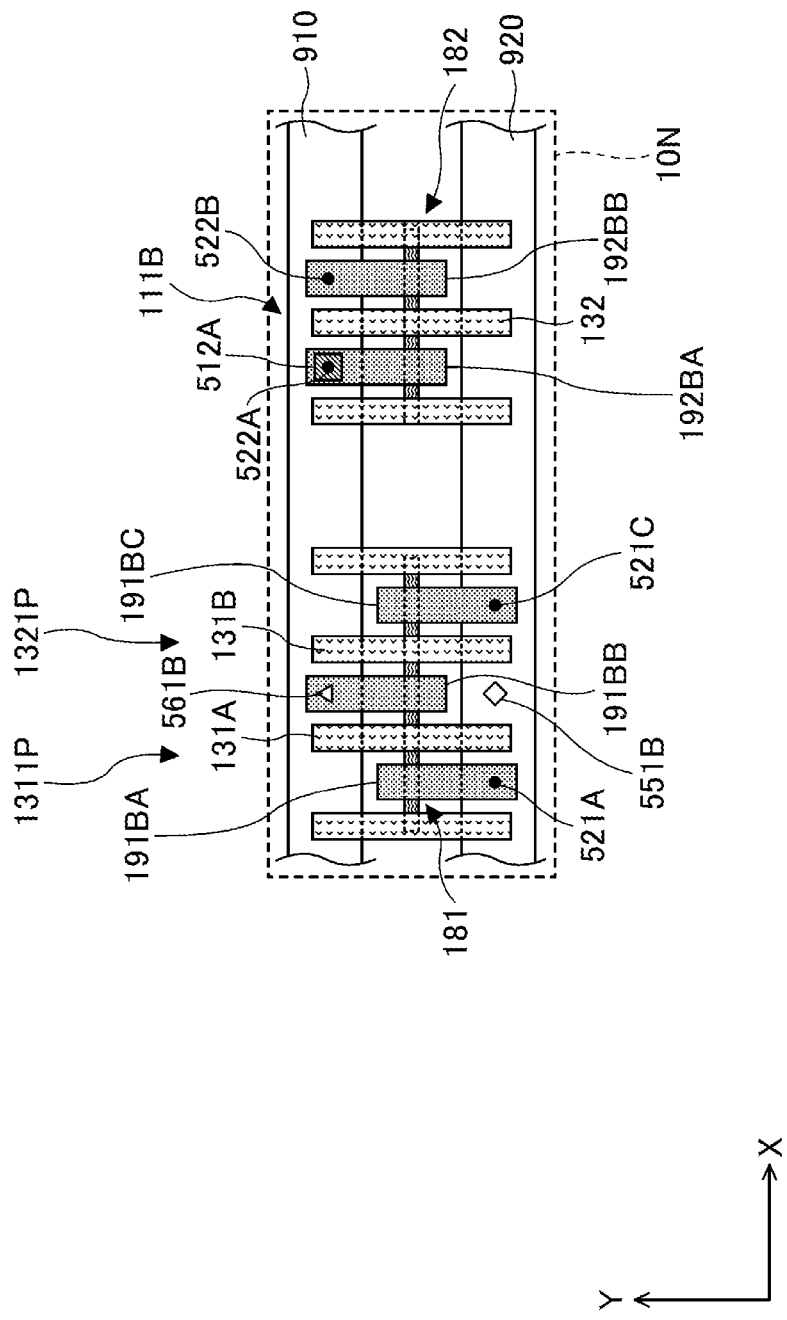
FIG. 44 is a schematic view (Part 1) illustrating the planar configuration of the power supply switch circuit according to the fourth embodiment.
Figure 45:
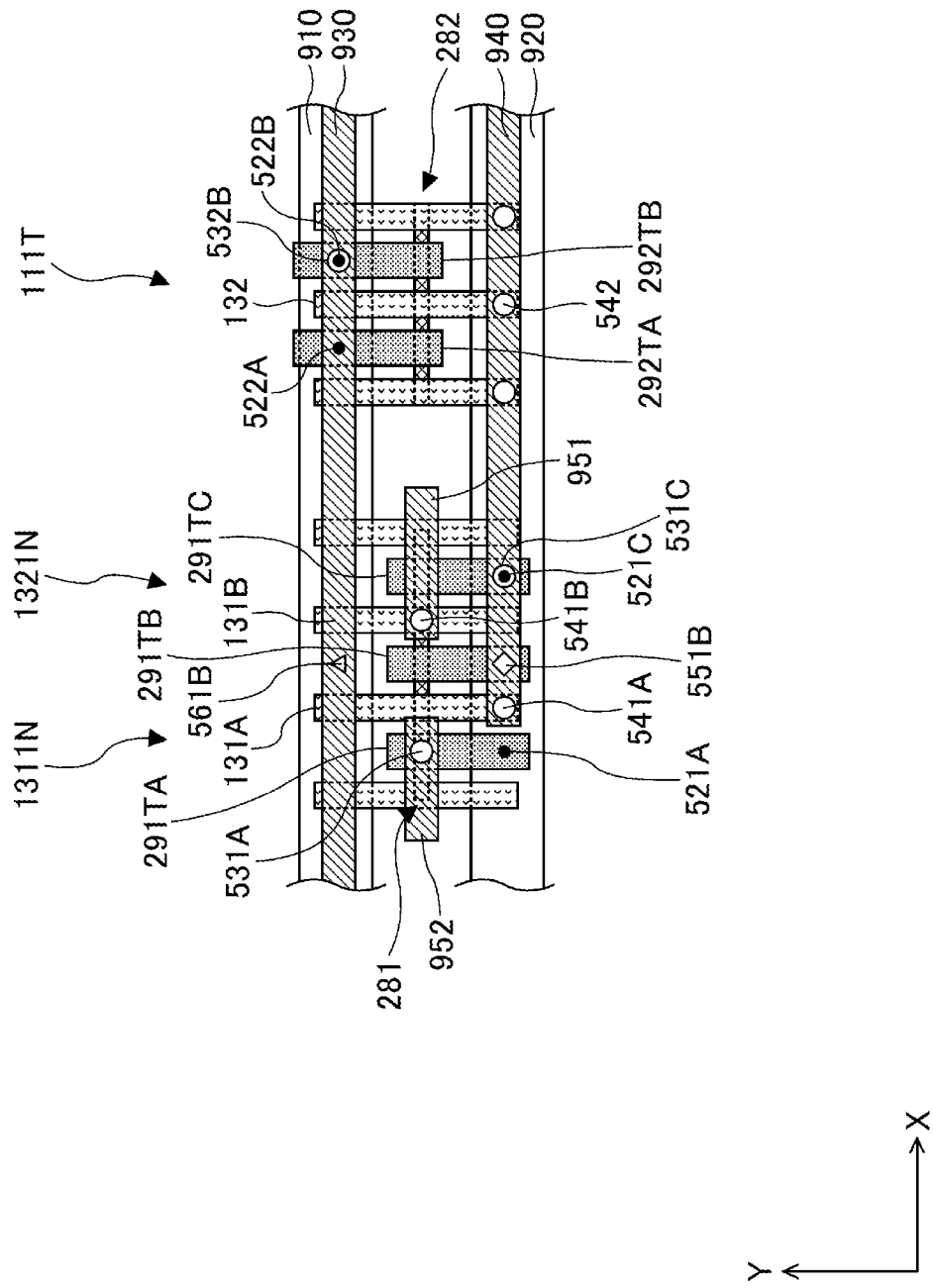
FIG. 45 is a schematic view (Part 2) illustrating the planar configuration of the power supply switch circuit according to the fourth embodiment.

FIGS. 44 and 45 are schematic plan views illustrating configurations of a power supply switch circuit 110 according to the fourth embodiment. FIG. 44 primarily illustrates a layout of the P-channel MOS transistors 1311P and 1321P and the P-channel MOS transistor 111B. FIG. 45 primarily illustrates a layout of the N-channel MOS transistors 1311N and 1321N and the P-channel MOS transistor 111T. Except for the structures illustrated in both FIGS. 44 and 45, structures illustrated in FIG. 45 are located above the structures illustrated in FIG. 44.

As illustrated in FIGS. 44 and 45, according to the fourth embodiment, the power supply switch circuit 110 is also disposed in the N-type area 10N. A power supply line 930 is disposed above the power supply line 910, and a control signal line 940 is disposed above the power supply line 920. The signal lines 951 and 952 are also disposed between the power supply line 930 and the control signal line 940 in the Y direction.

A contact hole 551B is formed in the insulating films 151 and 103 between the local conductive trace 291TB and the power supply line 920 above the power supply line 920. The local conductive trace 291TB and the power supply line 920 are electrically connected to each other through a conductor in the contact hole 551B. A contact hole 561B extending to the local conductive trace 191BB is formed in the insulating films 153 and 151 above the power supply line 910. The power supply line 930 is connected to the local conductive trace 191BB through an electrical conductor in the contact hole 561B.

A signal line 952 is connected to the local conductive trace 291TA through a conductor in the contact hole 531A above the semiconductor area 281, and a signal line 951 is connected to a gate electrode 131B through a conductor in the contact hole 531C.

The power supply line 930 is connected to the local conductive trace 292TB through an electrical conductor in the contact hole 532B above the power supply line 910.

Other configurations of the power supply switch circuit 110 are similar to the configuration of the second embodiment.

According to the fourth embodiment, the VDD potential is supplied to the N-type area 10N through the well tap 630N, and the VDD potential is supplied to the back gate of the P-channel MOS transistor 1341P in the standard cell 120. In addition, the VDD potential is supplied to the back gates of the P-channel MOS transistors 1311P and 1321P in the power supply switch control circuit 113 and is also supplied to the back gate of the P-channel MOS transistor 111B of the switch transistor 111.

According to the fourth embodiment, there is no P-well in the N-type area 10N, and no area is required to isolate the P-well and the N-well from each other. A well tap for supplying power to the P well is not required. Thus, according to the fourth embodiment, the circuit area can be further reduced.

First Modification of Fourth Embodiment

Figure 46:
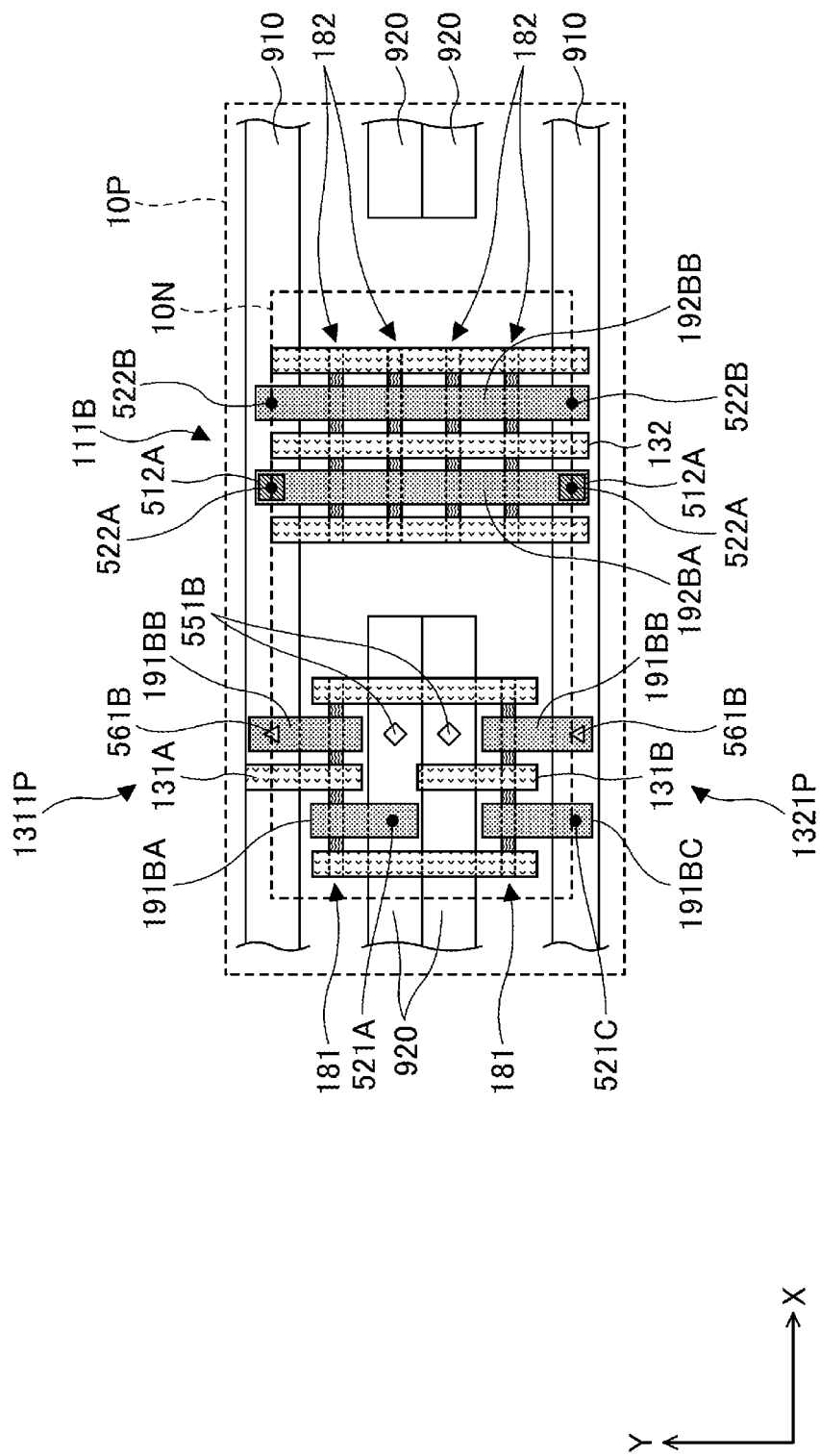
FIG. 46 is a schematic view (Part 1) illustrating the planar configuration of the power supply switch circuit according to the first modification of the fourth embodiment.
Figure 47:
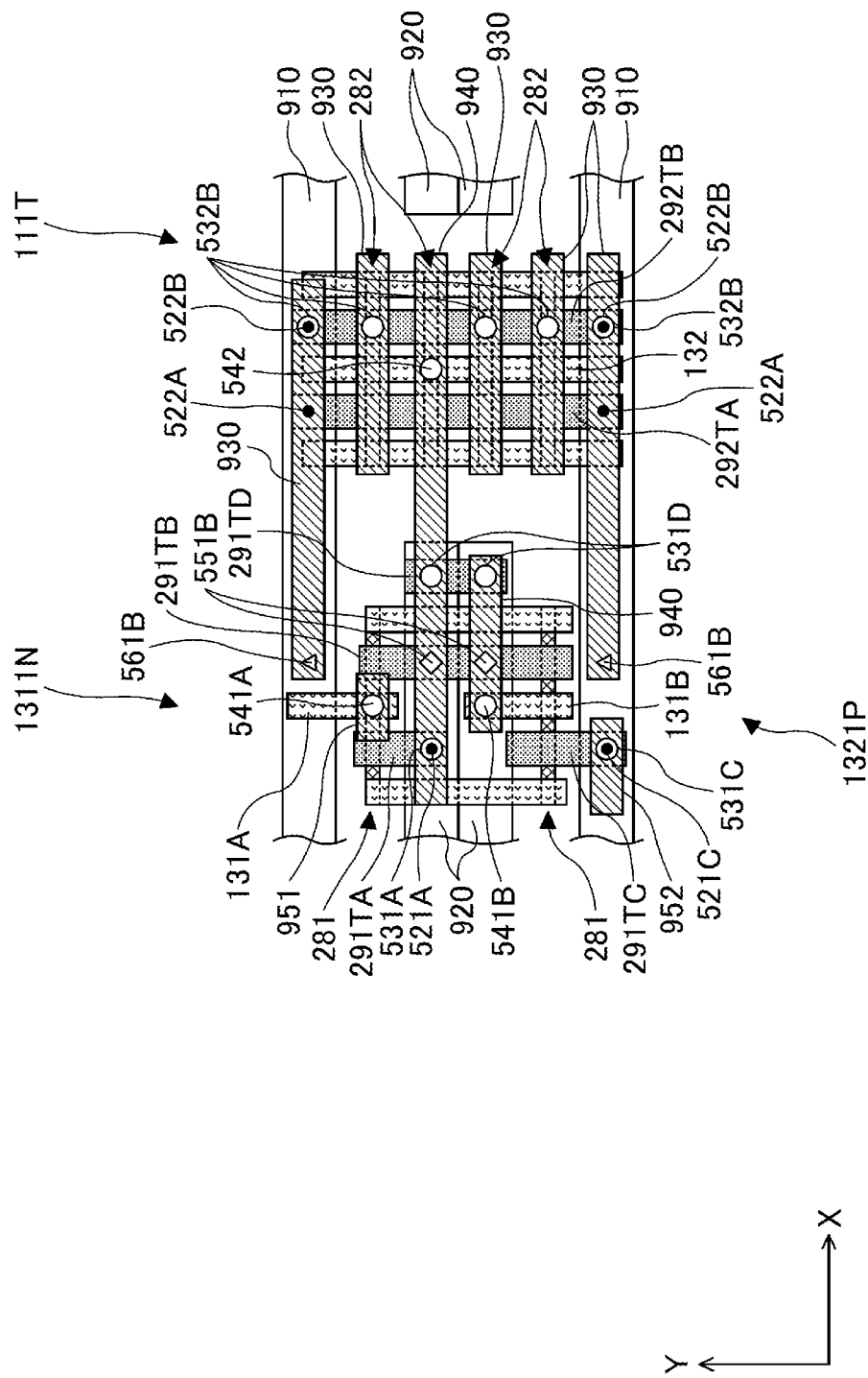
FIG. 47 is a schematic view (Part 2) illustrating the planar configuration of the power supply switch circuit according to the first modification of the fourth embodiment.

Next, a first modification of the fourth embodiment will be described. The first modification differs from the fourth embodiment in terms of cell height. FIGS. 46 and 47 are schematic plan views illustrating configurations of a power supply switch circuit 110 in the first modification of the fourth embodiment. FIG. 46 primarily illustrates a layout of P-channel MOS transistors 1311P and 1321P, and a P-channel MOS transistor 111B. FIG. 47 primarily illustrates a layout of N-channel MOS transistors 1311N and 1321N, and a P-channel MOS transistor 111T. Except for the structures illustrated in both FIGS. 46 and 47, structures illustrated in FIG. 47 are located above the structure illustrated in FIG. 46.

As illustrated in FIGS. 46 and 47, a power supply switch circuit 110 is disposed in the N-type area 10N, and a power supply switch control circuit 113 and a switch transistor 111 are disposed in the power supply switch circuit 110. Though not illustrated, a well tap 620N is disposed within the N-type area 10N.

According to the first modification, the power supply switch circuit 110 is a double-height cell, as illustrated in FIGS. 46 and 47. That is, the power supply switch circuit 110 is formed across two power supply lines 910 located between the power supply lines 920 in the Y direction. The P-channel MOS transistor 1311P and the P-channel MOS transistor 1321P are adjacently disposed in the Y direction, and the N-channel MOS transistor 1311N and the N-channel MOS transistor 1321N are adjacently disposed in the Y direction. A control signal line 940 is disposed above the power supply line 920. The power supply lines 930 are disposed above the two power supply lines 910, and above areas between the power supply lines 910 and the power supply lines 920 in the Y direction. the power supply lines 920 are not disposed on the switch transistor 111.

With respect to the power supply switch control circuit 113, a pair of a fin 181 and a semiconductor area 281 is disposed between one power supply line 910 and one power supply line 920, and a pair of a fin 181 and a semiconductor area 281 is disposed between the other power supply line 910 and the other power supply line 920. A signal line 951 is disposed above the semiconductor area 281 between one power supply line 910 and one power supply line 920. A signal line 952 is disposed above the other power supply line 910. A local conductive trace 291TD connecting the drain of the N-channel MOS transistor 1311N and the gate of the N-channel MOS transistor 1321N is formed.

With respect to the switch transistor 111, four pairs of a fin 182 and a semiconductor area 282 are located between two power supply lines 910.

Other configurations are similar to the configuration of the fourth embodiment.

The first modification provides the same effect as the fourth embodiment.

Second Modification of Fourth Embodiment

Figure 48:
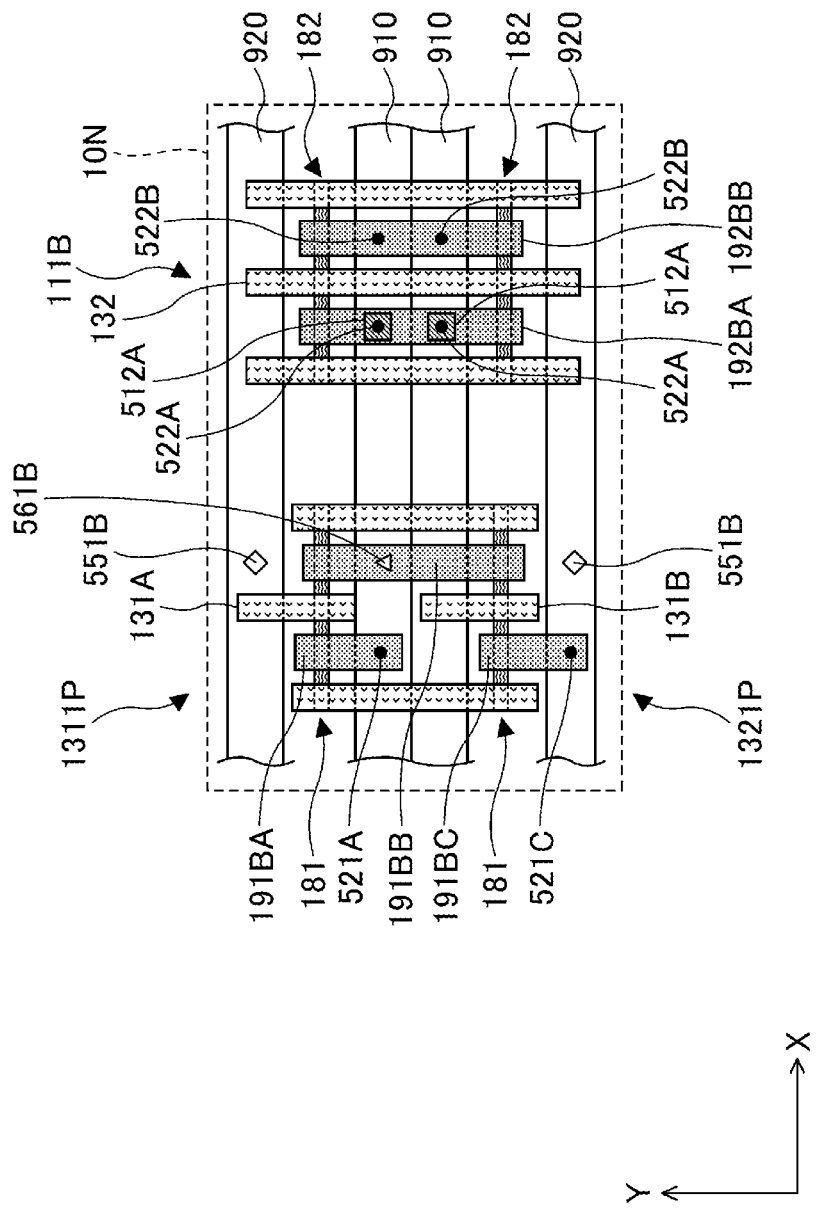
FIG. 48 is a schematic view (Part 1) illustrating the planar configuration of the power supply switch circuit according to the second modification of the fourth embodiment.
Figure 49:
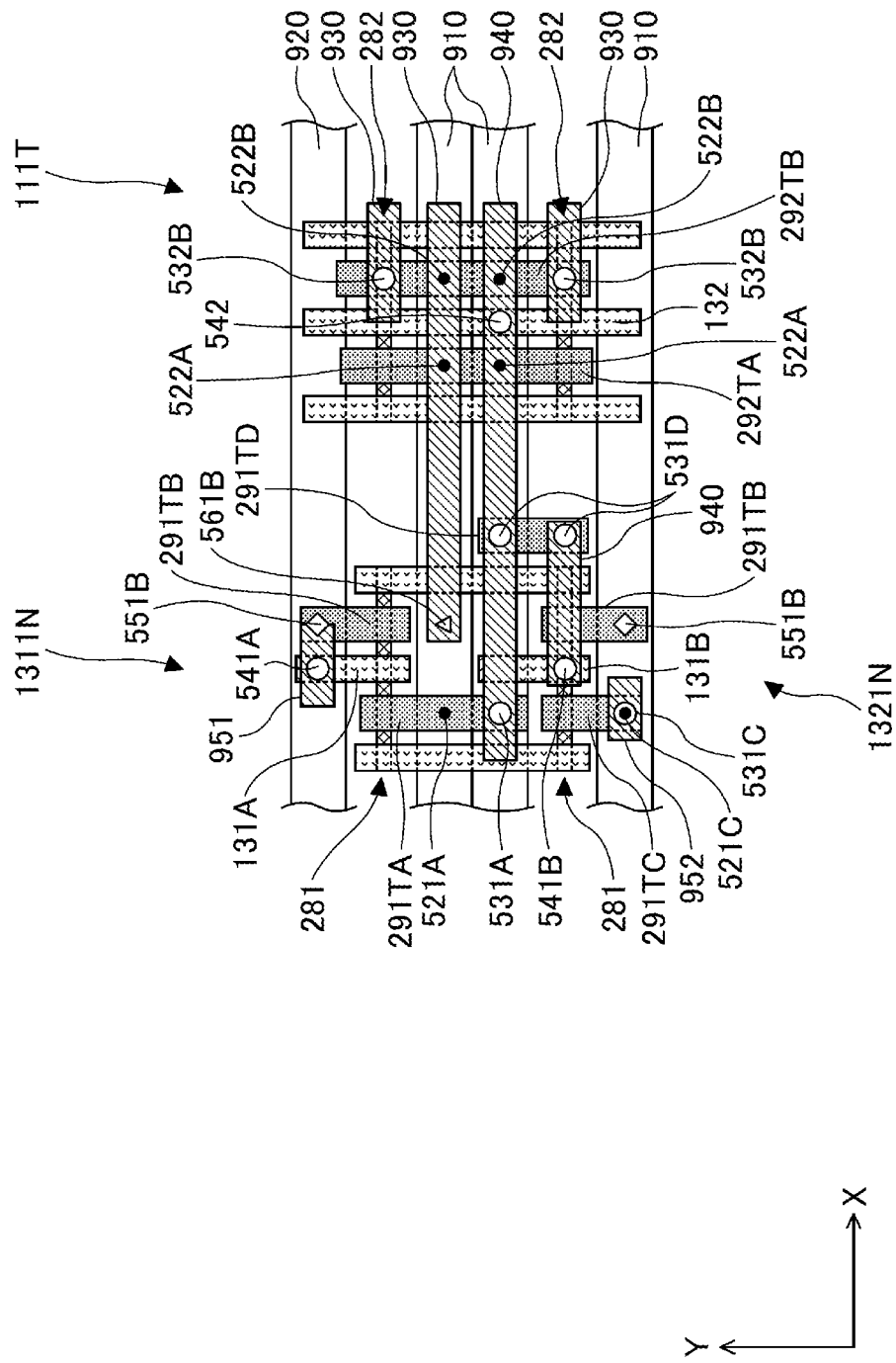
FIG. 49 is a schematic view (Part 2) illustrating the planar configuration of the power supply switch circuit according to the second modification of the fourth embodiment.

Next, a second modification of the fourth embodiment will be described. The second modification differs from the first modification of the fourth embodiment in terms of a positional relationship between the power supply line 910 and the power supply line 920 and the like. FIGS. 48 and 49 are schematic plan views illustrating configurations of a power supply switch circuit 110 according to the second modification of the fourth embodiment. FIG. 48 primarily illustrates a layout of P-channel MOS transistors 1311P and 1321P, and a P-channel MOS transistor 111B. FIG. 49 primarily illustrates a layout of N-channel MOS transistors 1311N and 1321N, and a P-channel MOS transistor 111T. Except for the structures illustrated in both FIGS. 48 and 49, structures illustrated in FIG. 49 are located above the structures illustrated in FIG. 48.

According to the second modification, the power supply switch circuit 110 is formed across two power supply lines 920 located between the power supply lines 910 in the Y direction, as illustrated in FIGS. 48 and 49. That is, the two power supply lines 910 are located so as to be in contact with each other between the two power supply lines 920 in the Y direction. The power supply lines 920 are also disposed in the switch transistor 111.

Other configurations are similar to the configuration of the first modification.

The second modification provides the same effect as the first modification.

A well tap 630N may be disposed within the power supply switch circuit 110.

In each embodiment, the portion of the substrate 101P that functions as a channel of the N-channel MOS transistor may be a P-well. Also, in each embodiment and modification, the numbers of fins 181, 182, 183, and 184 and the numbers of the semiconductor areas 281, 282, 283, and 284 disposed in the respective Y-directions may be varied as appropriate and may be more than one.

According to the disclosed technique, well taps and CFETs are simultaneously used.

Although the present invention has been described above with reference to the embodiments, the present invention is not limited to the features described in the embodiments. These features can be changed without departing from the scope of the claimed subject matter, and can be appropriately determined according to the implementation to which the present invention is applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a substrate made of a semiconductor material and having a first conductivity type;
    a first fin and a second fin, wherein both of the first fin and the second fin are made of the semiconductor material and directly and continuously protrude from the substrate;
    a first impurity area formed in the first fin and having a second conductivity type which is different from the first conductivity type;
    a second impurity area formed in the first fin and having the second conductivity type;
    a first portion of the first fin formed between the first impurity area and the second impurity area, and having the first conductivity type;
    a first transistor including the first fin;
    a second transistor above the first transistor; and
    a first power supply line electrically connected to the second fin, wherein:
    the second fin has the first conductivity type and is electrically connected to the substrate,
    the first portion is electrically connected to the substrate,
    the first transistor includes
        the first impurity area, the second impurity area and the first portion of the first fin, and
        a first gate insulating film formed on the first fin and located between the first impurity area and the second impurity area in a plan view,
    the second transistor includes
        a first semiconductor area formed above the first fin and provided separately from the second fin,
        a third impurity area formed in the first semiconductor area and located above the first impurity area,
        a fourth impurity area formed in the first semiconductor area and located above the second impurity area, and
        a second gate insulating film formed on the first semiconductor area and located between the third impurity area and the fourth impurity area in a plan view, and
    the first and second transistors have a common gate formed on the first and second gate insulating films.

2. The semiconductor device according to claim 1, further comprising:
    a first local conductive trace formed on the second fin, wherein
    the first power supply line is electrically connected to the second fin through the first local conductive trace.

3. The semiconductor device according to claim 1, wherein the first power supply line is embedded in the substrate.

4. The semiconductor device according to claim 3, further comprising:
    a second power supply line;
    a third power supply line; and
    a third transistor connected between the second power supply line and the third power supply line, the third transistor having a gate electrically connected to an inverter including the first transistor and the second transistor.

5. The semiconductor device according to claim 4, wherein
the inverter is connected between the first power supply line and the second power supply line,
the third power supply line is embedded in the substrate, and the second power supply line is disposed above the substrate.

6. The semiconductor device according to claim 5, further comprising:
a third fin protruding from the substrate;
a second semiconductor area formed above the third fin; and
a fourth transistor including the second semiconductor area, wherein:
the third transistor includes
the third fin,
a P-type fifth impurity area and a P-type sixth impurity area formed in the third fin, and
a third gate insulating film formed on the third fin and located between the fifth impurity area and the sixth impurity area in a plan view,
the fourth transistor includes
a P-type seventh impurity area formed in the second semiconductor area and located above the fifth impurity area,
a P-type eighth impurity area formed in the second semiconductor area and located above the sixth impurity area, and
a fourth gate insulating film formed on the second semiconductor area and located between the seventh impurity area and the eighth impurity area in a plan view, and
the third transistor and the fourth transistor have a common gate formed on the third gate insulating film and the fourth gate insulating film.

7. The semiconductor device according to claim 5, further comprising:
a third fin protruding from the substrate;
a pseudo-transistor including the third fin; and
a second semiconductor area formed above the third fin, wherein:
the pseudo-transistor has an N-type fifth impurity area and an N-type sixth impurity area formed in the third fin, and
the third transistor includes
a P-type seventh impurity area formed in the second semiconductor area and located above the fifth impurity area,
a P-type eighth impurity area formed in the second semiconductor area and located above the sixth impurity area, and
a third gate insulating film and a gate formed on the second semiconductor area and located between the seventh impurity area and the eighth impurity area in a plan view.

8. The semiconductor device according to claim 1, wherein:
the second conductivity type is P-type,
the first conductivity type is N-type, and
the first power supply line is disposed above the substrate and electrically connected to the second fin.

9. The semiconductor device according to claim 8, further comprising:
a second power supply line;
a third power supply line; and
a third transistor connected between the first and third power supply lines and having a gate electrically connected to an inverter including the first and second transistors.

10. The semiconductor device according to claim 9, wherein
the inverter is connected between the first power supply line and the second power supply line, and
the second power supply line and the third power supply line are embedded in the substrate.

11. The semiconductor device according to claim 10, further comprising:
a third fin protruding from the substrate;
a second semiconductor area formed above the third fin; and
a fourth transistor including the second semiconductor area, wherein:
the third transistor includes
a fifth impurity area and a sixth impurity area formed in the third fin, and
a third gate insulating film formed on the third fin and located between the fifth impurity area and the sixth impurity area in a plan view,
the fourth transistor includes
a seventh impurity area formed in the second semiconductor area and located above the fifth impurity area,
an eighth impurity area formed in the second semiconductor area and located above the sixth impurity area, and
a fourth gate insulating film formed on the second semiconductor area and located between the seventh impurity area and the eighth impurity area in a plan view, and
the fourth transistor has a common gate formed on the third gate insulating film and the fourth gate insulating film.

12. The semiconductor device according to claim 1, wherein:
a plurality of second fins, each of which corresponds to the second fin, are provided and are aligned on each of a plurality of first straight lines, the plurality of first straight lines extending in a first direction parallel to a surface of the substrate and being arranged in a second direction parallel to the surface of the substrate and perpendicular to the first direction, and
positions of the plurality of second fins in the first direction are offset between two adjacent lines of the plurality of first straight lines, the two adjacent lines being adjacent in the second direction.

13. The semiconductor device according to claim 1, wherein
the common gate includes a first part disposed between a lower surface of the first semiconductor area and a first channel of the first transistor between the first impurity area and second impurity area and a second part disposed over an upper surface of the first semiconductor area.

14. The semiconductor device according to claim 13, wherein
the second gate insulating film is continuously formed from the first gate insulating film.

15. The semiconductor device according to claim 1, further comprising an element isolation film formed on the substrate,
wherein a bottom part of each of the first fin and the second fin is adjacent to the element isolation film.

* * * * *